US011869627B2

(12) United States Patent
Yakubo et al.

(10) Patent No.: US 11,869,627 B2
(45) Date of Patent: Jan. 9, 2024

(54) SEMICONDUCTOR DEVICE COMPRISING MEMORY CIRCUIT OVER CONTROL CIRCUITS

(71) Applicant: Semiconductor Energy Laboratory Co., Ltd., Atsugi (JP)

(72) Inventors: Yuto Yakubo, Atsugi (JP); Seiya Saito, Atsugi (JP); Tatsuya Onuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 157 days.

(21) Appl. No.: 17/606,116

(22) PCT Filed: May 12, 2020

(86) PCT No.: PCT/IB2020/054454
§ 371 (c)(1),
(2) Date: Oct. 25, 2021

(87) PCT Pub. No.: WO2020/234689
PCT Pub. Date: Nov. 26, 2020

(65) Prior Publication Data

US 2022/0246185 A1 Aug. 4, 2022

(30) Foreign Application Priority Data

May 23, 2019 (JP) ................................ 2019-096937
May 23, 2019 (JP) ................................ 2019-096943
May 23, 2019 (JP) ................................ 2019-096945

(51) Int. Cl.
*G11C 11/34* (2006.01)
*G11C 7/12* (2006.01)
(Continued)

(52) U.S. Cl.
CPC ............... *G11C 7/12* (2013.01); *H10B 12/20* (2023.02); *H10B 12/312* (2023.02); *G11C 11/401* (2013.01)

(58) Field of Classification Search
CPC ......... G11C 7/12; G11C 11/401; G11C 7/065; G11C 16/0466; G11C 7/18;
(Continued)

(56) References Cited

U.S. PATENT DOCUMENTS 6,141,277 A 10/2000 Tanzawa
6,822,916 B2 * 11/2004 Frey ....................... H10B 12/50
257/E21.655

(Continued)

FOREIGN PATENT DOCUMENTS

JP 2000-090682 A 3/2000
JP 2002-008386 A 1/2002

(Continued)

OTHER PUBLICATIONS

International Search Report (Application No. PCT/IB2020/054454) dated Aug. 4, 2020.

(Continued)

*Primary Examiner* — Tha-O H Bui
(74) *Attorney, Agent, or Firm* — ROBINSON INTELLECTUAL PROPERTY LAW OFFICE, P.C.; Eric J. Robinson

(57) ABSTRACT

A semiconductor device is provided which includes a first control circuit including a first transistor in a silicon substrate channel, a second control circuit provided over the first control circuit, a memory circuit provided over the second control circuit, and a global bit line and an inverted global bit line that have a function of transmitting a signal between the first control circuit and the second control circuit. The first control circuit includes a sense amplifier (Continued)

circuit including an input terminal and an inverted input terminal. In a first period for reading data from the memory circuit to the first control circuit, the second control circuit controls whether the global bit line and the inverted global bit line from which electric charge is discharged are charged or not in accordance with the data read from the memory circuit.

21 Claims, 50 Drawing Sheets

(51) Int. Cl.
*H10B 12/00* (2023.01)
*G11C 11/401* (2006.01)

(58) Field of Classification Search
CPC . G11C 2207/002; G11C 5/025; G11C 11/403; G11C 11/4091; G11C 11/4094; G11C 11/4097; G11C 5/02; H10B 12/20; H10B 12/312; H10B 12/00; H10B 41/70; H01L 27/1225; H01L 29/786
USPC .................................................... 365/185.15
See application file for complete search history.

(56) References Cited

U.S. PATENT DOCUMENTS

| | | | | |
|---|---|---|---|---|
| 8,553,447 | B2 | 10/2013 | Takemura | |
| 9,514,792 | B2 | 12/2016 | Kajigaya | |
| 11,074,962 | B2 | 7/2021 | Onuki et al. | |
| 2012/0033489 | A1* | 2/2012 | Song | G11C 13/0026 365/163 |
| 2012/0063208 | A1 | 3/2012 | Koyama et al. | |
| 2012/0081948 | A1 | 4/2012 | Takemura | |
| 2012/0147686 | A1* | 6/2012 | Takayama | G11C 11/4074 365/203 |
| 2013/0070506 | A1* | 3/2013 | Kajigaya | H10B 63/845 365/51 |
| 2021/0343329 | A1 | 11/2021 | Onuki. et al. | |

FOREIGN PATENT DOCUMENTS

| | | | |
|---|---|---|---|
| JP | 2012-138160 | A | 7/2012 |
| JP | 2013-065638 | A | 4/2013 |
| KR | 2012-0035870 | A | 4/2012 |
| WO | WO-2019/048967 | | 3/2019 |

OTHER PUBLICATIONS

Written Opinion (Application No. PCT/IB2020/054454) dated Aug. 4, 2020.

Yamazaki.S et al., "Properties of crystalline In-Ga-Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Amano.S et al., "Low Power LC Display Using In-Ga-Zn-Oxide TFTs Based on Variable Frame Frequency", SID Digest '10 : SID International Symposium Digest of Technical Papers, May 23, 2010, vol. 41, No. 1, pp. 626-629.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

* cited by examiner

FIG. 46A
Intermediate state
New crystalline phase
| Amorphous | Crystalline | Crystal |
|---|---|---|
| ・completely amorphous | ・CAAC<br>・nc<br>・CAC<br><br>excluding single crystal and poly crystal | ・single crystal<br>・poly crystal |
FIG. 46B
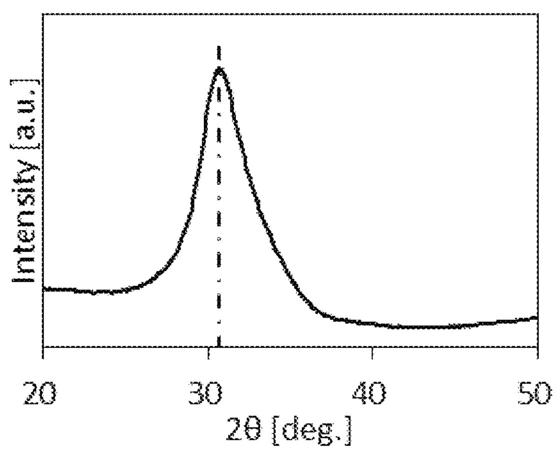
FIG. 46C
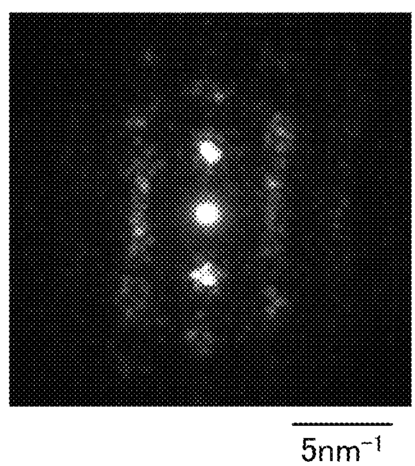

SEMICONDUCTOR DEVICE COMPRISING MEMORY CIRCUIT OVER CONTROL CIRCUITS

TECHNICAL FIELD

In this specification, a semiconductor device and the like are described.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a conventional Si transistor, and an OS transistor can be stacked over a Si transistor. For example, Patent Document 1 discloses a structure in which a plurality of memory cell array layers including OS transistors are stacked over a substrate provided with a Si transistor.

REFERENCE

Patent Document

[Patent Document 1] United States Patent Application Publication No. 2012/0063208

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010).

[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

An object of one embodiment of the present invention is to provide a semiconductor device or the like having a novel structure. Another object of one embodiment of the present invention is to provide a semiconductor device or the like functioning as a memory device that utilizes an extremely low off-state current and having a novel structure that allows a reduction of manufacturing costs. Another object of one embodiment of the present invention is to provide a semiconductor device or the like functioning as a memory device that utilizes an extremely low off-state current and having a novel structure that excels in low power consumption. Another object of one embodiment of the present invention is to provide a semiconductor device or the like functioning as a memory device that utilizes an extremely low off-state current and having a novel structure that allows a reduction in the size of the device. Another object of one embodiment of the present invention is to provide a semiconductor device or the like functioning as a memory device that utilizes an extremely low off-state current and having a novel structure that excels in the reliability of data read out. Another object of one embodiment of the present invention is to provide a semiconductor device or the like functioning as a memory device that utilizes an extremely low off-state current and having a novel structure that allows data read out to be written back without a logic inversion.

The description of a plurality of objects does not disturb the existence of each object. One embodiment of the present invention does not necessarily achieve all the objects described as examples. Furthermore, objects other than those listed are apparent from description of this specification, and such objects can be objects of one embodiment of the present invention.

Means for Solving the Problems

One embodiment of the present invention is a semiconductor device including a first control circuit including a first transistor using a silicon substrate for a channel, a second control circuit provided over the first control circuit, which includes a second transistor using a metal oxide for a channel, a memory circuit provided over the second control circuit, which includes a third transistor using a metal oxide for a channel, and a global bit line and an inverted global bit line that have a function of transmitting a signal between the first control circuit and the second control circuit; in which the first control circuit includes a sense amplifier circuit including an input terminal and an inverted input terminal; and in which in a first period for reading data from the memory circuit to the first control circuit, the second control circuit controls whether the global bit line and the inverted global bit line from which electric charge is discharged are charged or not in accordance with the data read from the memory circuit.

One embodiment of the present invention is a semiconductor device including a first control circuit including a first transistor using a silicon substrate for a channel, a second control circuit provided over the first control circuit, which includes a second transistor using a metal oxide for a channel, a memory circuit provided over the second control circuit, which includes a third transistor using a metal oxide for a channel, a global bit line and an inverted global bit line that have a function of transmitting a signal between the first control circuit and the second control circuit, and a plurality of change-over switches provided between the global bit line and the second control circuit and between the inverted global bit line and the second control circuit; in which the first control circuit includes a sense amplifier including an input terminal and an inverted input terminal; in which in a first period for reading data from the memory circuit to the first control circuit, the second control circuit has a function of controlling whether electric charge precharged to a 1 bit line and the inverted global bit line is discharged or not in accordance with the data read from the memory circuit; in which in the first period, the change-over switches are switched to make a conducting state between the global bit line and the input terminal and between the inverted global bit line and the inverted input terminal; and in which in a second period for refreshing the data read from the memory circuit, the change-over switches are switched to make a conducting state between the global bit line and the inverted input terminal and between the inverted global bit line and the input terminal.

One embodiment of the present invention is a semiconductor device including a first control circuit including a first transistor using a silicon substrate for a channel, a second control circuit provided over the first control circuit, which includes a second transistor using a metal oxide for a channel, a memory circuit provided over the second control circuit, which includes a third transistor using a metal oxide for a channel, and a global bit line and an inverted global bit line that have a function of transmitting a signal between the first control circuit and the second control circuit; in which the first control circuit includes a sense amplifier including an amplifier circuit, an output terminal, an inverted output terminal, a first switch, a second switch, and a signal inverter circuit; in which the first switch is provided between the global bit line and the output terminal; in which the second switch is provided between the inverted global bit line and the inverted output terminal; in which the signal inverter circuit has a function of supplying an inverted potential of logic data corresponding to the potentials of the global bit line and the inverted global bit line to the output terminal and the inverted output terminal that are electrically connected to the amplifier circuit; in which in a first period for reading data from the memory circuit to the first control circuit, the second control circuit has a function of controlling whether electric charge precharged to the global bit line and the inverted global bit line is discharged or not in accordance with the data read from the memory circuit; in which in the first period, the first switch and the second switch are turned off, and the inverted potential of logic data corresponding to the potentials of the global bit line and the inverted global bit line is supplied to the output terminal and the inverted output terminal that are electrically connected to the amplifier circuit; and in which in a second period for refreshing the data read from the memory circuit, the first switch and the second switch are turned on, and potentials of the output terminal and the inverted output terminal, which are amplified by the amplifier circuit, are supplied to the global bit line and the inverted global bit line.

In the semiconductor device of one embodiment of the present invention, the global bit line and the inverted global bit line are preferably provided in the direction perpendicular or substantially perpendicular to a surface of the silicon substrate.

In the semiconductor device of one embodiment of the present invention, the metal oxide preferably contains In, Ga, and Zn.

In the semiconductor device of one embodiment of the present invention, preferably, the second control circuit includes a fourth transistor to a seventh transistor; a gate of the fourth transistor is electrically connected to a local bit line having a function of transmitting a signal between the second control circuit and the memory circuit; the fifth transistor has a function of controlling a conducting state between the gate of the fourth transistor and one of a source and a drain of the fourth transistor; the sixth transistor has a function of controlling a conducting state between the other of the source and the drain of the fourth transistor and a wiring supplied with a potential for allowing current to flow through the fourth transistor; and the seventh transistor has a function of controlling a conducting state between the one of the source and the drain of the fourth transistor and the global bit line

Effect of the Invention

One embodiment of the present invention can provide a semiconductor device or the like having a novel structure. With another embodiment of the present invention, a semiconductor device or the like functioning as a memory device that utilizes an extremely low off-state current and having a novel structure that allows a reduction of manufacturing costs can be provided. With another embodiment of the present invention, a semiconductor device or the like functioning as a memory device that utilizes an extremely low off-state current and having a novel structure that excels in low power consumption can be provided. With another embodiment of the present invention, a semiconductor device or the like functioning as a memory device that utilizes an extremely low off-state current and having a novel structure that allows a reduction in the size of the device can be provided. With another embodiment of the present invention, a semiconductor device or the like functioning as a memory device that utilizes an extremely low off-state current and having a novel structure that excels in the reliability of data read out can be provided. With another embodiment of the present invention, a semiconductor device or the like functioning as a memory device that utilizes an extremely low off-state current and having a novel structure that allows data read out to be written back without a logic inversion can be provided.

The description of a plurality of effects does not disturb the existence of other effects. One embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 46A is a diagram showing the classification of crystal structures of IGZO. FIG. 46B is a diagram showing an XRD spectrum of a CAAC-IGZO film. FIG. 46C is a diagram showing nanobeam electron diffraction patterns of a CAAC-IGZO film.

MODE FOR CARRYING OUT THE INVENTION

Figure 1:
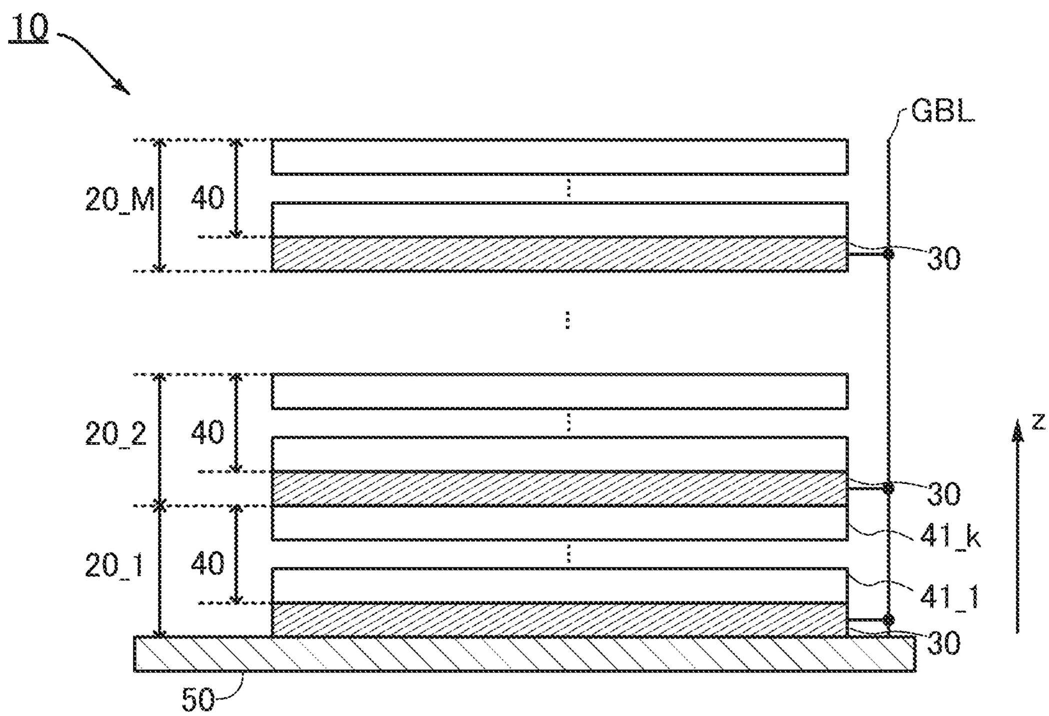
FIG. 1 is a block diagram illustrating a structure example of a semiconductor device.

Embodiments of the present invention are described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as “first”, “second”, and “third” in this specification and the like are used in order to avoid confusion among components. Thus, the ordinal numbers do not limit the number of components. In addition, the ordinal numbers do not limit the order of components. Furthermore, in this specification and the like, for example, a “first” component in one embodiment can be referred to as a “second” component in other embodiments or claims. Furthermore, for example, in this specification and the like, a “first” component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numeral and, in particular, need to be distinguished from each other, an identification sign such as "_1", "_2", "[n]", or "[m,n]" is sometimes added to the reference numeral. For example, the second wiring GL is referred to as a wiring GL[2].

Embodiment 1

Structure examples of a semiconductor device of one embodiment of the present invention are described with reference to FIG. 1 to FIG. 38.

Note that a semiconductor device refers to a device that utilizes semiconductor characteristics, and means a circuit including a semiconductor element (a transistor, a diode, a photodiode, and the like) and a device including the circuit. The semiconductor device described in this embodiment can function as a memory device that utilizes a transistor with an extremely low off-state current.

Structure Example 1 of Semiconductor Device

FIG. 1 is a block diagram for describing a schematic view of a cross-sectional structure of a semiconductor device 10.

The semiconductor device 10 includes a plurality of element layers 20_1 to 20_M (M is a natural number) over a silicon substrate 50. The element layers 20_1 to 20_M each include a transistor layer 30 and a transistor layer 40. The transistor layer 40 includes a plurality of transistor layers 41_1 to 41_*k* (k is a natural number greater than or equal to 2).

To describe the arrangement of the components, the z-axis direction is defined in the schematic view illustrated in FIG. 1. The z-axis direction refers to a direction perpendicular or substantially perpendicular to the plane of the silicon substrate 50. Note that "substantially perpendicular" refers to a state where an arrangement angle is greater than or equal to 85° and less than or equal to 95°. Note that for easy understanding, the z-axis direction is sometimes referred to as the perpendicular direction. The plane of the silicon substrate 50 corresponds to a plane formed by an x-axis and a y-axis that are defined as the direction perpendicular or substantially perpendicular to the z-axis direction. For easy understanding, the x-axis direction might be referred to as the depth direction and the y-axis direction might be referred to as the horizontal direction.

The transistor layer 40 including the plurality of transistor layers 41_1 to 41_*k* is provided with a memory circuit including a plurality of memory cells (not illustrated) in each transistor layer. The memory cells each include a transistor and a capacitor. Note that the capacitor is sometimes referred to as a capacitive element. The element layer refers to a layer in which elements such as a capacitor and a transistor are provided and is a layer including members such as a conductor, a semiconductor, an insulator, and the like.

The memory cells included in the transistor layers 41_1 to 41_*k* can each be referred to as a DOSRAM (Dynamic Oxide Semiconductor Random Access Memory) using a transistor including an oxide semiconductor in a channel formation region (hereinafter, referred to as an OS transistor) for a memory. The memory cell can be formed using one transistor and one capacitor, so that a high-density memory can be achieved. With the use of an OS transistor, a data retention period can be extended.

In the structure of one embodiment of the present invention, with the use of a memory cell including an OS transistor, electric charge corresponding to a desired voltage can be retained in the capacitor located at the other of a source and a drain by utilizing an extremely low leakage current flowing between the source and the drain in an off state (hereinafter, an off-state current). In other words, data written once can be retained for a long time in the memory cell. Therefore, the frequency of data refresh can be reduced and power consumption can be reduced.

In addition, the memory cell using an OS transistor can rewrite and read data by charging or discharging of electric charge; thus, a substantially unlimited number of times of data writing and data reading are possible. Unlike a magnetic memory, a resistive random access memory, or the like, the memory cell using an OS transistor has no change in the structure at the atomic level and thus exhibits high rewrite endurance. In addition, unstableness due to the increase of electron trap centers is not observed in the memory cell using an OS transistor even when rewriting operation is repeated like in a flash memory.

The memory cell using an OS transistor can be freely provided, for example, over a silicon substrate including a transistor including silicon in a channel formation region (hereinafter, a Si transistor), so that integration can be easily performed. Furthermore, an OS transistor can be manufactured with a manufacturing apparatus similar to that for a Si transistor and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain in accordance with a voltage supplied to the gate electrode or the back gate electrode. Thus, circuit design with the same ideas as those of an LSI is possible. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

The silicon substrate 50 includes a control circuit for performing data writing or data reading to or from a memory cell selected by the transistor layer 30 through a global bit line (described as a global bit line GBL in some cases) and a local bit line (described as a local bit line LBL in some cases). The control circuit includes a plurality of Si transistors using the silicon substrate 50 for their channels. The control circuit included in the silicon substrate 50 includes a sense amplifier circuit formed using a Si transistor, and the like. The control circuit included in the silicon substrate 50 is referred to as a first control circuit in some cases.

The transistor layer 30 has a function of writing and reading data to and from a memory cell selected from one of the plurality of memory cells included in the transistor layer 40.

The transistor layer 30 is provided with a control circuit including a read transistor for reading data and a transistor for controlling data writing and data reading. A gate of the read transistor is connected to a local bit line connected to one of the plurality of memory cells. With this structure, the read transistor can amplify a slight difference in the potential of the local bit line in data reading, so that the potential can be output to a global bit line. The control circuit provided for the transistor layer 30 has a function of an amplifier circuit formed using an OS transistor. The control circuit included in the transistor layer 30 is referred to as a second control circuit in some cases.

Note that the second control circuit may have a function of retaining a potential corresponding to the threshold voltage of the transistor in the gate of the read transistor. This structure enables the read transistor to reduce a variation in data read from the memory cell.

Note that the local bit line LBL is a wiring directly connected to the memory cell. The global bit line GBL is a wiring electrically connected to the memory cell through the second control circuit by selecting any one of a plurality of local bit lines. The global bit line GBL or the local bit line LBL has a function of transmitting a signal. A data signal supplied to the global bit line GBL or the local bit line LBL corresponds to a signal written to the memory cell or a signal read from the memory cell. The data signal is described as a binary signal having a high-level or low-level potential corresponding to data 1 or data 0. The data signal may be a multilevel signal higher than or equal to a ternary signal. Note that the global bit line GBL functions as an inverted global bit line GBLB in some cases so as to form a pair of wirings for reading data.

As illustrated in FIG. 1, the transistor layer 40 is stacked with the transistor layer 30 in the z-axis direction. The transistor layer 40 included in each of the element layers 20_1 to 20_M is selected by the second control circuit. The second control circuit has a function of converting a data signal written to the memory cell, by utilizing a difference occurring in the amount of current flowing in the read transistor included in the transistor layer 30, into a change in the potential of the global bit line GBL and outputting the potential to the first control circuit. Furthermore, the second control circuit has a function of supplying a data signal output from the first control circuit to the local bit line.

One embodiment of the present invention uses an OS transistor with an extremely low off-state current as a transistor provided in each element layer. Accordingly, the frequency of refresh of data retained in the memory cells can be reduced, so that a semiconductor device with reduced power consumption can be obtained. OS transistors can be provided to be stacked and manufactured by repeating the same manufacturing process in the perpendicular direction; thus, manufacturing costs can be reduced. Furthermore, in one embodiment of the present invention, the transistors forming the memory cells can be provided in not the plane direction but the perpendicular direction to improve the memory density; thus, the device can be downsized. Furthermore, since an OS transistor has a smaller variation in electrical characteristics than a Si transistor even in a high-temperature environment, the semiconductor device can function as a highly reliable memory device.

Figure 2A:
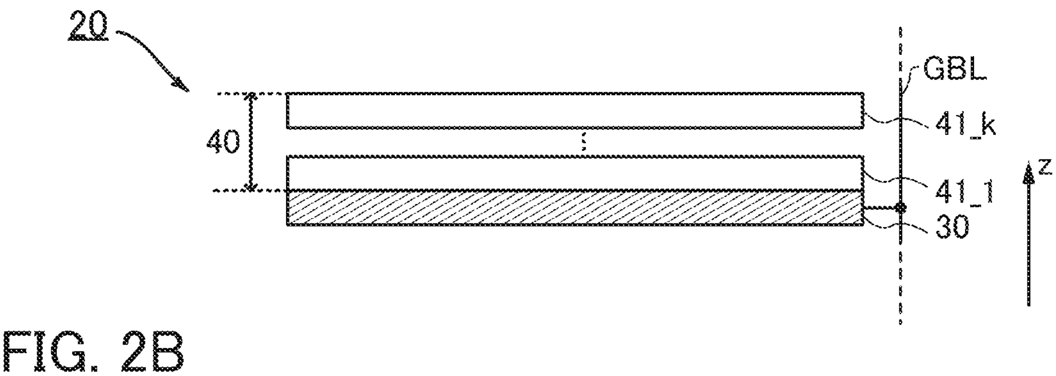
FIG. 2A and FIG. 2B are a block diagram and a circuit diagram illustrating a structure example of a semiconductor device.

Next, FIG. 2A illustrates a block diagram of the element layer 20 corresponding to any one of the element layers 20_1 to 20_M in FIG. 1.

As also illustrated in FIG. 1, the element layer 20 of one embodiment of the present invention has a structure in which the plurality of transistor layers 40 including the memory cells are provided over the transistor layer 30 in the z-axis direction. With this structure, the distance between the transistor layer 30 and the transistor layer 40 can be made small. When the local bit line is shortened, parasitic capacitance can be reduced. The plurality of transistor layers 40 are manufactured by repeating the same manufacturing process in the perpendicular direction, whereby manufacturing costs can by reduced.

Figure 2B:
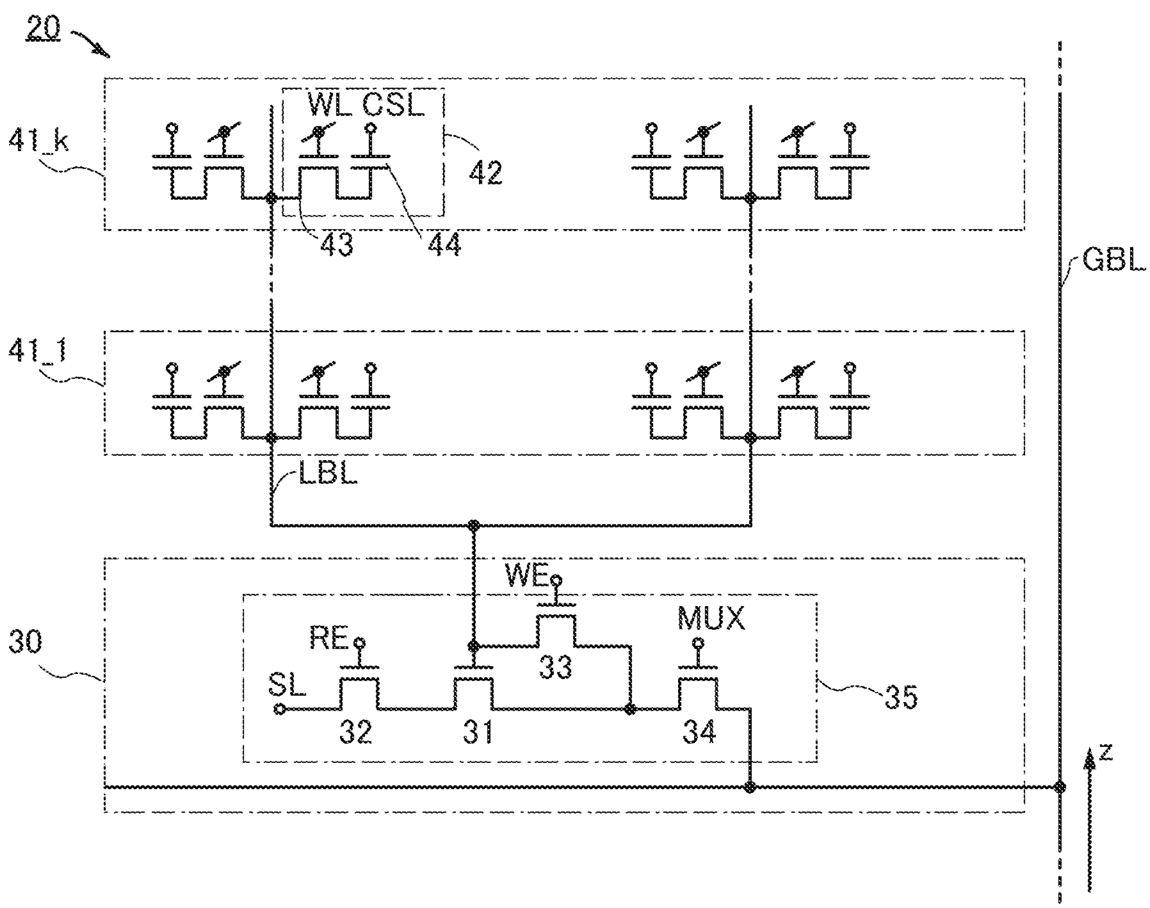

FIG. 2B is a diagram that illustrates the components of the element layer 20 illustrated in FIG. 2A using circuit symbols.

The transistor layer 30 is provided with a control circuit 35 including a transistor 31, a transistor 32, a transistor 33, and a transistor 34. Each of the transistor layers 41_1 and 41_2 includes a plurality of memory cells 42. The memory cell 42 includes a transistor 43 and a capacitor 44. The transistor 43 functions as a switch that switches between a conducting state (on) and a non-conducting state (off) between the local bit line LBL and the capacitor 44 in accordance with the control of a word line WL connected to a gate of the transistor 43. The local bit line LBL is connected to a gate of the transistor 31. The word line WL switches between on and off of the transistor 43 in accordance with a word signal (referred to as a signal WL in some cases) supplied to the word line WL. The capacitor 44 is connected to a wiring CSL to which a fixed potential is supplied.

The connection between the transistors included in the control circuit 35 is illustrated in FIG. 2B. Specifically, one of a source and a drain of the transistor 33 is connected to the gate of the transistor 31. The other of the source and the drain of the transistor 33 is connected to one of a source and a drain of the transistor 34 and one of a source and a drain of the transistor 31. One of a source and a drain of the transistor 32 is connected to the other of the source and the drain of the transistor 31. The other of the source and the drain of the transistor 32 is connected to a wiring SL. The other of the source and the drain of the transistor 34 is connected to the global bit line GBL. The transistors 32, 33, and 34 each function as a switch that switches between a conducting state and a non-conducting state between the source and the drain in accordance with the control of signals RE, WE, and MUX connected to the respective gates. The signals RE, WE, and MUX are signals switching between on and off of the transistor functioning as a switch. For example, the signal can be configured to turn on the transistor at H level and turn off the transistor at L level.

The transistor 43 is an OS transistor described above. The capacitor 44 has a structure in which an insulator is sandwiched between conductors serving as electrodes. As the conductors forming the electrodes, a semiconductor layer or the like to which conductivity is imparted as well as metal can be used. Although the details of the arrangement of the capacitor 44 are described later, a structure in which the capacitor 44 is provided in a position overlapping with the upper side or the lower side of the transistor 43 can be employed; furthermore, part of a semiconductor layer, electrode, or the like forming the transistor 43 can be used as one of the electrodes of the capacitor 44.

The transistor 31 has a function of supplying current between the source and the drain of the transistor 31 in accordance with the potential of the local bit line LBL. When the potential of the gate of the transistor 31 exceeds the threshold voltage of the transistor 31, current flows between the source and the drain.

The control circuit 35 has a function of controlling whether the current flowing between the source and the drain of the transistor 31 is made to flow between the wiring SL and the global bit line GBL or a function of transmitting the potential of the global bit line GBL to the local bit line LBL. Alternatively, the control circuit 35 has a function of discharging the potential of the gate of the transistor 31 to the wiring SL through a path between the source and the drain of the transistor 31.

The transistors 31 to 34 are formed using OS transistors like the transistor 43. The transistor layers 30 and 40 forming the element layer 20 using OS transistors can be stacked and provided over the silicon substrate 50 including Si transistors, which facilitates integration.

Figure 3A:
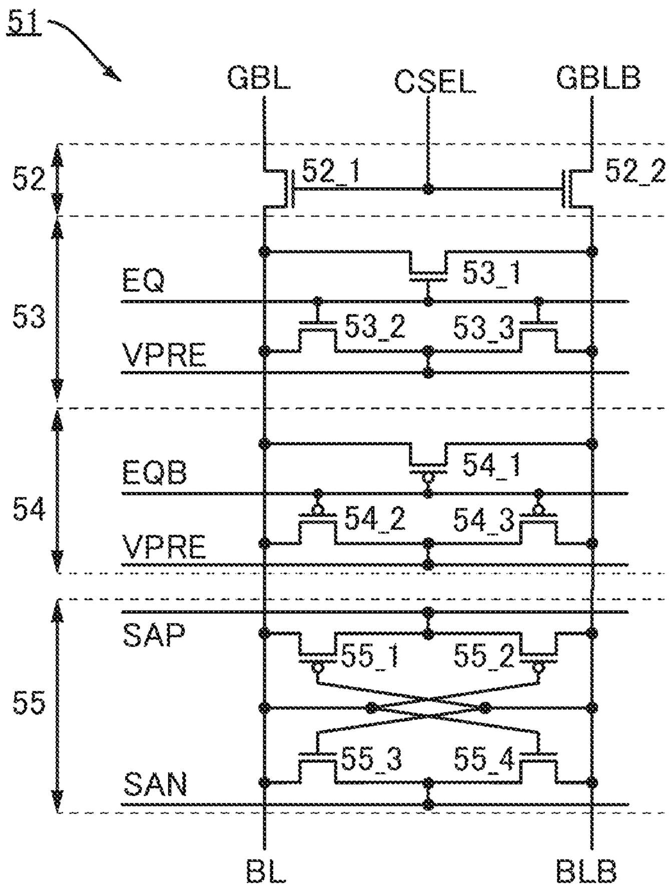
FIG. 3A and FIG. 3B are circuit diagrams illustrating a structure example of a semiconductor device.

FIG. 3A illustrates a circuit structure example of a control circuit 51 corresponding to the first control circuit formed using Si transistors in the silicon substrate 50. The control circuit 51 illustrates a switch circuit 52; a precharge circuit 53; a precharge circuit 54; a sense amplifier 55; and the global bit line GBL, the inverted global bit line GBLB, a bit line BL, and an inverted bit line BLB, which are connected to the control circuit 51. Note that in this specification and the like, some of terminals or wirings connected to the global bit line GBL or the inverted global bit line GBLB in the control circuit 51 are sometimes referred to as an input terminal and an inverted input terminal of the control circuit 51. Furthermore, the bit line BL and the inverted bit line BLB that are wirings connected to the sense amplifier 55 are sometimes referred to as an output terminal and an inverted output terminal of the control circuit 51.

The switch circuit 52 includes, for example, n-channel transistors 52_1 and 52_2 as illustrated in FIG. 3A. The transistors 52_1 and 52_2 switch a conducting state between a wiring pair of the global bit line GBL and the inverted global bit line GBLB and a wiring pair of the bit line BL and the inverted bit line BLB in accordance with a signal of a wiring CSEL. The switch circuit 52 may have a structure in which an analog switch combined with a p-channel transistor is used.

The precharge circuit 53 is formed using n-channel transistors 53_1 to 53_3 as illustrated in FIG. 3A. The precharge circuit 53 is a circuit to be precharged at a potential VPRE corresponding to a potential VDD/2 between the bit line BL and the inverted bit line BLB, in accordance with a signal of a wiring EQ. The precharge circuit 54 is formed using p-channel transistors 54_1 to 54_3 as illustrated in FIG. 3A. The precharge circuit 54 is a circuit to be precharged at the potential VPRE corresponding to the potential VDD/2 between the bit line BL and the inverted bit line BLB, in accordance with a signal of a wiring EQB. Only one of the precharge circuits 53 and 54 may be used. The precharge circuits 53 and 54 have a function of electrically connecting the bit line BL and the inverted bit line BLB and equilibrating (equalizing) them.

The sense amplifier 55 is formed using p-channel transistors 55_1 and 55_2 and n-channel transistors 55_3 and 55_4, which are connected to a wiring SAP or a wiring SAN, as illustrated in FIG. 3A. The wiring SAP or the wiring SAN is a wiring having a function of supplying VDD or VSS. The transistors 55_1 to 55_4 are transistors that form an inverter loop.

Figure 3B:
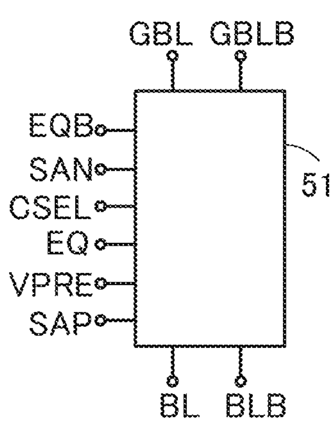

FIG. 3B illustrates a circuit block corresponding to the control circuit 51 illustrated in FIG. 3A or the like. As illustrated in FIG. 3B, the control circuit 51 is expressed as a block in the drawing and the like in some cases.

Figure 4:
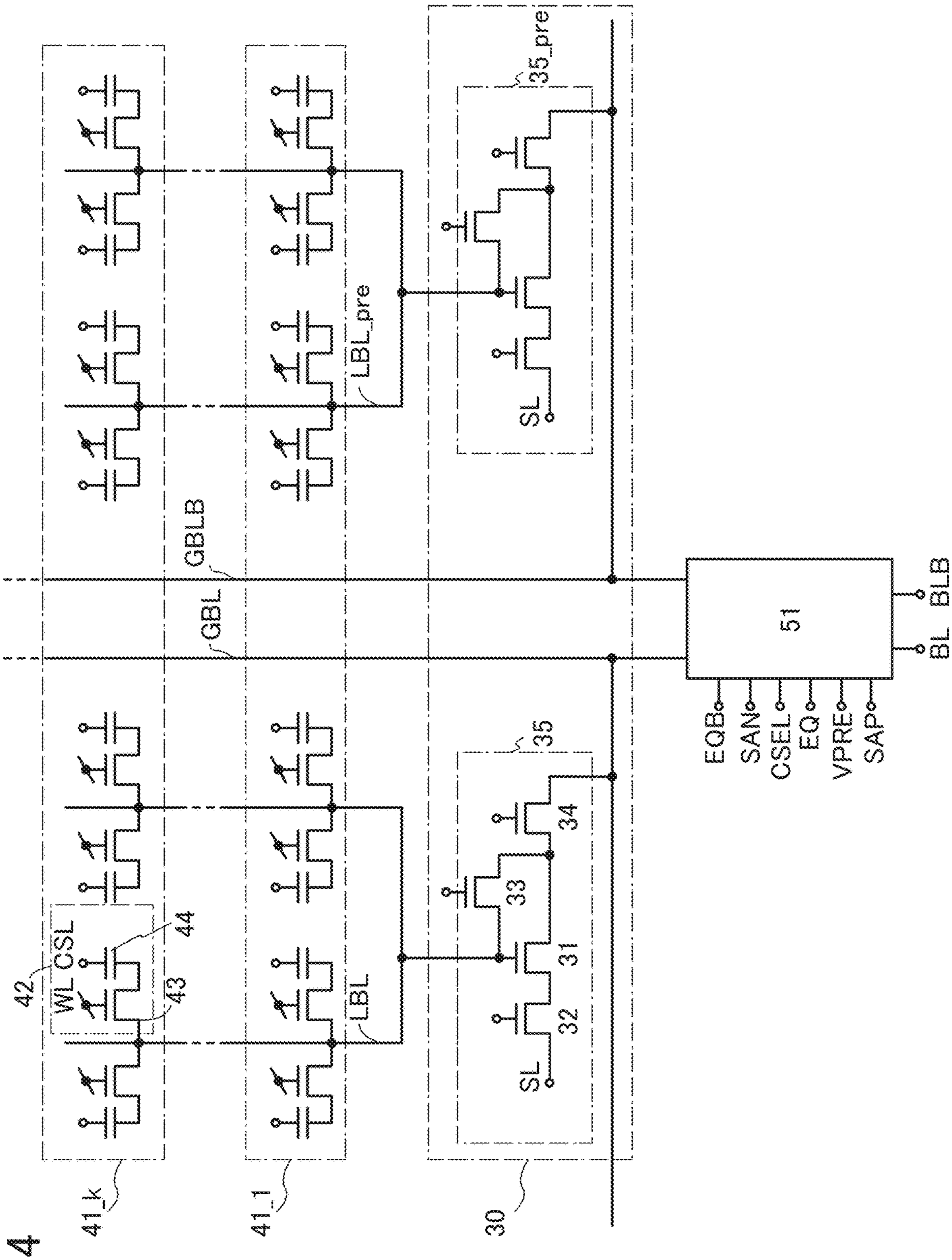
FIG. 4 is a circuit diagram illustrating a structure example of a semiconductor device.

FIG. 4 is a circuit diagram for describing an operation example of the semiconductor device 10 in FIG. 1. In FIG. 4, the circuit block illustrated in FIG. 3A and FIG. 3B is used.

As illustrated in FIG. 4, the transistor layers 41_1 to 41_*k* each include the memory cells 42. The memory cells 42 are connected to the local bit line LBL and a local bit line LBL_pre which form a pair. The memory cell 42 connected to the local bit line LBL is a memory cell to/from which data is written or read. The local bit line LBL_pre is a local bit line to be precharged for comparison of a potential, and the memory cell connected to the local bit line LBL_pre continues to retain data.

The local bit line LBL is connected to the global bit line GBL through the control circuit 35. The local bit line LBL_pre is electrically connected to the inverted global bit line GBLB through a control circuit 35_pre. The global bit line GBL and the inverted global bit line GBLB are electrically connected to the control circuit 51. Note that the signals RE, WE, and MUX that control on/off of the transistors 32, 33, and 34 of the control circuit 35 and the control circuit 35_pre are omitted in the diagram. The signals RE, WE, and MUX perform different controls on the control circuit 35 and the control circuit 35_pre. For example, signals controlling on/off of the transistors 32, 33, and 34 in the control circuit 35 are signals RE1, WE1, and MUX1 (not illustrated), and signals controlling on/off of the transistors 32, 33, and 34 in the control circuit 35_pre are signals RE2, WE2, and MUX2 (not illustrated).

Figure 5:
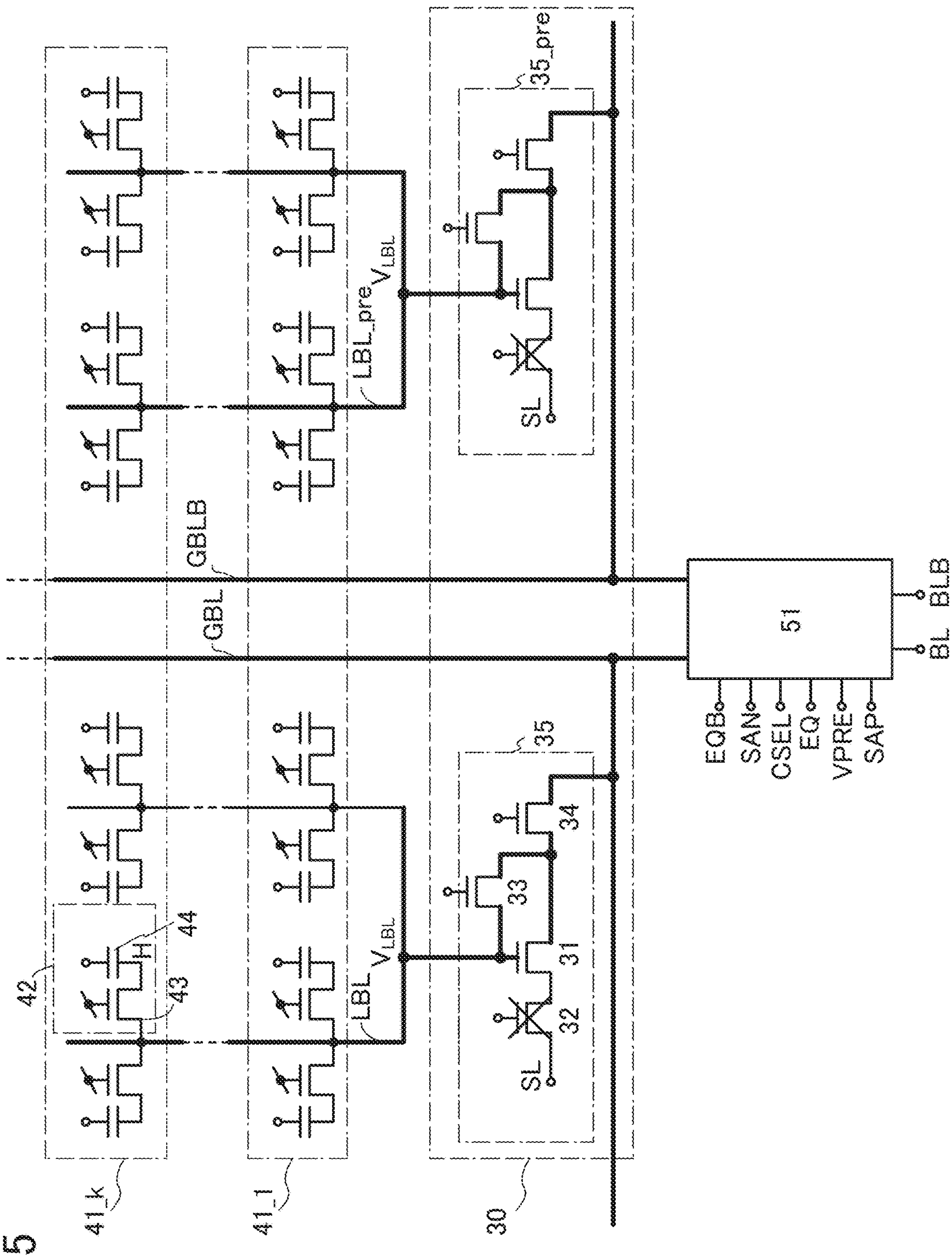
FIG. 5 is a circuit diagram illustrating a structure example of a semiconductor device.

FIGS. 5 to 9 illustrate schematic views for describing the operation of the circuit diagram illustrated in FIG. 5. Note that in FIGS. 5 to 9, some wirings electrically connected by on/off of the transistors functioning as switches are sometimes indicated by bold lines for easy understanding. Note that description is made under the assumption that data retained in the memory cell 42 from/to which data is read and written back retains data "1", i.e., an H-level potential (denoted as "H" in the drawing). Furthermore, a transistor in an off state included in the control circuits 35 and 35_pre is marked with a cross.

FIG. 5 is a schematic view illustrating a period in which the local bit line LBL and the local bit line LBL_pre are precharged. In the period for precharging, the transistors 33 and 34 in both of the control circuits 35 and 35_pre are turned on, and a precharge voltage $V_{LBL}$ supplied to the global bit line GBL and the inverted global bit line GBLB is transmitted to the local bit line LBL and the local bit line LBL_pre to perform precharging. Each wiring is increased to the power supply voltage VDD (e.g., 1.5 V) by the precharging. The precharge voltage $V_{LBL}$ corresponds to the potential VPRE.

Figure 6:
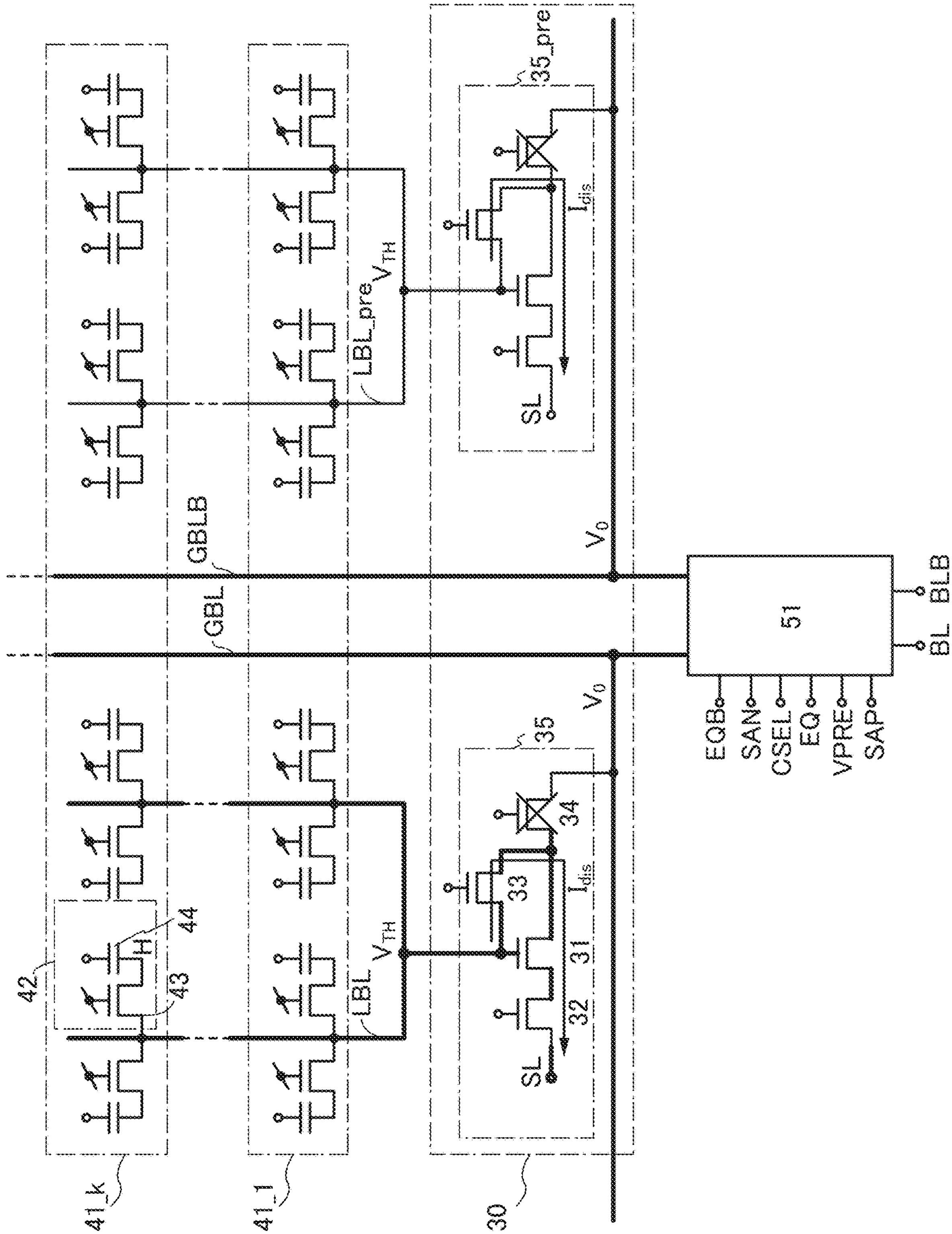
FIG. 6 is a circuit diagram illustrating a structure example of a semiconductor device.

FIG. 6 is a schematic view illustrating a period for retaining a threshold voltage $V_{TH}$ of the transistor 31 in the gate of the transistor 31 and performing correction equivalent to the threshold voltage $V_{TH}$ in read data. In this period, the transistors 34 are turned off in both of the control circuits 35 and 35_pre so that the precharge voltage $V_{LBL}$ supplied to the global bit line GBL and the inverted global bit line GBLB is discharged to the wiring SL. In the discharging, the voltage of the wiring SL is, for example, half of the precharge voltage. A current $I_{dis}$ flowing by the discharging is stopped when the potential of the gate of the transistor 31 reaches a threshold voltage $0.5\times V_{LBL}+V_{TH}$. Furthermore, in this period, the global bit line GBL and the inverted global bit line GBLB are precharged at a voltage $V_0$. The voltage $V_0$ is a voltage lower than a potential supplied to the other wirings or the like, for example, 0 V.

Figure 7:
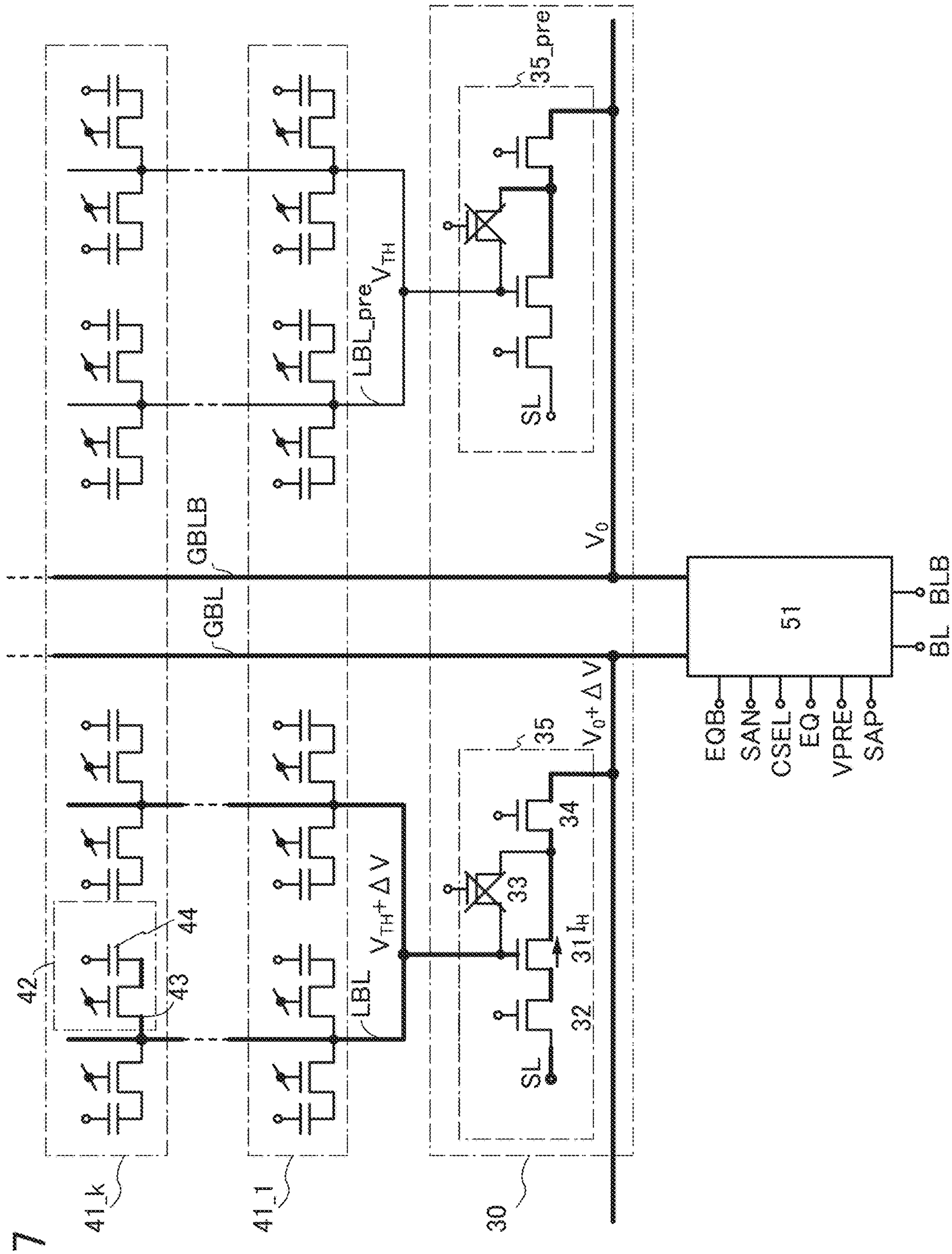
FIG. 7 is a circuit diagram illustrating a structure example of a semiconductor device.

In FIG. 7, the transistor 43 of the memory cell 42 from which data is read is turned on so that electric charge is shared (charge sharing) between the capacitor 44 and the local bit line LBL. The potential of the local bit line LBL is increased from a voltage $0.5\times V_{LBL}+V_{TH}$ to a voltage $0.5\times V_{LBL}+V_{TH}+\Delta V$. Here, the voltage $\Delta V$ is caused by electric charge transfer due to the H-level potential retained in the memory cell 42. Furthermore, the transistors 33 are turned off in the control circuits 35 and 35_pre to set the potential of the wiring SL higher than the potential $V_0$, for example, set to VDD. In the control circuit 35, the voltage of the gate of the transistor 31 is increased to the voltage $0.5\times V_{LBL}+V_{TH}+\Delta V$, so that a current hi flows. On the other hand, in the control circuit 35_pre, the voltage of the gate of the transistor 31 remains at the voltage $0.5\times V_{LBL}+V_{TH}$, so that current is less likely to flow than that in the control circuit 35. Thus, the voltage of the global bit line GBL is higher than the voltage of the inverted global bit line GBLB.

Figure 8:
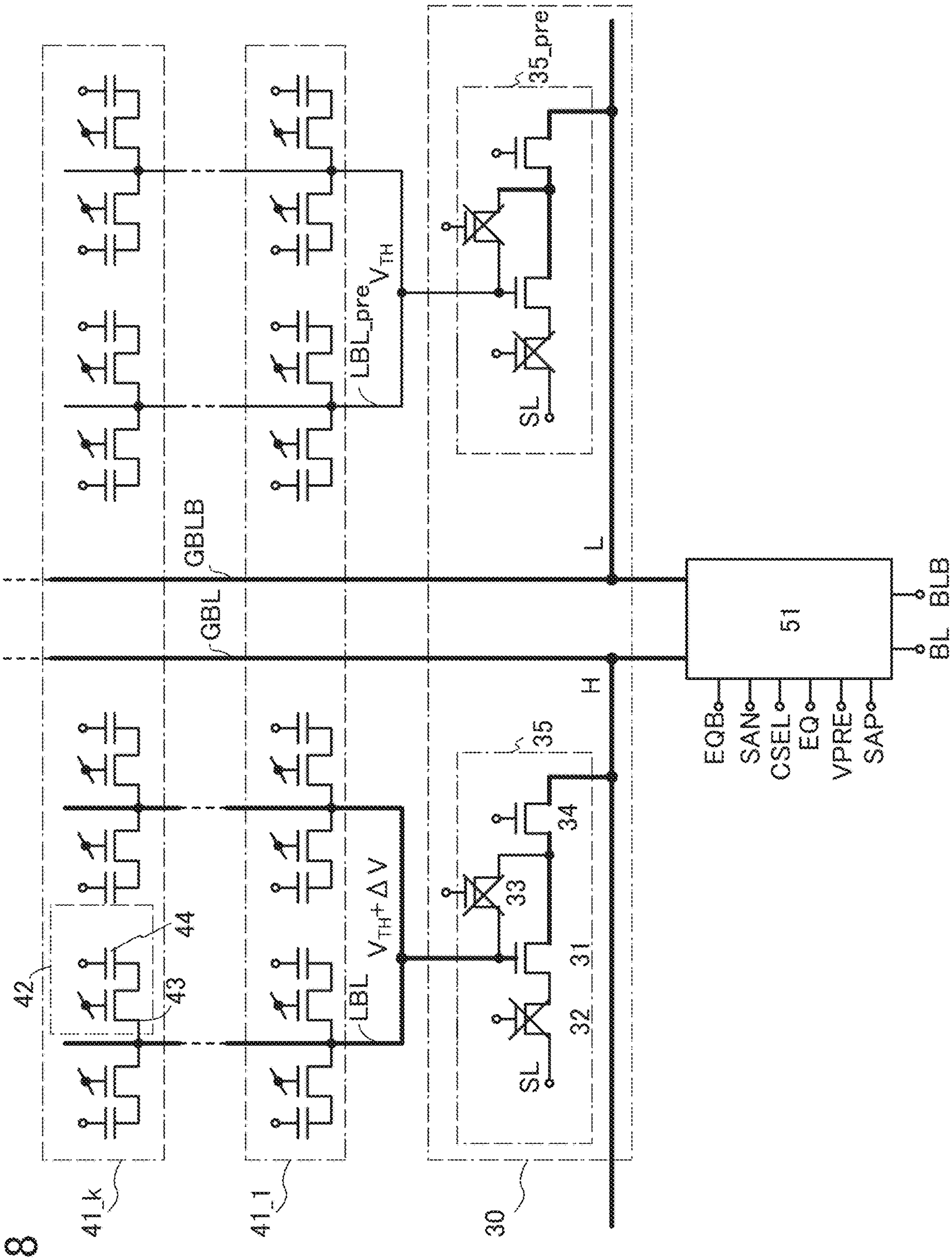
FIG. 8 is a circuit diagram illustrating a structure example of a semiconductor device.

In FIG. 8, the transistors 32 and 33 in both of the control circuits 35 and 35_pre are turned off, and the sense amplifier included in the control circuit 51 is activated to determine the voltages of the global bit line GBL and the inverted global bit line GBLB at H level or L level. Note that the activation of the sense amplifier refers to an operation for determining H level or L level of each wiring in accordance with a voltage difference between the global bit line GBL and the inverted global bit line GBLB.

Figure 9:
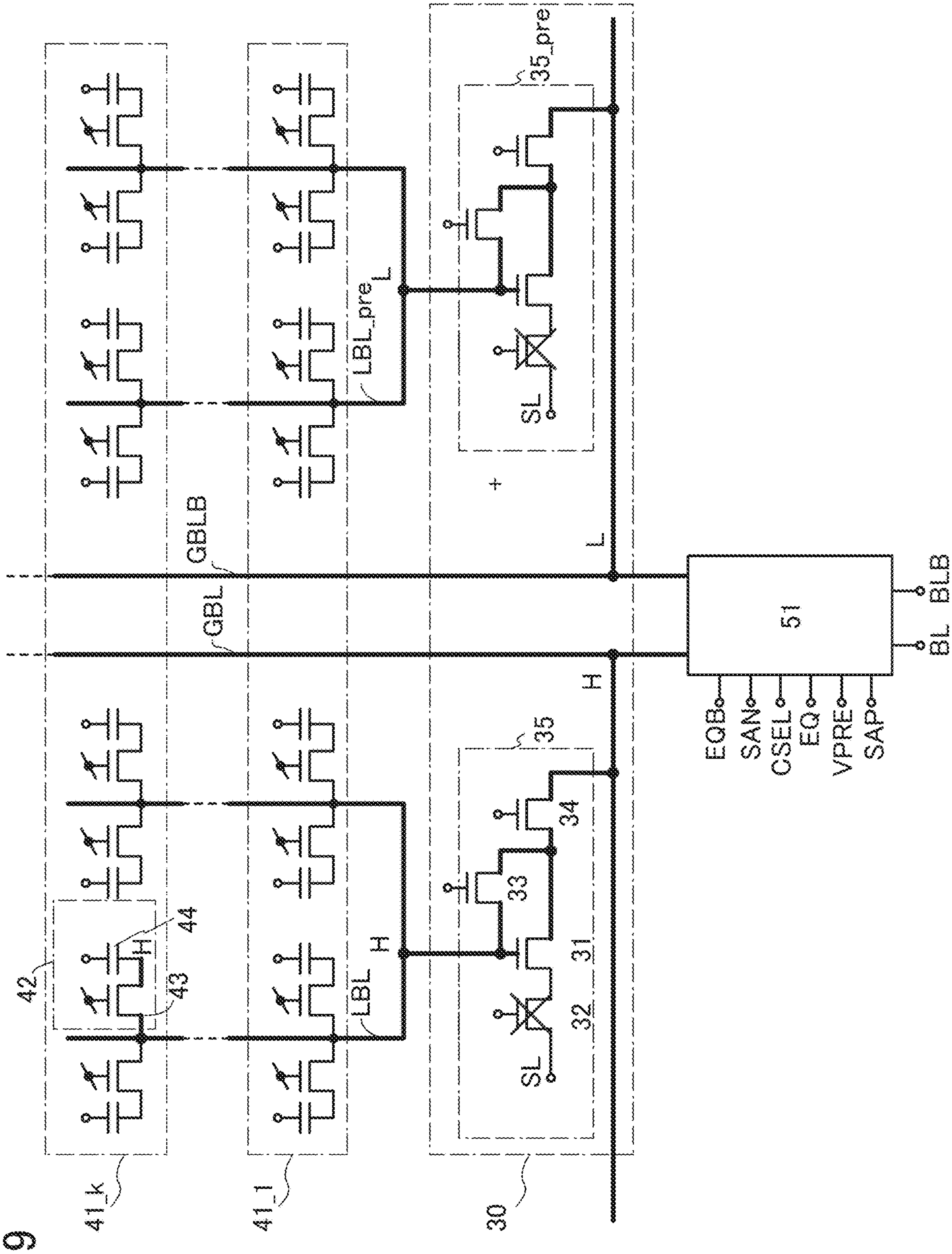
FIG. 9 is a circuit diagram illustrating a structure example of a semiconductor device.

In FIG. 9, the transistors 33 and 34 in both of the control circuits 35 and 35_pre and the transistor 43 included in the memory cell 42 are turned on, and the voltages of the global bit line GBL and the inverted global bit line GBLB that are determined in the above period are written back to the memory cell 42.

With the above structure, the voltage corresponding to a logic of the data read out by the charge sharing can be written back to the memory cell 42 again without inversion of the logic. That is, when data “1”, i.e., an H-level potential is read from the memory cell 42, data “1”, i.e., an H-level potential can be written back to the memory cell 42.

Figure 10:
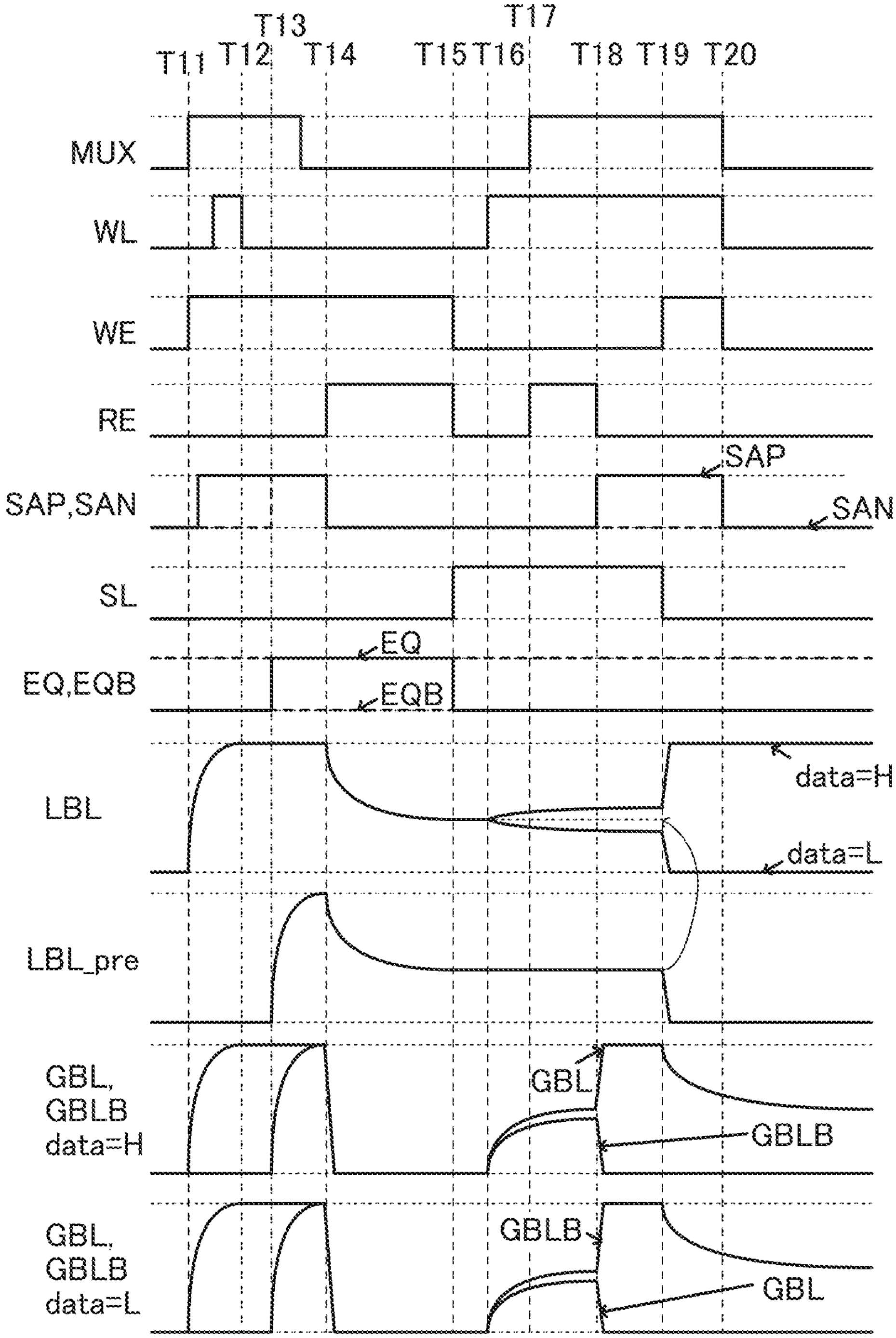
FIG. 10 is a timing chart showing a structure example of a semiconductor device.

FIG. 10 shows a timing chart for describing the operation including the periods illustrated in FIG. 5 to FIG. 9. Note that the timing chart in FIG. 10 illustrates a case where data is at H level (data=H) and a case where data is at L level (data=L), separately, for the wiring pair of the global bit line GBL and the inverted global bit line GBLB.

In the timing chart illustrated in FIG. 10, Time T11 to Time T13 correspond to a period for data writing. Time T13 to Time T16 correspond to a period for obtaining the threshold voltage, that is, a correction period. Time T16 to Time T18 correspond to a period for data reading. Time T18 to Time T20 correspond to a period for writing data back. Although the signals RE, WE, and MUX are different between the control circuit 35 and the control circuit 35_pre, they are described as the signals RE, WE, and MUX in FIG. 10 because the control circuit 35 and the control circuit 35_pre perform the same operation.

In Time T11, the signal MUX and the signal WE are set at H level and writing data is transferred from the sense amplifier, so that one of the wiring pair of the global bit line GBL and the inverted global bit line GBLB is charged. The potential of the local bit line LBL increases. The potential of the word line WL is at H level, and the potential supplied to the local bit line LBL (H level in the case of FIG. 10) is written to the memory cell 42.

In Time T12, the potential of the word line WL is set to L level. Data is retained in the memory cell 42.

In time T13, the wirings SAP and SAN both are set to VDD, signals of the wirings EQ and EQB are inverted, and the wiring pair of the global bit line GBL and the inverted global bit line GBLB are both set to H level. The local bit line LBL_pre is precharged at an H-level potential. After that, the signal MUX is set at L level. The signal WE may be also set to L level.

In Time T14, the signal RE and the signal WE are set to H level. The potential of the local bit line LBL and the potential of the local bit line LBL_pre decrease by discharging through the transistor 31. This discharging is stopped at the time when the voltage between the gate and the source of the transistor 31 is equal to the threshold voltage of the transistor 31. In Time T14, the wirings SAP and SAN are set to VSS (0 V), and the wiring pair of the global bit line GBL and the inverted global bit line GBLB are set to L level.

In Time T15, both the signal WE and the signal RE are set to L level. A potential corresponding to the threshold voltage of the transistor 31 is retained in the local bit line LBL and the local bit line LBL_pre. The signals of the wirings EQ and EQB are inverted again, and precharging is stopped. That is, the wiring pair of the global bit line GBL and the inverted global bit line GBLB is in an electrically floating state. In Time T15, the potential of the wiring SL is switched from L level to H level. By the switching, the direction of current flowing through the transistor 31 can be switched.

In Time T16, the word line WL is set to H level to perform charge sharing. The potential of the local bit line LBL varies in accordance with the data written to the memory cell 42. When H-level data is written to the memory cell 42, the potential of the local bit line LBL increases, and when L-level data is written to the memory cell 42, the potential of the local bit line LBL decreases. In contrast, the potential of the local bit line LBL_pre does not vary because the charge sharing by the operation of the word line WL is not performed.

In Time T17, the signal RE and the signal MUX are set to H level, whereby current flows through the transistor 31 included in the control circuit 35 and the transistor 31 included in the control circuit 35_pre in accordance with the potentials of the local bit line LBL and the local bit line LBL_pre. Since the potentials of the local bit line LBL and the local bit line LBL_pre differ, a difference is generated in the current flowing through the transistor 31 included in the control circuit 35 and the current flowing through the transistor 31 included in the control circuit 35_pre. The difference in the current corresponds to the potential of the local bit line LBL varying depending on the charge sharing, i.e., data read from the memory cell 42. As a result, data of the memory cell 42 can be converted into the amount of the change in the potential of the wiring pair of the global bit line GBL and the inverted global bit line GBLB, as illustrated in FIG. 10.

In Time T18, the signal RE is set to L level. Then, the power supply voltage (VDD, VSS) is supplied to the wirings SAP and SAN, whereby the sense amplifier 55 operates. The potential of the wiring pair of the global bit line GBL and the inverted global bit line GBLB is determined by the operation of the sense amplifier 55.

In Time T19, by setting the signal WE to H level, the voltage corresponding to the logic of the read data can be written back to the memory cell 42 again.

In Time T20, the signal MUX, the signal WL, and the signal WE are set to L level. In the memory cell 42, writing back of data corresponding to the logic of the read data is completed.

Figure 11:
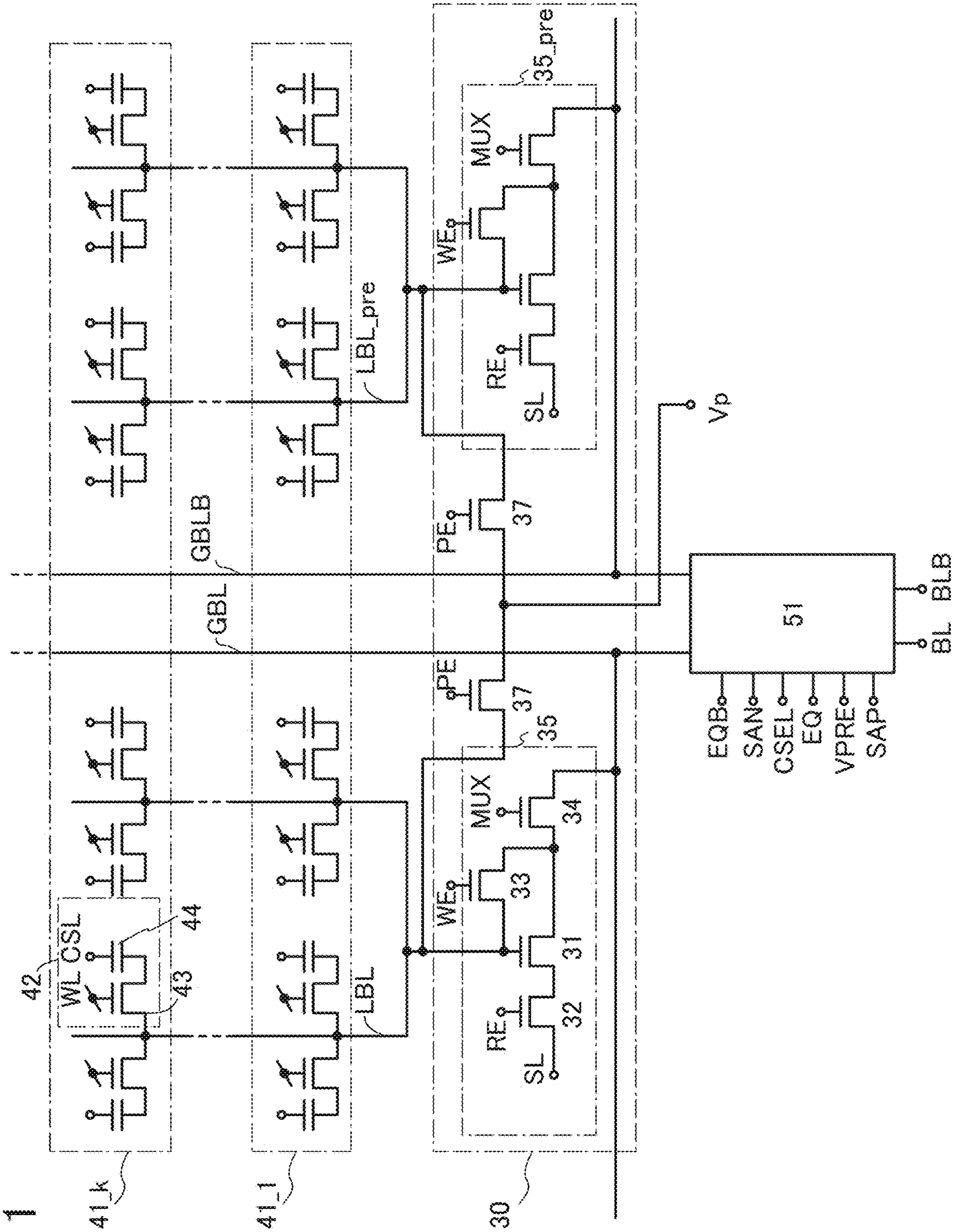
FIG. 11 is a circuit diagram illustrating a structure example of a semiconductor device.

Although the local bit line LBL is precharged through the global bit line GBL in the structure illustrated in FIG. 4, the present invention is not limited thereto. For example, as illustrated in FIG. 11, it is preferable that a transistor 37 be provided in the same layer as the control circuit and the transistor 37 be controlled with a signal PE to perform voltage Vp precharging. With this structure, power consumption for charging and discharging the global bit line GBL can be reduced.

Figure 12:
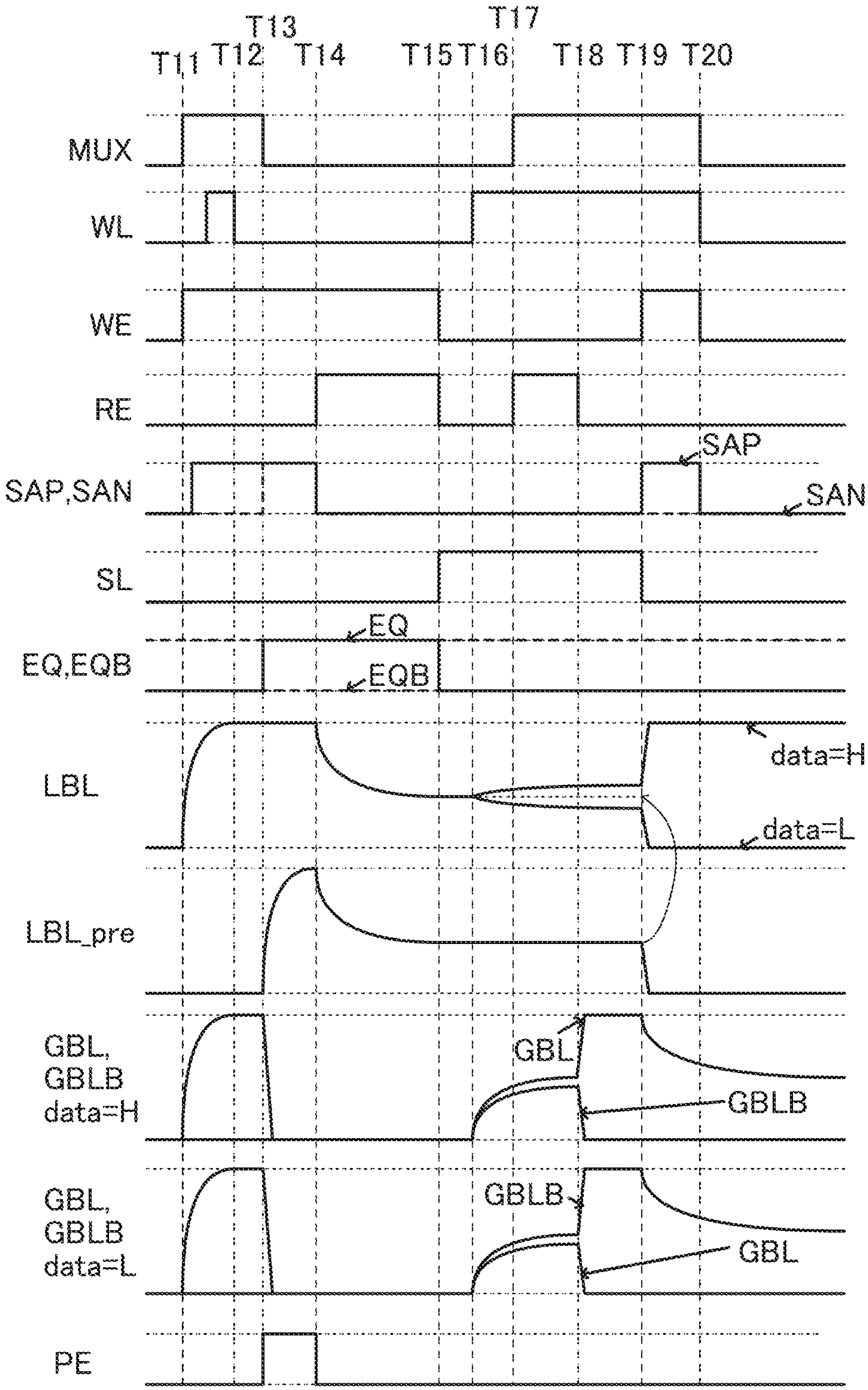
FIG. 12 is a timing chart showing a structure example of a semiconductor device.

FIG. 12 is a timing chart for describing an operation with the structure illustrated in FIG. 11. As in the timing chart shown in FIG. 12, the signal PE is controlled to be at H level from Time T13 to Time T14. With this structure, unnecessary charging of the global bit line GBL and the inverted global bit line GBLB can be inhibited.

In the transistor layer including the memory cells and the control circuit of one embodiment of the present invention, the potentials of the wiring SL and the global bit line GBL are switched when data read from the memory cell is written back, whereby the direction of current flowing through the transistor 31 is inverted. With this structure, the data can be written back to the memory cell without logic inversion.

Structure Example 2 of Semiconductor Device

Figure 13:
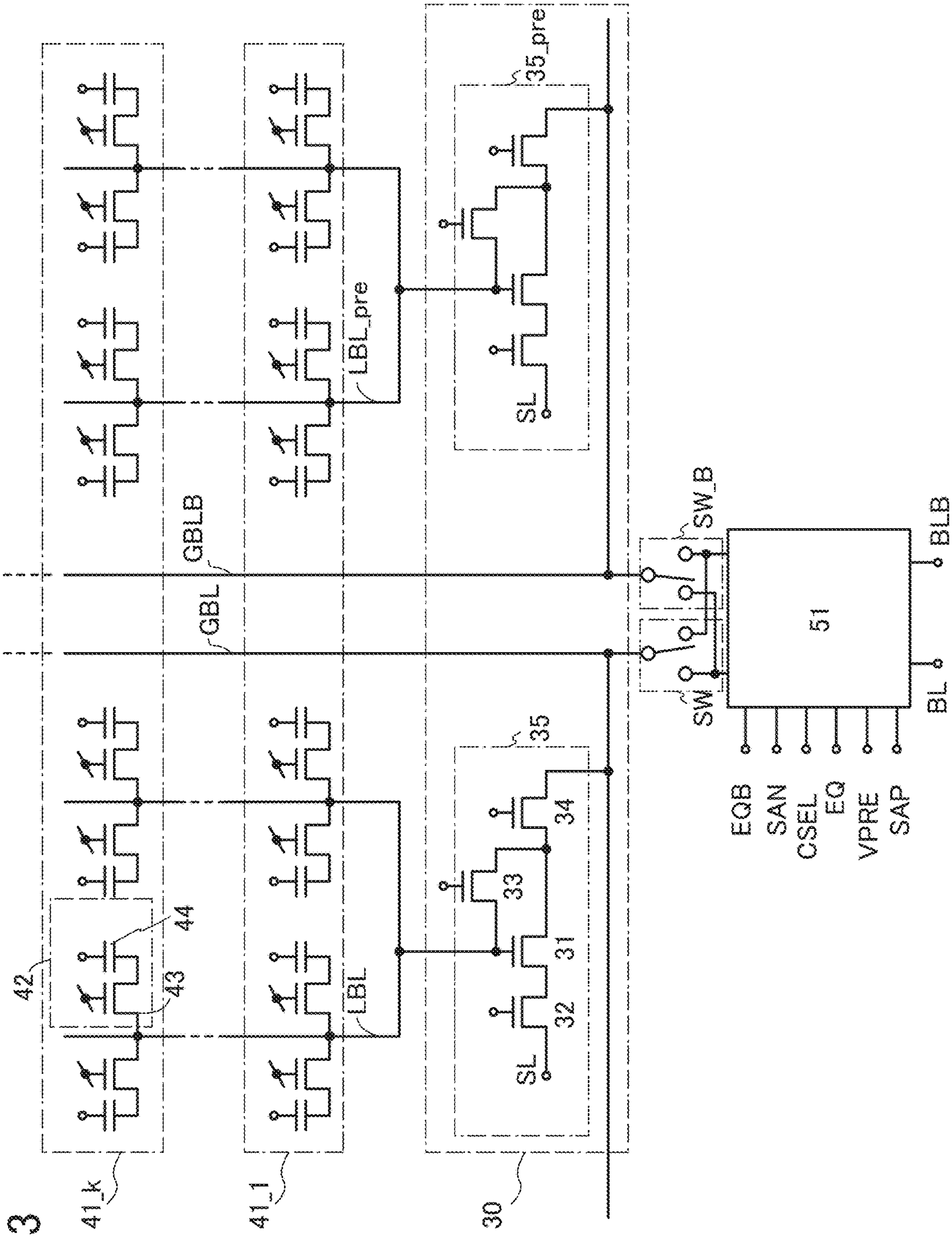
FIG. 13 is a circuit diagram illustrating a structure example of a semiconductor device.

FIG. 13 is another circuit diagram for describing an operation example of the semiconductor device 10 in FIG. 1. FIG. 13 illustrates a structure example in which change-over switches SW and SW_B for switching connection between the input terminals of the control circuit 51 and the global bit line GBL or the inverted global bit line GBLB are provided therebetween in addition to the circuit block illustrated in FIG. 3A or FIG. 3B. As illustrated in FIG. 13, the change-over switches SW and SW_B can switch connection between the input terminals of the control circuit 51 and the global bit line GBL or the inverted global bit line GBLB. Note that one of the pair of input terminals of the control circuit 51 is referred to as a first input terminal and the other is referred to as a second input terminal in some cases.

As illustrated in FIG. 13, the transistor layers 41_1 to 41_*k* each include the memory cells 42. The memory cells 42 are connected to the local bit line LBL and the local bit line LBL_pre which form the pair. The memory cell 42 connected to the local bit line LBL is a memory cell to/from which data is written or read. The local bit line LBL_pre is a local bit line to be precharged, and the memory cell connected to the local bit line LBL_pre continues to retain data.

The local bit line LBL is connected to the global bit line GBL through the control circuit 35. The local bit line LBL_pre is electrically connected to the inverted global bit line GBLB through the control circuit 35_pre. The global bit line GBL and the inverted global bit line GBLB are electrically connected to the control circuit 51 through the change-over switch SW or the change-over switch SW_B. Note that the signals RE, WE, and MUX that control on/off of the transistors 32, 33, and 34 of the control circuit 35 and the control circuit 35_pre are omitted in the diagram. The signals RE, WE, and MUX perform different controls on the control circuit 35 and the control circuit 35_pre. For example, signals controlling on/off of the transistors 32, 33, and 34 in the control circuit 35 are signals RE1, WE1, and MUX1, and signals controlling on/off of the transistors 32, 33, and 34 in the control circuit 35_pre are signals RE2, WE2, and MUX2.

FIGS. 14 to 17 illustrate schematic views for describing the operation of the circuit diagram illustrated in FIG. 13. Note that in FIGS. 14 to 17, some wirings electrically connected by on/off of the transistors functioning as switches are sometimes indicated by bold lines for easy understanding. Note that description is made under the assumption that the data retained in the memory cell 42 from/to which data is read and written back retains data "1", i.e., an H-level potential (denoted as "H" in the drawing). Furthermore, a transistor in an off state included in the control circuits 35 and 35_pre is marked with a cross.

Note that in FIGS. 14 to 17, description is made under the assumption of a state in which data writing to the memory is completed and a voltage due to a correction operation of the threshold voltages of the local bit line LBL and the local bit line LBL_pre is retained as the initial state. The description is made under the following assumption: in the case where the threshold voltage is corrected with the potential of the wiring SL at a voltage half of the precharge voltage $V_{LBL}$, for example, the voltage $0.5\times V_{LBL}+V_{TH}$ in consideration of the threshold voltage $V_{TH}$ of the transistor 31 is retained, and a voltage corresponding to $V_1$ (e.g., VDD) is retained in the global bit line GBL and the inverted global bit line GBLB. The threshold voltage $V_{TH}$ of the transistor 31 is retained in the local bit line LBL and the local bit line LBL_pre by setting the wiring SL to VSS and discharging electric charge to the wiring SL through the transistor 31. The voltage retained in the local bit line LBL and the local bit line LBL_pre is not limited to the threshold voltage and may be other voltages.

Figure 14:
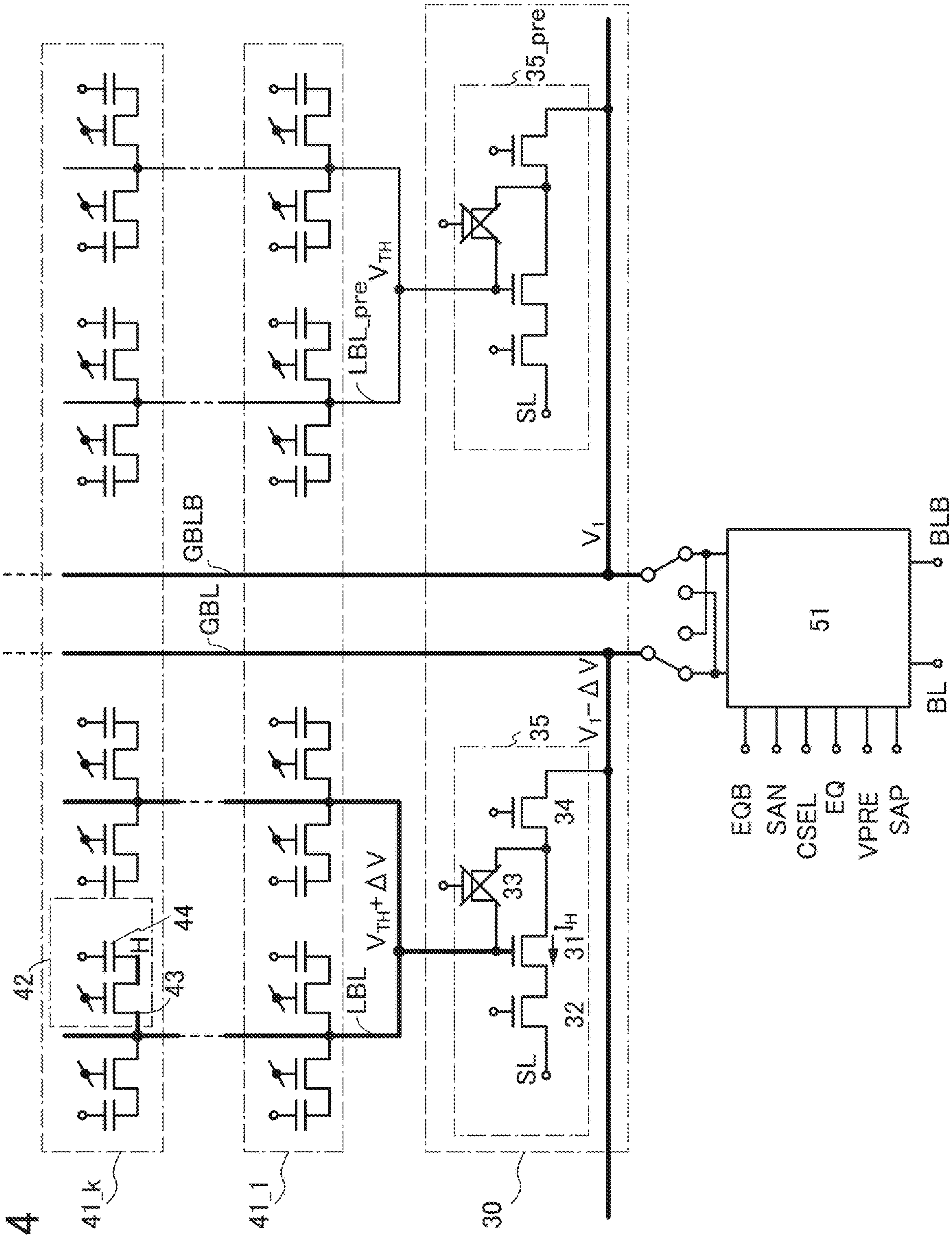
FIG. 14 is a circuit diagram illustrating a structure example of a semiconductor device.

In FIG. 14, the transistor 43 of the memory cell 42 from which data is read is turned on so that electric charge is shared (charge sharing) between the capacitor 44 and the local bit line LBL. The potential of the local bit line LBL is increased from the voltage $0.5\times V_{LBL}+V_{TH}$ to the voltage $0.5\times V_{LBL}+V_{TH}+\Delta V$. Here, the voltage $\Delta V$ is caused by electric charge transfer due to the H-level potential retained in the memory cell 42. Furthermore, the transistors 33 are turned off in the control circuits 35 and 35_pre to set the potential of the wiring SL lower than the potential $V_0$, for example, set to VSS (0 V). In the transistor 31 of the control circuit 35, the voltage of the gate is increased to the voltage $0.5\times V_{LBL}+V_{TH}+\Delta V$ by the charge sharing; thus, the current hi flows such that the global bit line GBL discharges. On the other hand, in the transistor 31 of the control circuit 35_pre, the voltage of the gate remains at the voltage $0.5\times V_{LBL}\ V_{TH}$; thus, current is less likely to flow than that in the control circuit 35. Therefore, the voltage of the global bit line GBL is decreased to a voltage $V_1-\Delta V$, and the voltage of the inverted global bit line GBLB becomes the voltage $V_1$ that is higher than the voltage of the global bit line GBL. Note that in the state in FIG. 14, the first input terminal of the control circuit 51 is connected to one of the global bit line GBL and the inverted global bit line GBLB through the change-over switch SW or SW_B. The second input terminal of the control circuit 51 is connected to the other of the global bit line GBL and the inverted global bit line GBLB through the change-over switch SW or SW_B.

Figure 15:
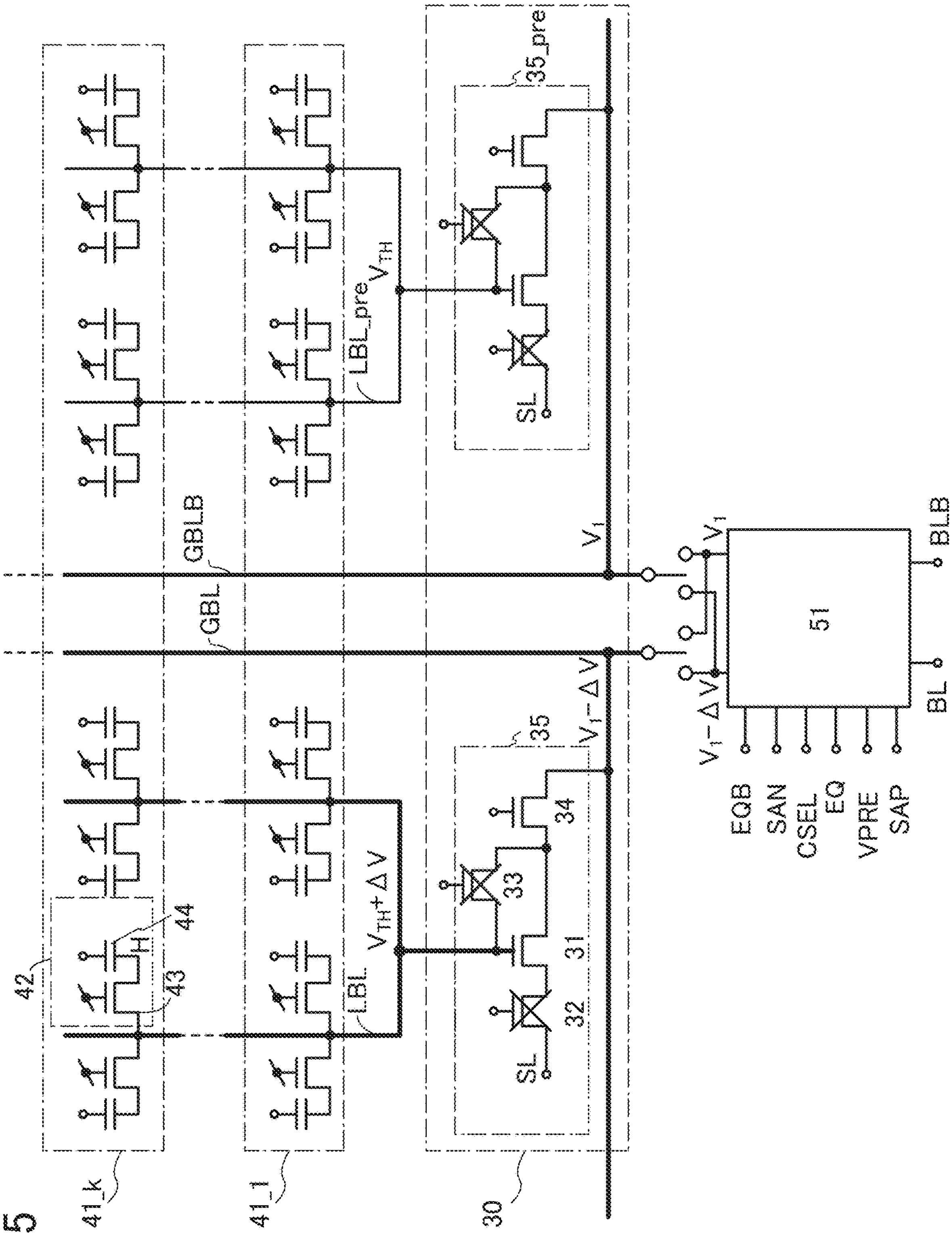
FIG. 15 is a circuit diagram illustrating a structure example of a semiconductor device.

In FIG. 15, the transistors 32 and 33 are turned off. In the state in FIG. 15, the first input terminal and the second input terminal of the control circuit 51 are not connected to any of the global bit line GBL and the inverted global bit line GBLB through the change-over switch SW or SW_B. The global bit line GBL or the inverted global bit line GBLB is in an electrically floating state. In this state, the voltage $V_1-\Delta V$ is retained in the first input terminal of the control circuit 51, and the voltage $V_1$ is retained in the second input terminal. Here, the voltage $-\Delta V$ is caused by a change in electric charge due to current flowing from the global bit line GBL to the wiring SL through the transistor 31.

Figure 16:
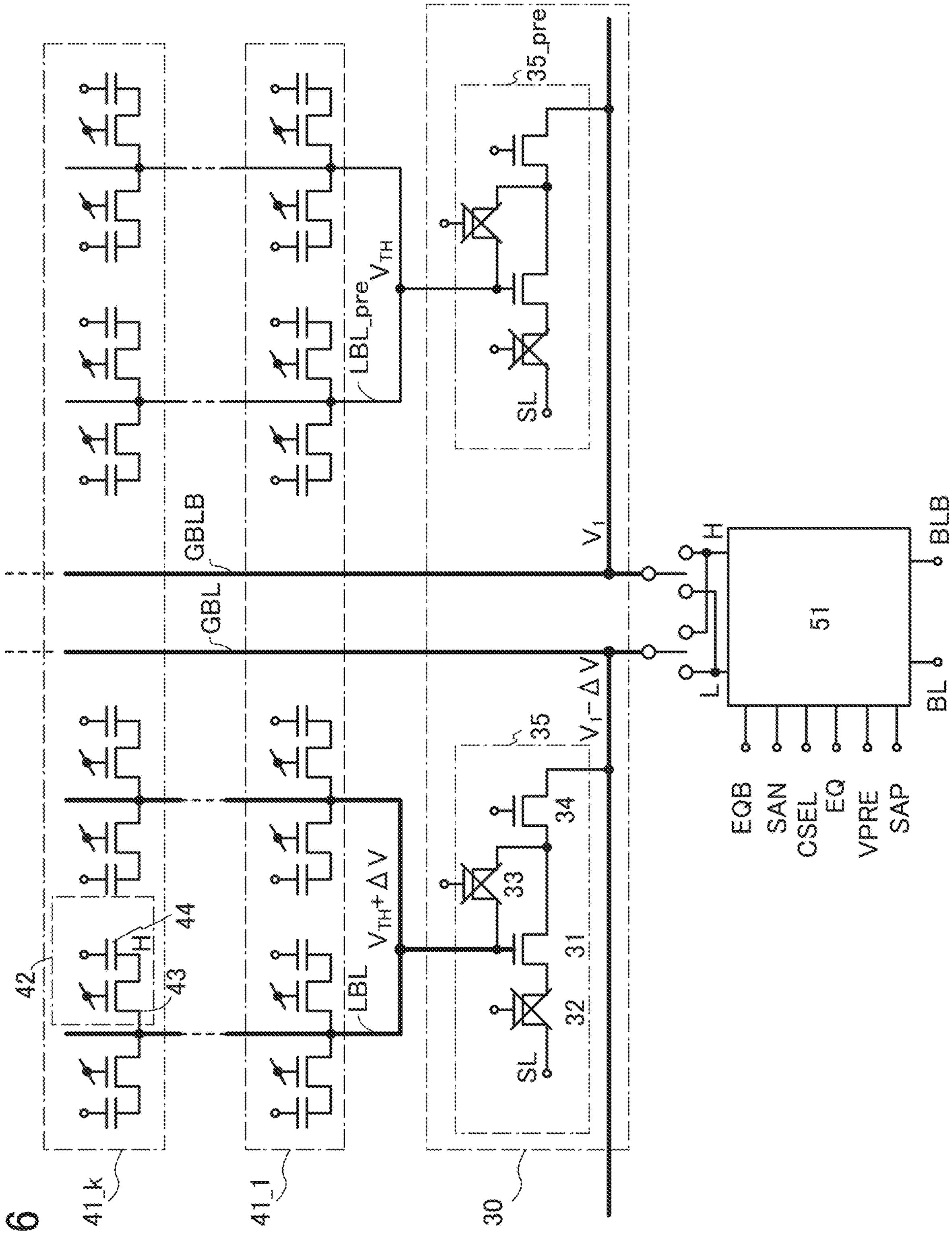
FIG. 16 is a circuit diagram illustrating a structure example of a semiconductor device.

In FIG. 16, as the state in FIG. 15, the first input terminal and the second input terminal of the control circuit 51 are not connected to any of the global bit line GBL and the inverted global bit line GBLB through the change-over switch SW or SW_B. The global bit line GBL or the inverted global bit line GBLB is in an electrically floating state. In this state, the sense amplifier included in the control circuit 51 is activated. The first input terminal is determined to be at L level and the second input terminal is determined to be at H level. As illustrated in FIG. 16, the sense amplifier is activated with the global bit line GBL or the inverted global bit line GBLB in an electrically floating state; thus, power consumption for charging and discharging loads in the global bit line GBL and the inverted global bit line GBLB can be reduced and the time for determining data can be shortened.

Figure 17:
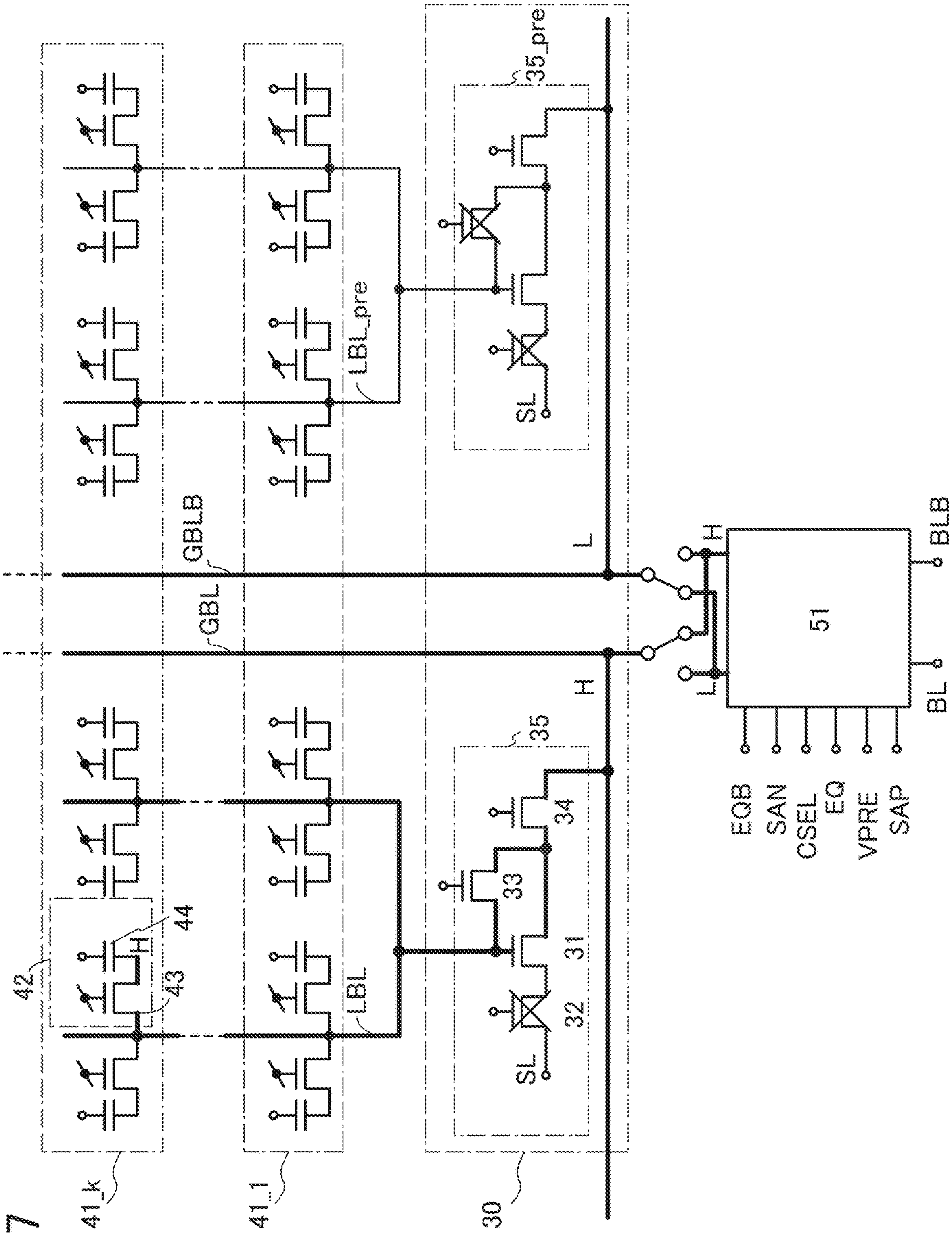
FIG. 17 is a circuit diagram illustrating a structure example of a semiconductor device.

In FIG. 17, the first input terminal of the control circuit 51 is connected to the other of the global bit line GBL and the inverted global bit line GBLB through the change-over switch SW or SW_B. The second input terminal of the control circuit 51 is connected to the one of the global bit line GBL and the inverted global bit line GBLB through the change-over switch SW or SW_B. That is, connection is made in a different state from the state in FIG. 14. Then, the global bit line GBL is determined to be at H level and the inverted global bit line GBLB is determined to be at L level. Then, the transistors 33 and 34 and the transistor 43 included in the memory cell 42 are turned on, and the determined voltages of the global bit line GBL and the inverted global bit line GBLB are written back to the memory cell 42.

With the above structure, the voltage corresponding to a logic of the data read out by the charge sharing can be written back to the memory cell 42 again without inversion of the logic.

FIGS. 18 to 21 illustrate a structure example different from the description in FIGS. 14 to 17.

Figure 18:
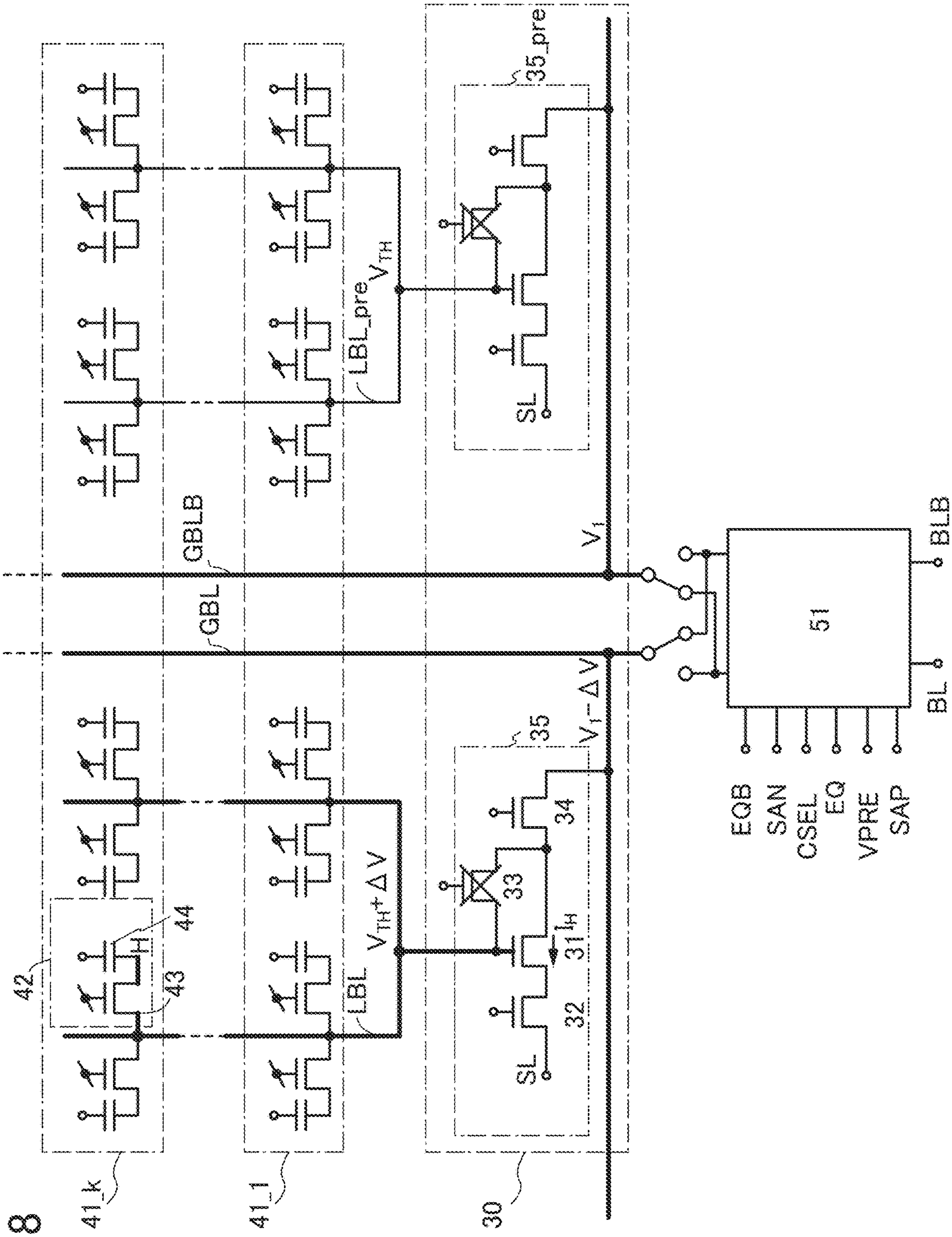
FIG. 18 is a circuit diagram illustrating a structure example of a semiconductor device.

In FIG. 18, the transistor 43 of the memory cell 42 from which data is read is turned on so that electric charge is shared (charge sharing) between the capacitor 44 and the local bit line LBL. The description in FIG. 18 is similar to that in FIG. 14. Note that in the state in FIG. 18, the first input terminal of the control circuit 51 is connected to the one of the global bit line GBL and the inverted global bit line GBLB through the change-over switch SW or SW_B. The second input terminal of the control circuit 51 is connected to the other of the global bit line GBL and the inverted global bit line GBLB through the change-over switch SW or SW_B.

Figure 19:
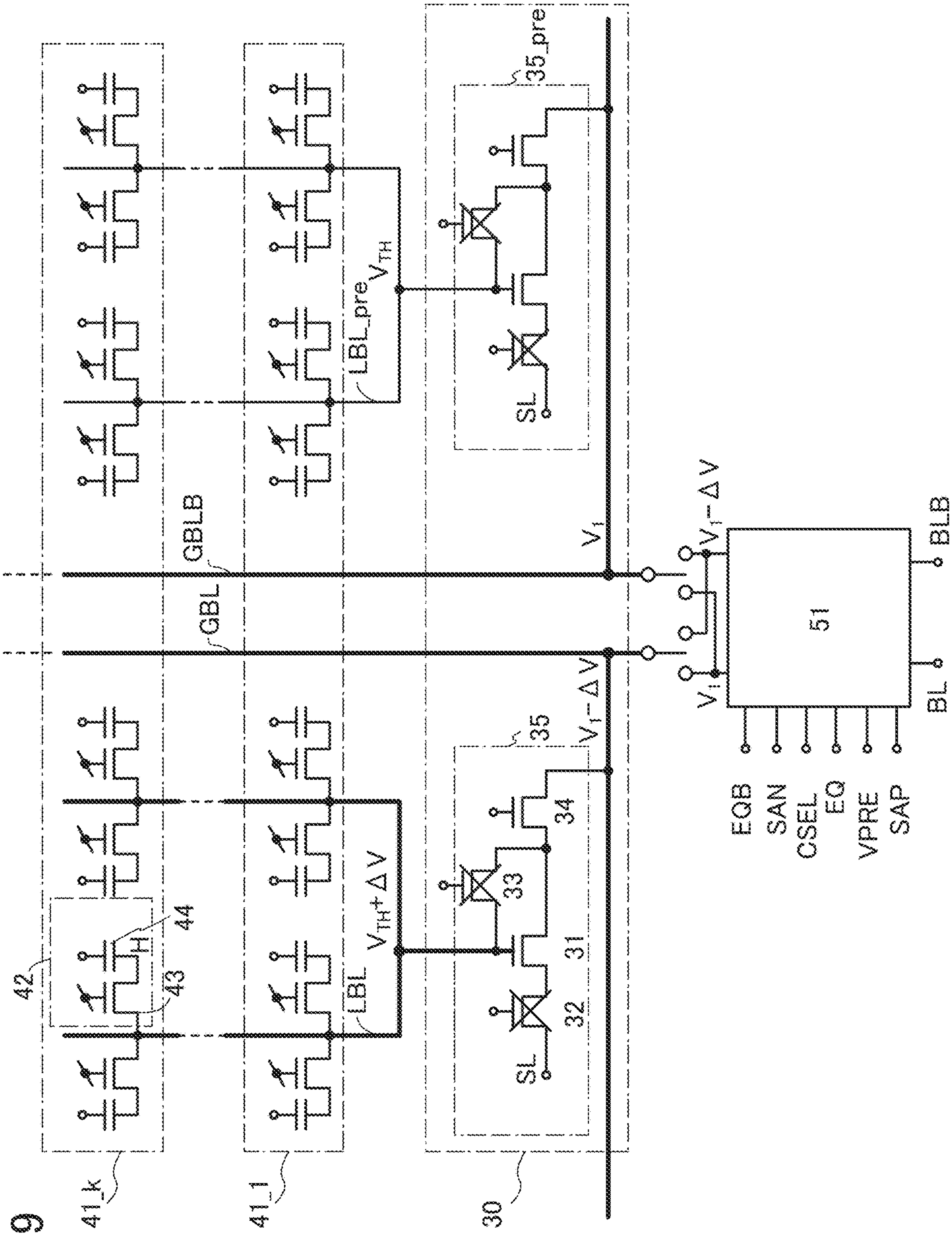
FIG. 19 is a circuit diagram illustrating a structure example of a semiconductor device.

In FIG. 19, the transistors 32 and 33 are turned off. In the state in FIG. 19, the first input terminal and the second input terminal of the control circuit 51 are not connected to the global bit line GBL and the inverted global bit line GBLB through the change-over switch SW or SW_B. The global bit line GBL or the inverted global bit line GBLB is in an electrically floating state. In this state, the voltage $V_1$ is retained in the first input terminal of the control circuit 51, and the voltage $V_1-\Delta V$ is retained in the second input terminal.

Figure 20:
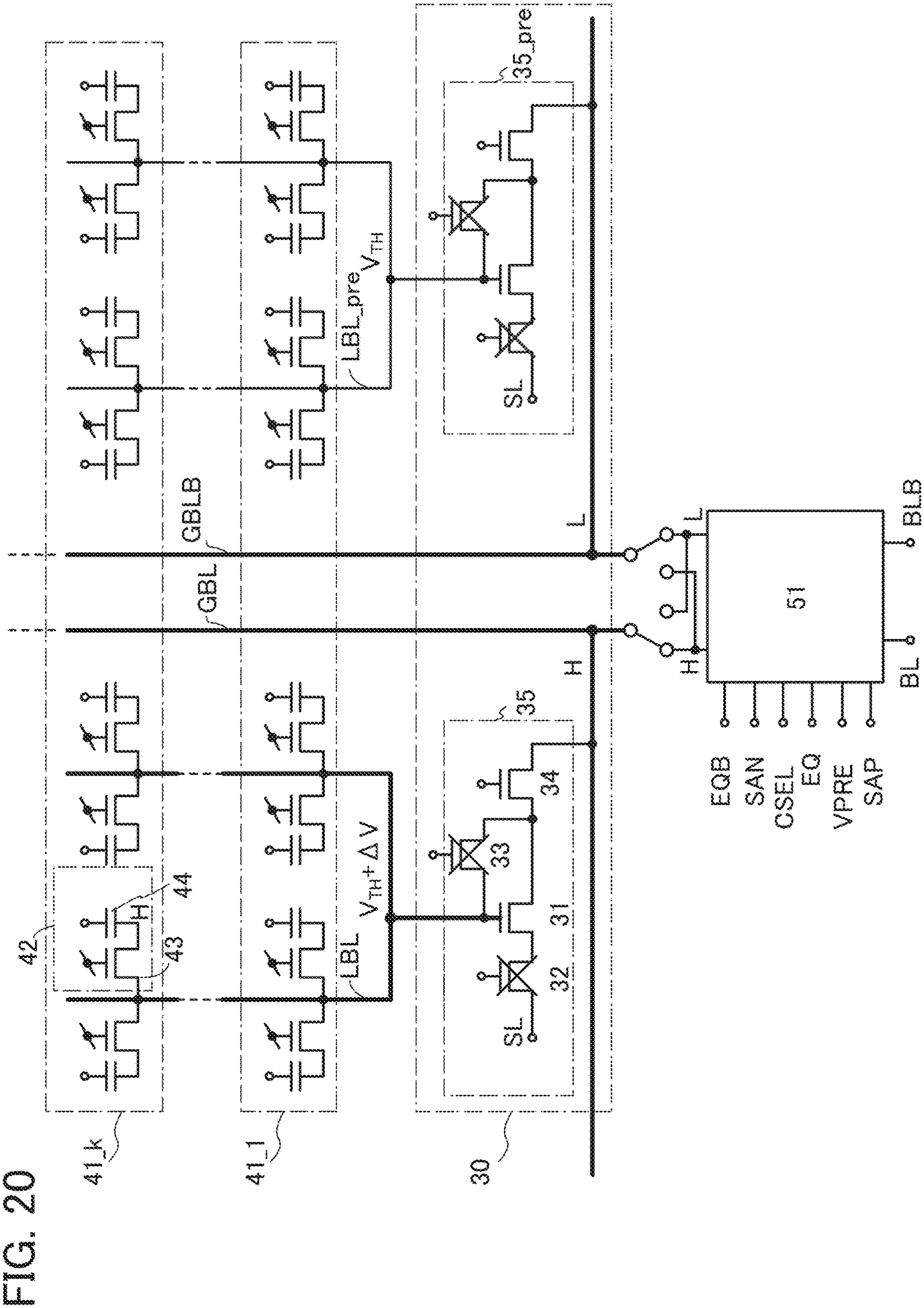
FIG. 20 is a circuit diagram illustrating a structure example of a semiconductor device.

In FIG. 20, the first input terminal of the control circuit 51 is connected to the other of the global bit line GBL and the inverted global bit line GBLB through the change-over switch SW or SW_B. The second input terminal of the control circuit 51 is connected to the one of the global bit line GBL and the inverted global bit line GBLB through the change-over switch SW or SW_B. That is, connection is made in a different state from the state in FIG. 18. In this state, the sense amplifier included in the control circuit 51 is activated. The global bit line GBL is determined to be at H level and the inverted global bit line GBLB is determined to be at L level.

Figure 21:
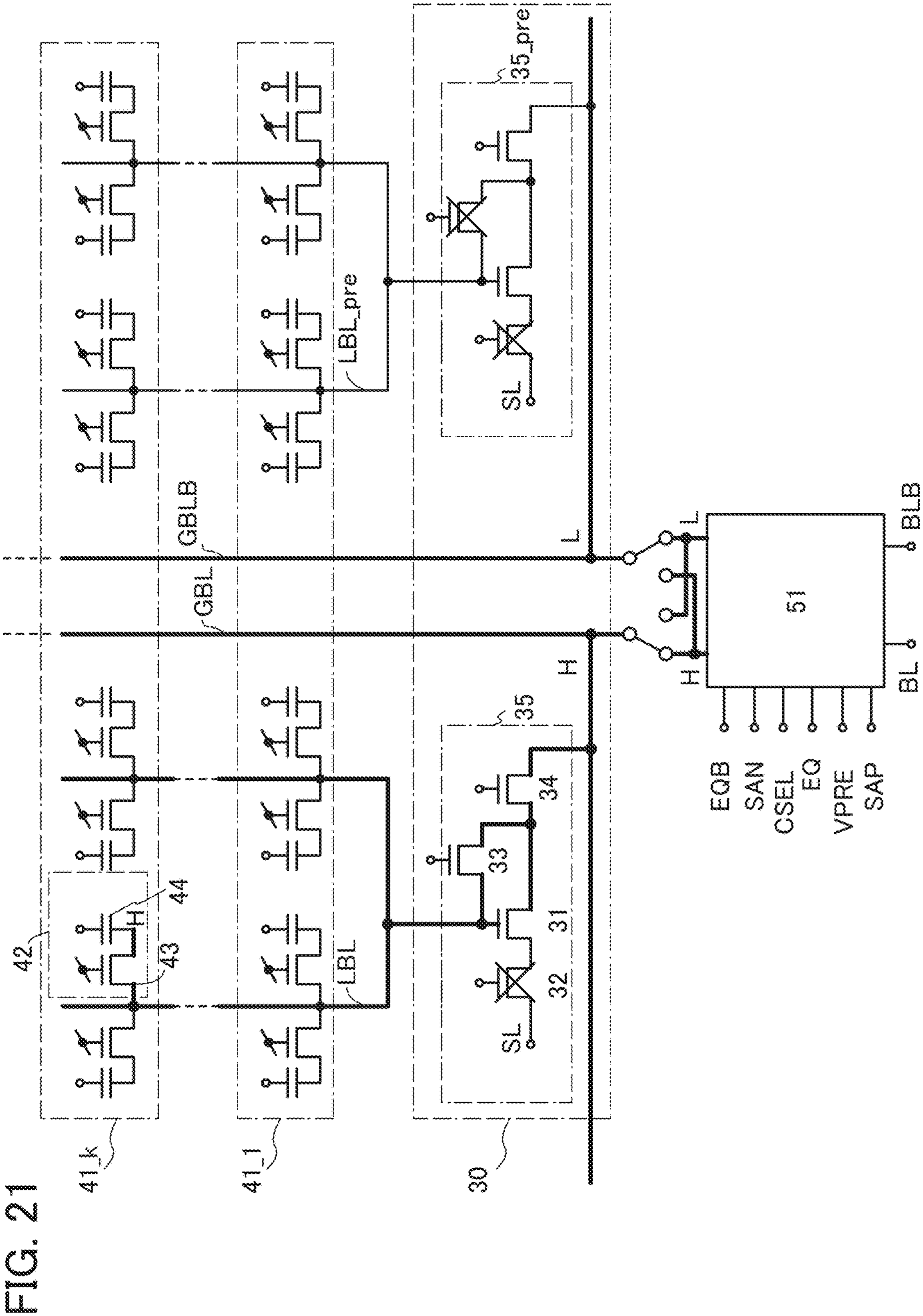
FIG. 21 is a circuit diagram illustrating a structure example of a semiconductor device.

In FIG. 21, the transistors 33 and 34 and the transistor 43 included in the memory cell 42 are turned on, and the determined voltages of the global bit line GBL and the inverted global bit line GBLB are written back to the memory cell 42.

With the above structure, the voltage corresponding to a logic of the data read out by the charge sharing can be written back to the memory cell 42 again without inversion of the logic. Furthermore, in the structure illustrated in FIG. 18 to FIG. 21, when output is performed from the sense amplifier to the outside of the memory, output is performed through the bit line BL and the inverted bit line BLB; output can be performed without inversion of the logic of the global bit line GBL and the inverted global bit line GBLB and the logic of the bit line BL and the inverted bit line BLB.

Figure 22:
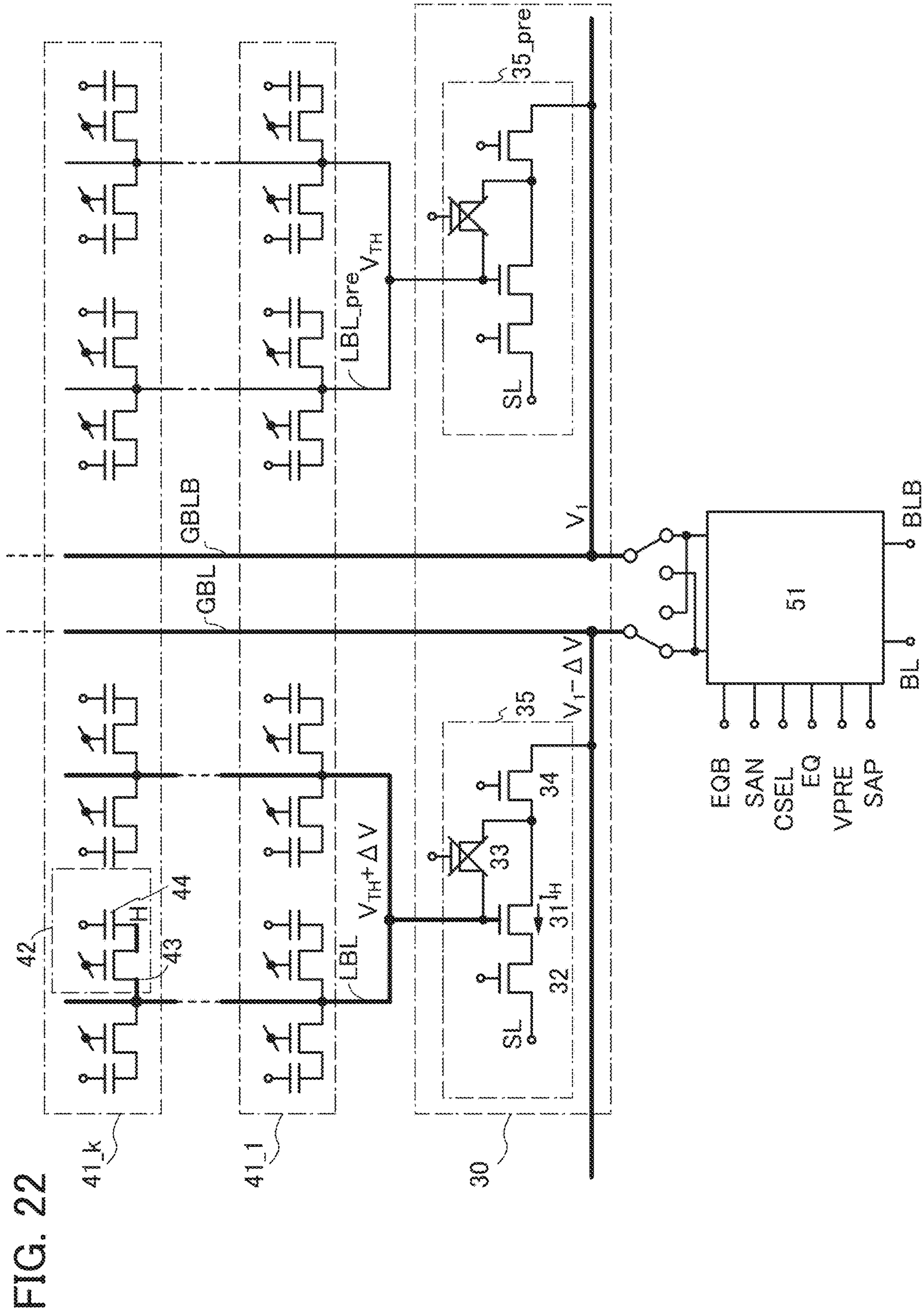
FIG. 22 is a circuit diagram illustrating a structure example of a semiconductor device.
Figure 23:
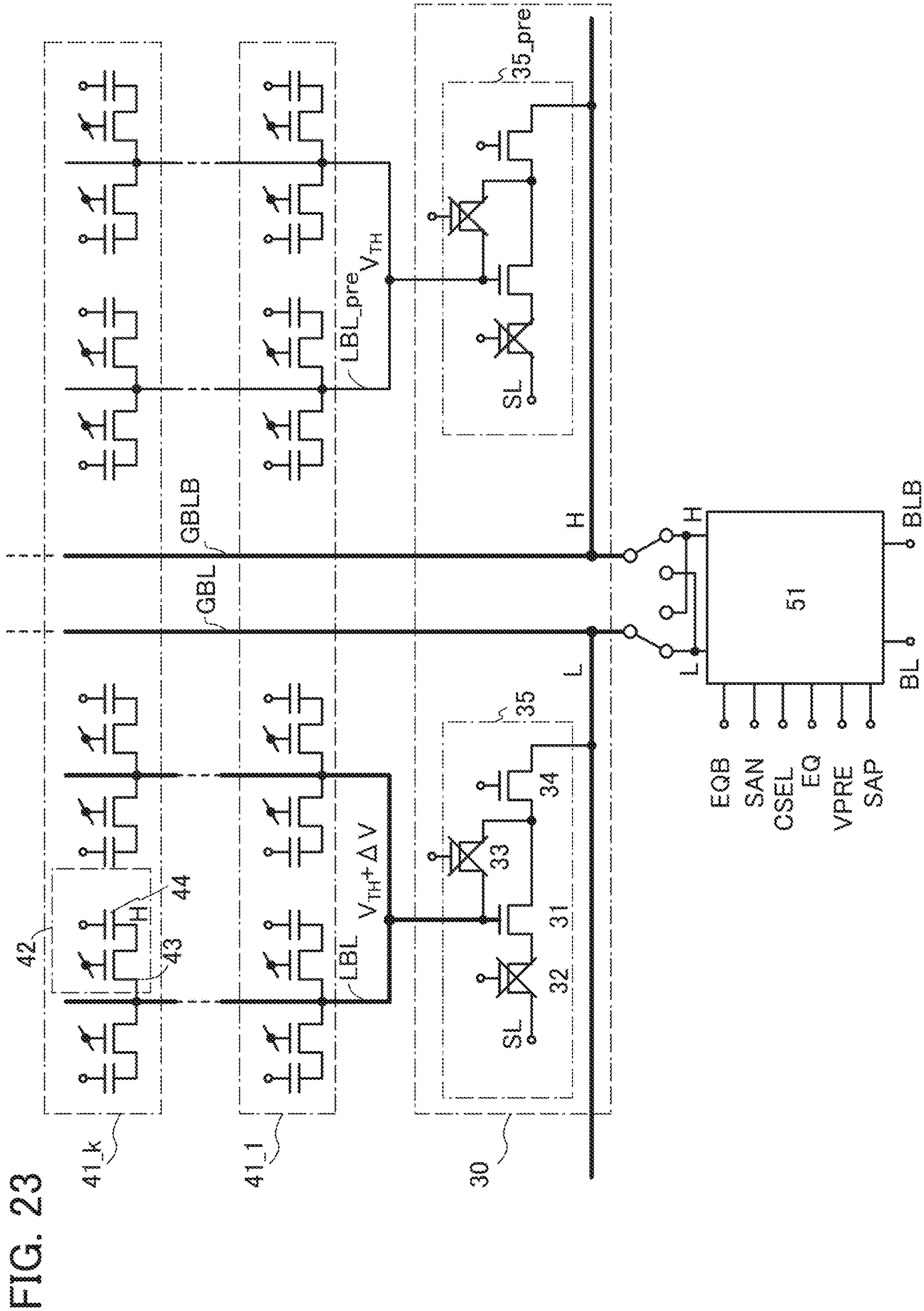
FIG. 23 is a circuit diagram illustrating a structure example of a semiconductor device.
Figure 24:
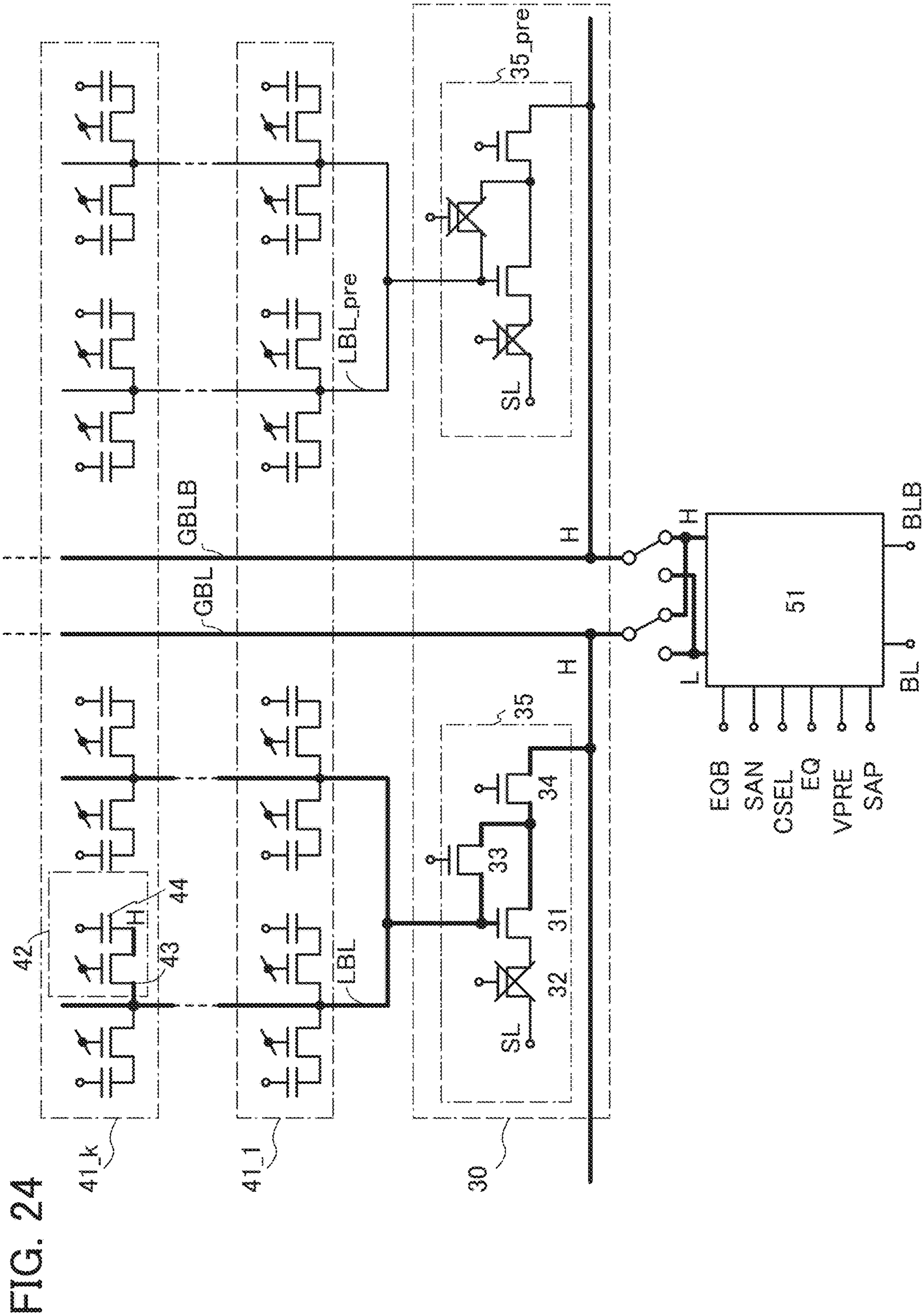
FIG. 24 is a circuit diagram illustrating a structure example of a semiconductor device.

FIGS. 22 to 24 illustrate a structure example different from the descriptions in FIGS. 14 to 17 and FIGS. 18 to 21.

In FIG. 22, the transistor 43 of the memory cell 42 from which data is read is turned on so that electric charge is shared (charge sharing) between the capacitor 44 and the local bit line LBL. The description in FIG. 22 is similar to that in FIG. 14 or FIG. 18. Note that in the state in FIG. 22, the first input terminal of the control circuit 51 is connected to the one of the global bit line GBL and the inverted global bit line GBLB through the change-over switch SW or SW_B. The second input terminal of the control circuit 51 is connected to the other of the global bit line GBL and the inverted global bit line GBLB through the change-over switch SW or SW_B.

In FIG. 23, the transistors 32 and 33 are turned off, and the sense amplifier included in the control circuit 51 is activated. The global bit line GBL is determined to be at L level and the inverted global bit line GBLB is determined to be at H level.

In FIG. 24, the change-over switches SW and SW_B are switched to the first input terminal side of the control circuit 51 to cause a short circuit between the global bit line GBL and the inverted global bit line GBLB. In other words, only a switch for a bit line with which data is written back is switched. The transistors 33 and 34 and the transistor 43 included in the memory cell 42 are turned on, the determined voltages of the global bit line GBL and the inverted global bit line GBLB become H, and data H is written back to the memory cell 42.

With the above structure, the voltage corresponding to a logic of the data read out due to the charge sharing can be written back to the memory cell 42 again without inversion of the logic. Furthermore, in this driving method, since only the global bit line GBL for writing back is charged and discharged, power consumption is half of that in the case where both of change-over switches SW and SW_B are switched; thus, driving with a low power consumption is achieved. Moreover, in the structure example described above, electrons can be extracted from the global bit line GBL to the wiring SL, so that a voltage Vgs between the gate and the source of the transistor 31 can always be kept constant. Therefore, the reading operation can be performed at high speed.

Structure Example of Semiconductor Device 3

Figure 25:
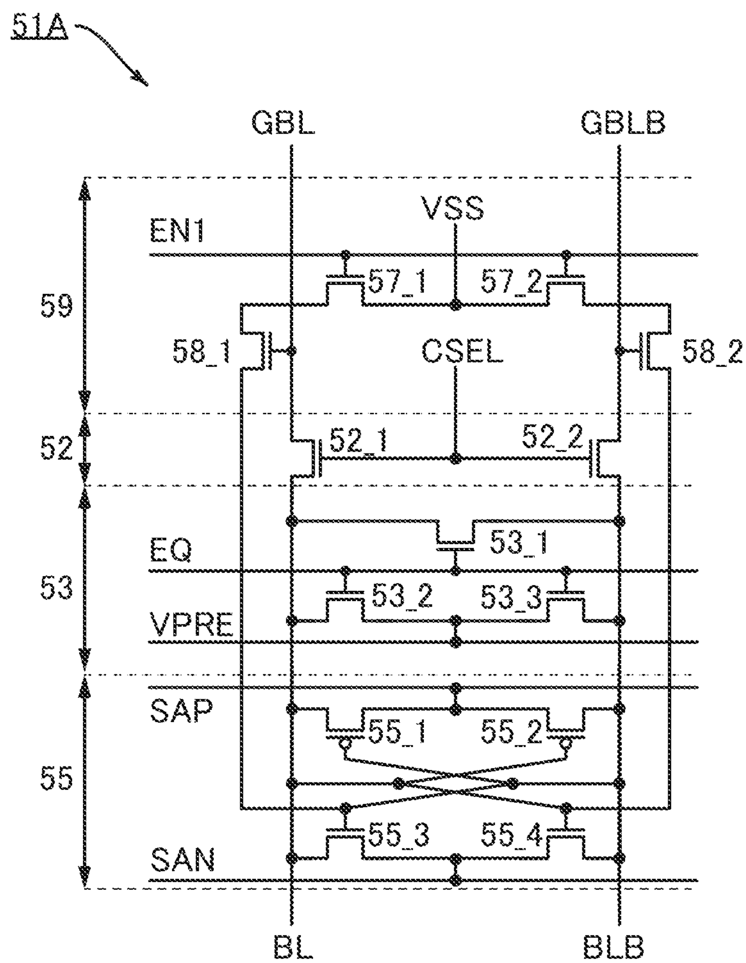
FIG. 25 is a circuit diagram illustrating a structure example of a semiconductor device.

FIG. 25 is a circuit diagram for describing an example different from Structure example 1 and Structure example 2 above. FIG. 25 illustrates a circuit structure example of a control circuit 51A corresponding to the first control circuit formed using Si transistors in the silicon substrate 50. The control circuit 51A illustrates the switch circuit 52; the precharge circuit 53; the sense amplifier 55; a potential setting circuit 59; and the global bit line GBL, the inverted global bit line GBLB, the bit line BL, and the inverted bit line BLB, which are connected to the control circuit 51A. Note that in this specification and the like, some of terminals or wirings connected to the global bit line GBL or the inverted global bit line GBLB in the control circuit 51A are sometimes referred to as an input terminal and an inverted input terminal of the control circuit 51. Furthermore, the bit line BL and the inverted bit line BLB that are wirings connected to the sense amplifier 55 are sometimes referred to as an output terminal and an inverted output terminal of the control circuit 51A.

The switch circuit 52 includes, for example, the n-channel transistors 52_1 and 52_2 as illustrated in FIG. 25. The transistors 52_1 and 52_2 switch a conducting state between the wiring pair of the global bit line GBL and the inverted global bit line GBLB and the wiring pair of the bit line BL and the inverted bit line BLB in accordance with a signal of the wiring CSEL. The switch circuit 52 may have a structure in which an analog switch combined with a p-channel transistor is used.

The precharge circuit 53 is formed using the n-channel transistors 53_1 to 53_3 as illustrated in FIG. 25. The precharge circuit 53 is a circuit for equilibration between the bit line BL and the inverted bit line BLB and precharging in accordance with a signal of the wiring EQ. The potential VPRE corresponds to the potential VDD/2 between the bit line BL and the inverted bit line BLB.

The sense amplifier 55 is formed using the p-channel transistors 55_1 and 55_2 and the n-channel transistors 55_3 and 55_4, which are connected to the wiring SAP or the wiring SAN, as illustrated in FIG. 25. The wiring SAP or the wiring SAN is a wiring having a function of supplying VDD or VSS. The transistors 55_1 to 55_4 are transistors that form an inverter loop. The sense amplifier 55 has a function of a circuit performing precharging by supplying a precharge voltage to the wiring SAP or the wiring SAN.

As illustrated in FIG. 25, the potential setting circuit 59 includes n-channel transistors 57_1 and 57_2 connected to a wiring that supplies the voltage VSS, and n-channel transistors 58_1 and 58_2 connected to the sense amplifier 55. On/off of the transistors 57_1 and 57_2 is controlled in accordance with a signal EN1. Furthermore, current flowing through the transistors 58_1 and 58_2 is controlled in accordance with the potentials of the global bit line GBL and the inverted global bit line GBLB that are connected to the gates. Data of the bit line BL and the inverted bit line BLB at the time when the sense amplifier is operated is determined in accordance with the current flowing through the transistors 58_1 and 58_2.

Figure 26:
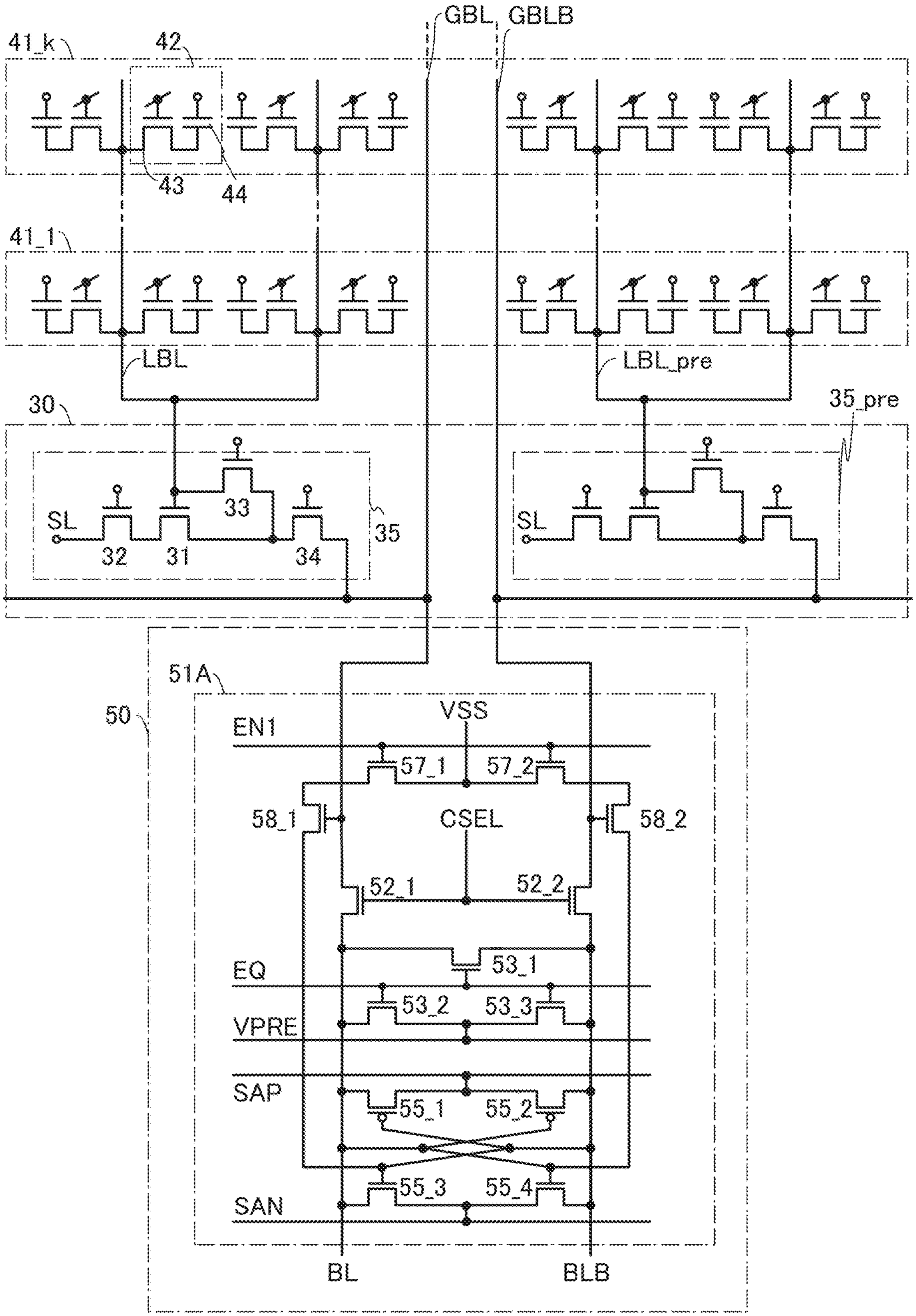
FIG. 26 is a circuit diagram illustrating a structure example of a semiconductor device.

FIG. 26 is a circuit diagram for describing an operation example of the semiconductor device 10 in FIG. 1. FIG. 26 illustrates a structure in which the structure in FIG. 2 is applied and the control circuit 51A illustrated in FIG. 25 is applied to a control circuit provided for the silicon substrate 50.

As illustrated in FIG. 26, the transistor layers 41_1 to 41_*k* each include the memory cells 42. The memory cells 42 are connected to the local bit line LBL and the local bit line LBL_pre which form the pair. The memory cell 42 connected to the local bit line LBL is a memory cell to/from which data is written or read. The local bit line LBL_pre is a local bit line to be precharged, and the memory cell connected to the local bit line LBL_pre continues to retain data.

The local bit line LBL is connected to the global bit line GBL through the control circuit 35. The local bit line LBL_pre is electrically connected to the inverted global bit line GBLB through the control circuit 35_pre. The global bit line GBL and the inverted global bit line GBLB are electrically connected to the control circuit 51A provided for the silicon substrate 50. Note that the signals RE, WE, and MUX that are supplied to the control circuits 35 and 35_pre and control on/off of the transistors are not illustrated, and the signals RE, WE, and MUX are different between the control circuit 35 and the control circuit 35_pre.

FIG. 27 to FIG. 33 illustrate schematic views for describing the operation of the circuit diagram illustrated in FIG. 26. Note that in FIG. 27 to FIG. 33, some wirings electrically connected by on/off of the transistors functioning as switches are sometimes indicated by bold lines for easy understanding. Note that description is made under the assumption that the data retained in the memory cell 42 from/to which data is read and written back retains data “1”, i.e., an H-level potential (denoted as “H” in the drawing). Furthermore, a transistor in an off state included in the control circuits 35 and 35_pre is marked with a cross.

Figure 27:
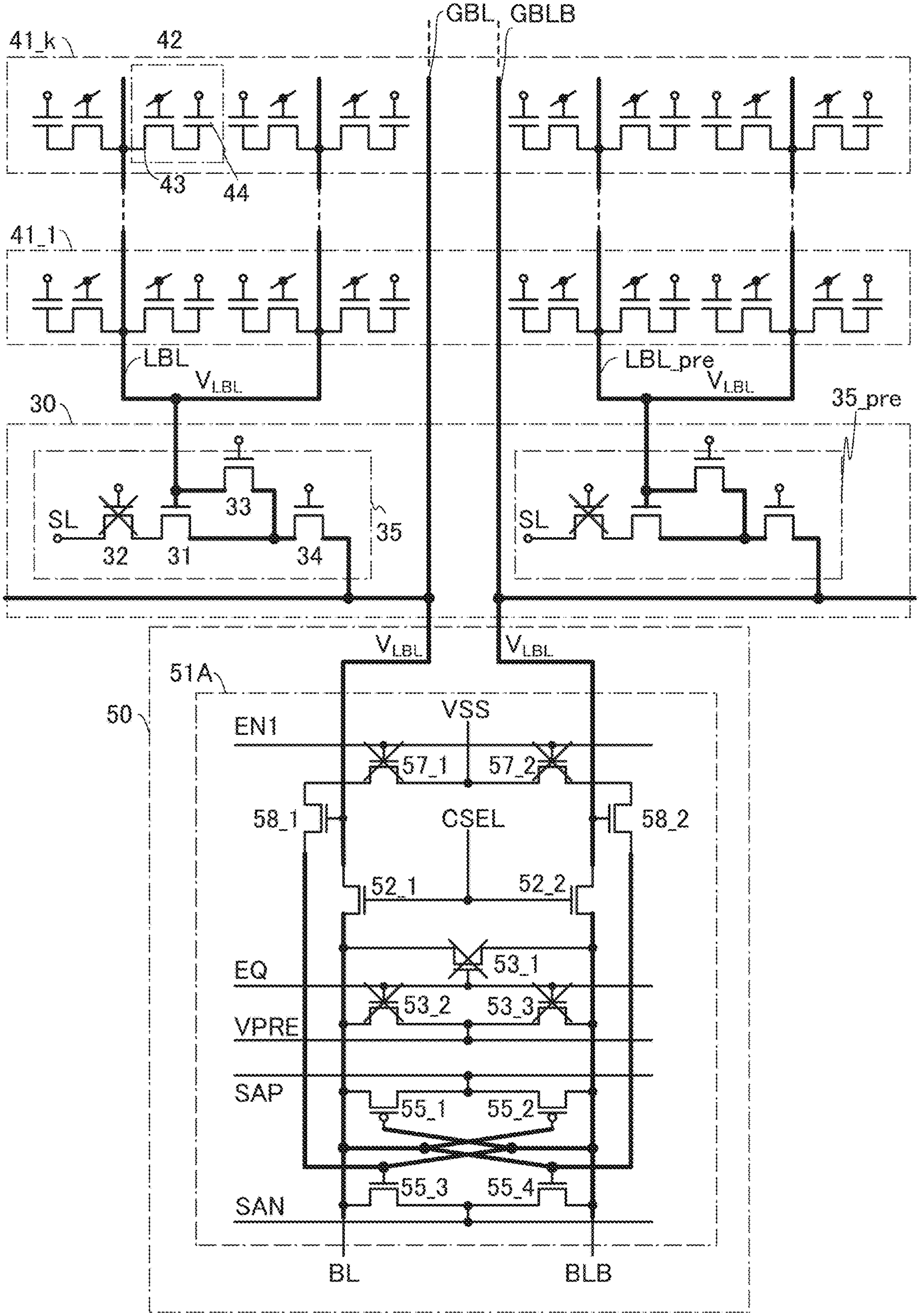
FIG. 27 is a circuit diagram illustrating a structure example of a semiconductor device.

FIG. 27 is a schematic view illustrating a period in which the local bit line LBL and the local bit line LBL_pre are precharged. In the period for precharging, the transistors 33 and 34 are turned on, and the precharge voltage $V_{LBL}$ supplied to the global bit line GBL and the inverted global bit line GBLB is transmitted to the local bit line LBL and the local bit line LBL_pre to perform precharging.

Figure 28:
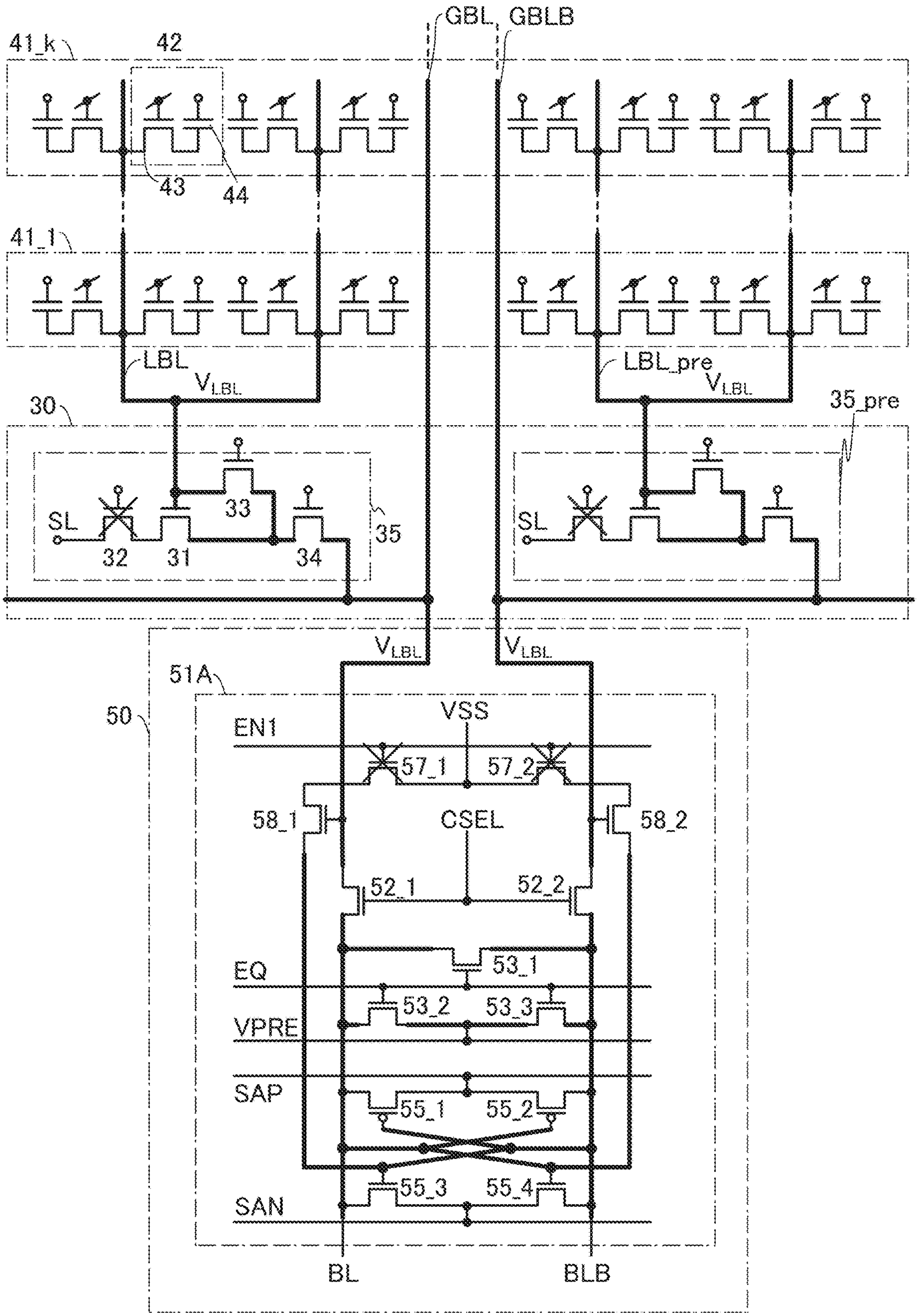
FIG. 28 is a circuit diagram illustrating a structure example of a semiconductor device.

FIG. 28 is a schematic view illustrating a period in which the local bit line LBL and the local bit line LBL_pre are equilibrated (equalizing). In the period for equilibrating, the transistors 53_1 to 53_3 are turned on to make the transistors between the global bit line GBL and the inverted global bit line GBLB in a conducting state.

Figure 29:
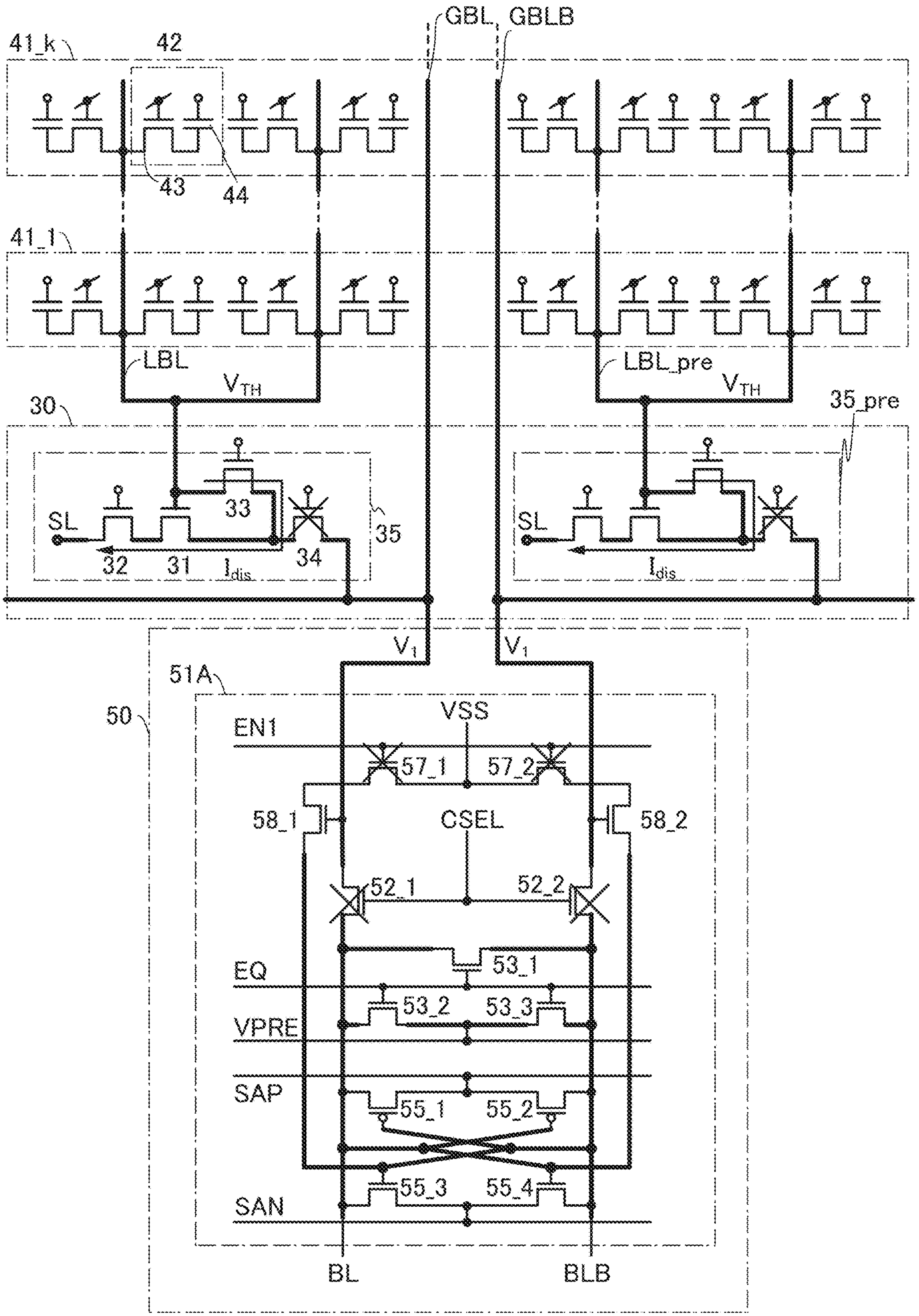
FIG. 29 is a circuit diagram illustrating a structure example of a semiconductor device.

FIG. 29 is a schematic view illustrating a period for retaining a voltage on which the threshold voltage $V_{TH}$ of the transistor 31 is reflected in the gate of the transistor 31 and performing correction equivalent to the threshold voltage $V_{TH}$ in the read data. In this period, the transistors 34 are turned off in both of the control circuits 35 and 35_pre so that the precharge voltage $V_{LBL}$ supplied to the global bit line GBL and the inverted global bit line GBLB is discharged to the wiring SL. For example, in the case where the potential of the wiring SL is half of the precharge voltage $V_{LBL}$, the current $I_{dis}$ flowing by the discharging is stopped when the potential of the gate of the transistor 31 reaches the threshold voltage $0.5\times V_{LBL}+V_{TH}$. Furthermore, in this period, the global bit line GBL and the inverted global bit line GBLB are precharged at the voltage $V_1$. The voltage $V_1$ is, for example, the potential VPRE. Moreover, in this period, the global bit line GBL and the inverted global bit line GBLB are precharged, and then the transistors 52_1 and 52_2 are turned off to electrically separate the global bit line GBL and the inverted global bit line GBLB (the input terminal side) and the bit line BL and the inverted bit line BLB (the output terminal side). The global bit line GBL and the inverted global bit line GBLB are in an electrically floating state.

Figure 30:
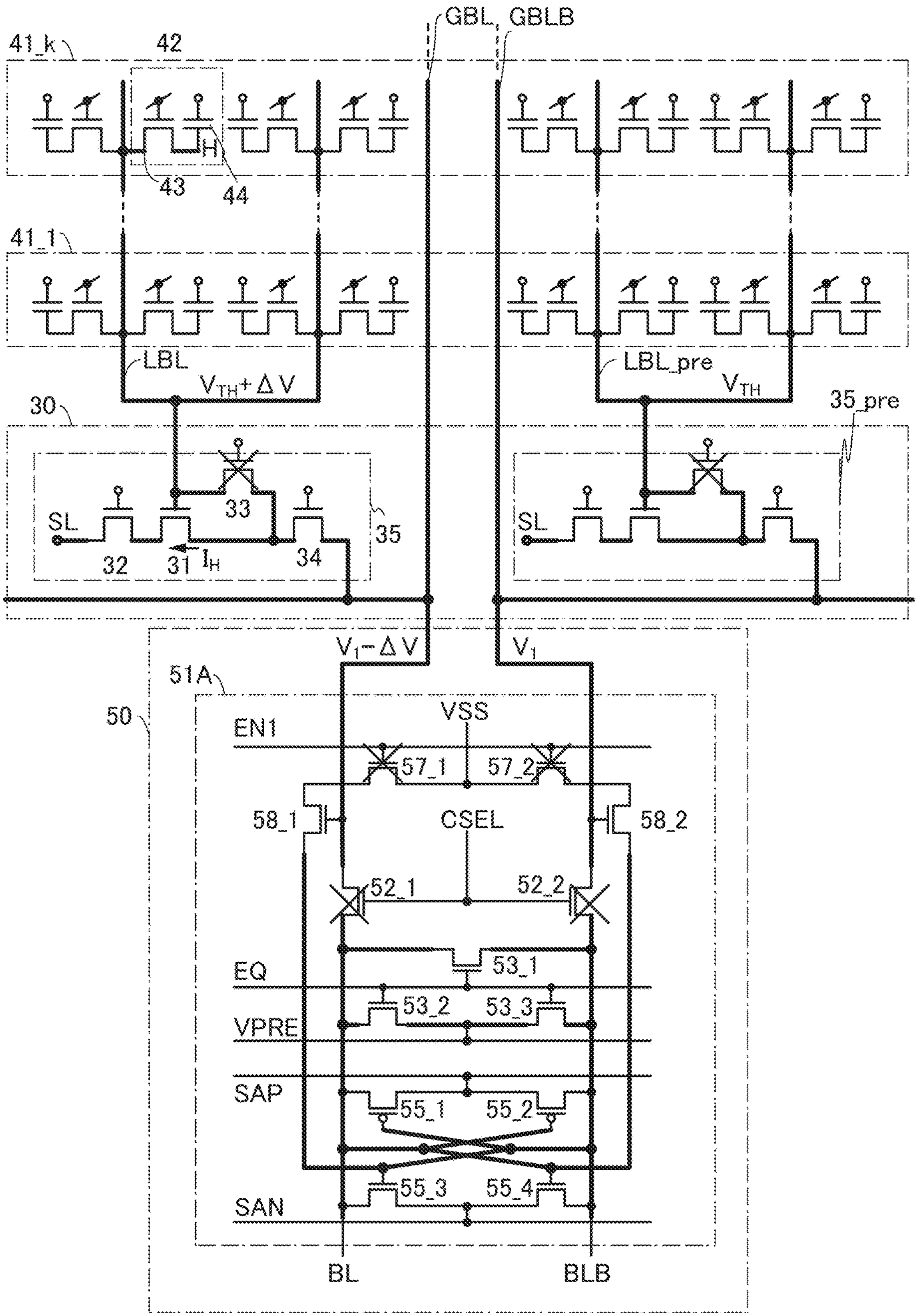
FIG. 30 is a circuit diagram illustrating a structure example of a semiconductor device.

In FIG. 30, the transistor 43 of the memory cell 42 from which data is read is turned on so that electric charge is shared (charge sharing) between the capacitor 44 and the local bit line LBL. The potential of the local bit line LBL is increased from the voltage $0.5\times V_{LBL}+V_{TH}$ to the voltage $0.5\times V_{LBL}+V_{TH}+\Delta V$. The voltage $\Delta V$ is caused by electric charge transfer due to the H-level potential retained in the memory cell 42. Furthermore, the transistors 33 are turned off in the control circuits 35 and 35_pre to set the potential of the wiring SL lower than the precharge voltage $V_{LBL}$. In the transistor 31 of the control circuit 35, the voltage of the gate is increased to the voltage $0.5\times V_{LBL}+V_{TH}+\Delta V$ by the charge sharing; thus, the current $I_H$ flows. On the other hand, in the transistor 31 of the control circuit 35_pre, the voltage of the gate remains at the voltage $0.5\times V_{LBL}+V_{TH}$; thus, current is less likely to flow than that in the control circuit 35. Therefore, the voltage of the global bit line GBL is decreased to the voltage $V_1-\Delta V$, and the voltage of the inverted global bit line GBLB becomes the voltage $V_1$.

Figure 31:
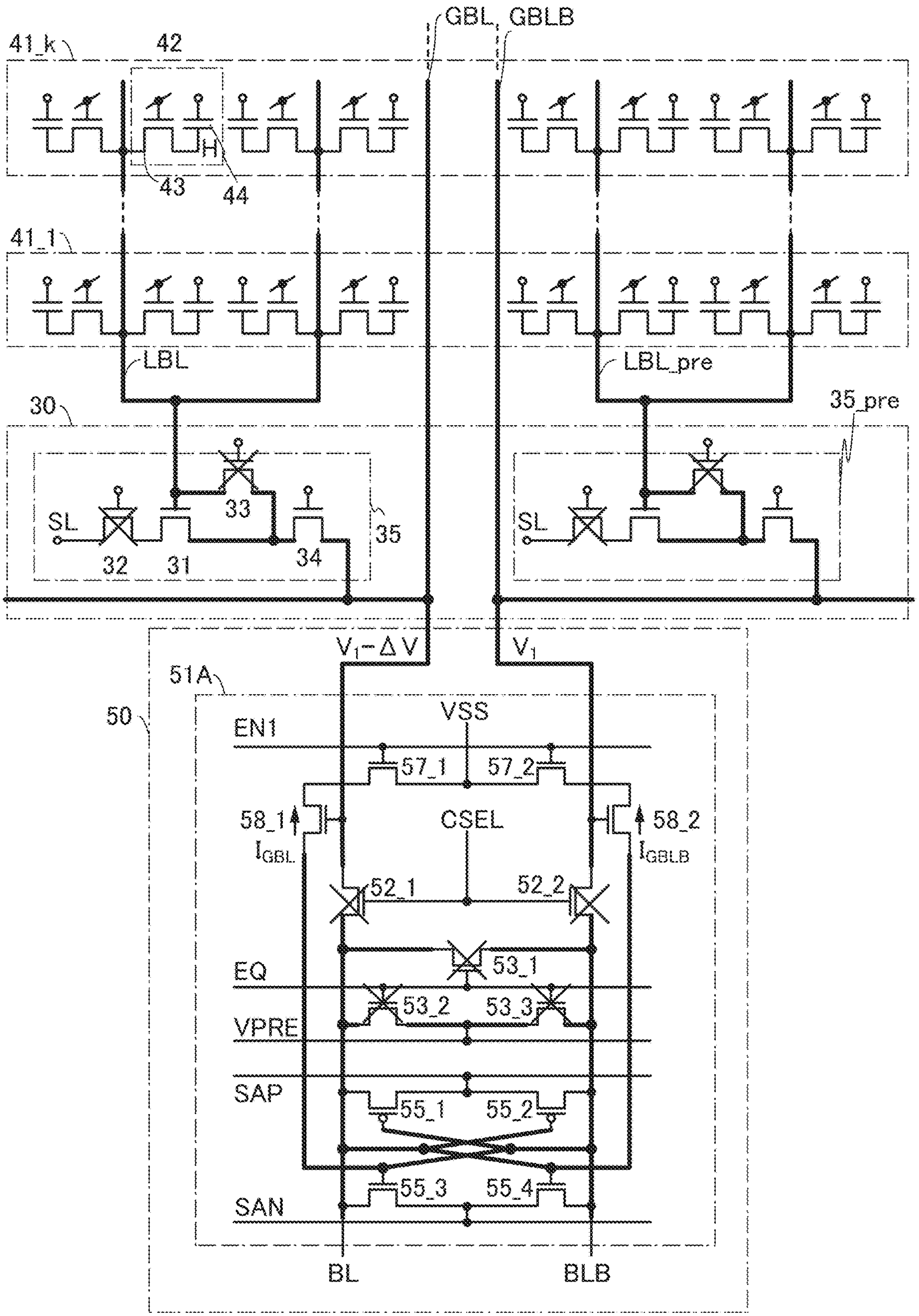
FIG. 31 is a circuit diagram illustrating a structure example of a semiconductor device.

In FIG. 31, the transistors 57_1 and 57_2 are turned on by control of the signal EN1. In the transistor 58_1 and the transistor 582, difference occurs between currents $I_{GBL}$ and $I_{GBLB}$ flowing in accordance with the voltages of the global bit line GBL and the inverted global bit line GBLB. In the bit line BL and the inverted bit line BLB, a potential difference occurs in accordance with the difference between the currents $I_{GBL}$ and $I_{GBLB}$.

Figure 32:
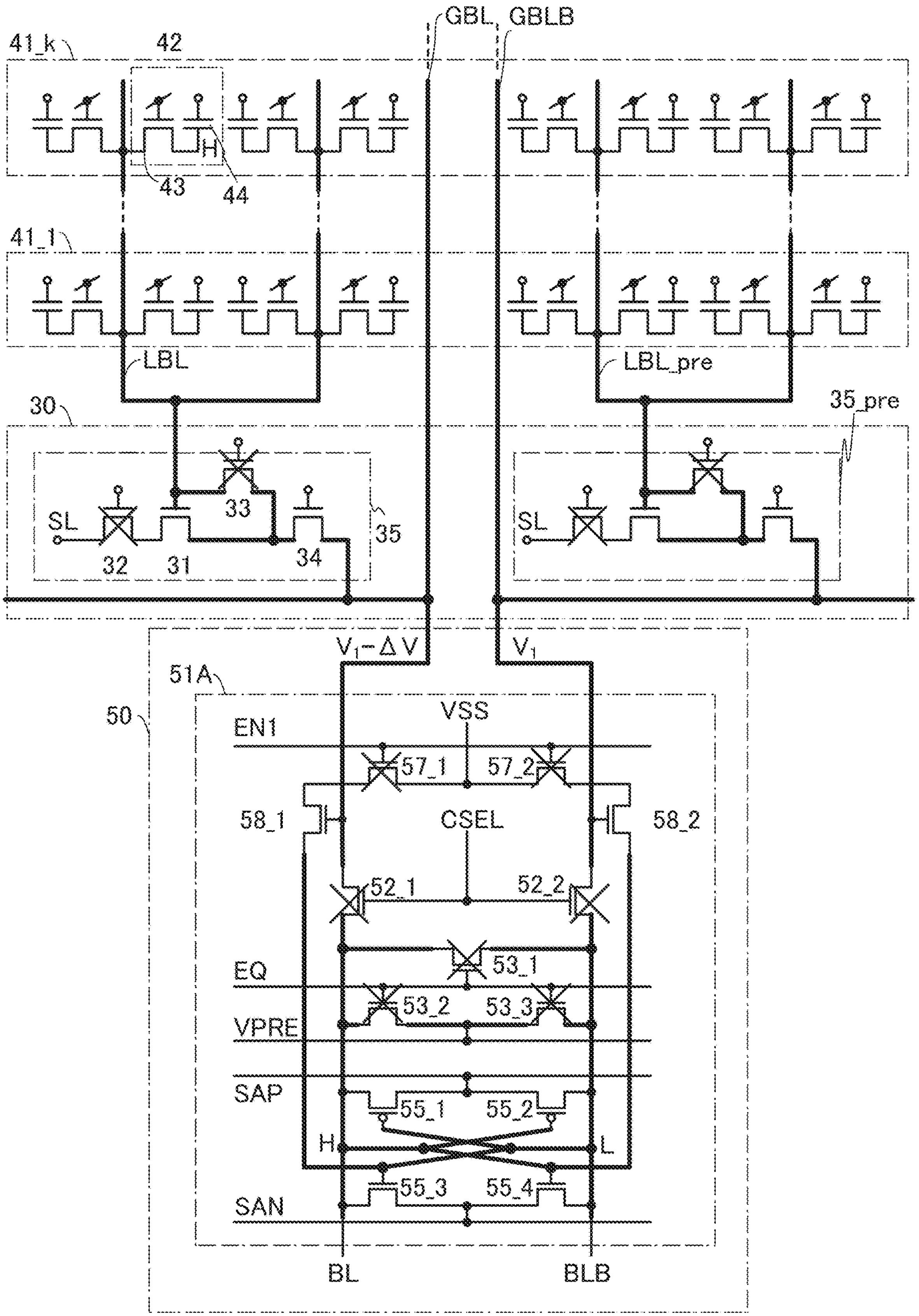
FIG. 32 is a circuit diagram illustrating a structure example of a semiconductor device.

In FIG. 32, the transistors 57_1 and 57_2 are turned off and the power supply voltage is supplied to the wirings SAP and SAN, whereby the sense amplifier included in the control circuit 51A is activated. The bit line BL and the inverted bit line BLB are determined to have a logic at H level or L level. The logic is an inverted logic of the logic read from the memory cell 42.

Figure 33:
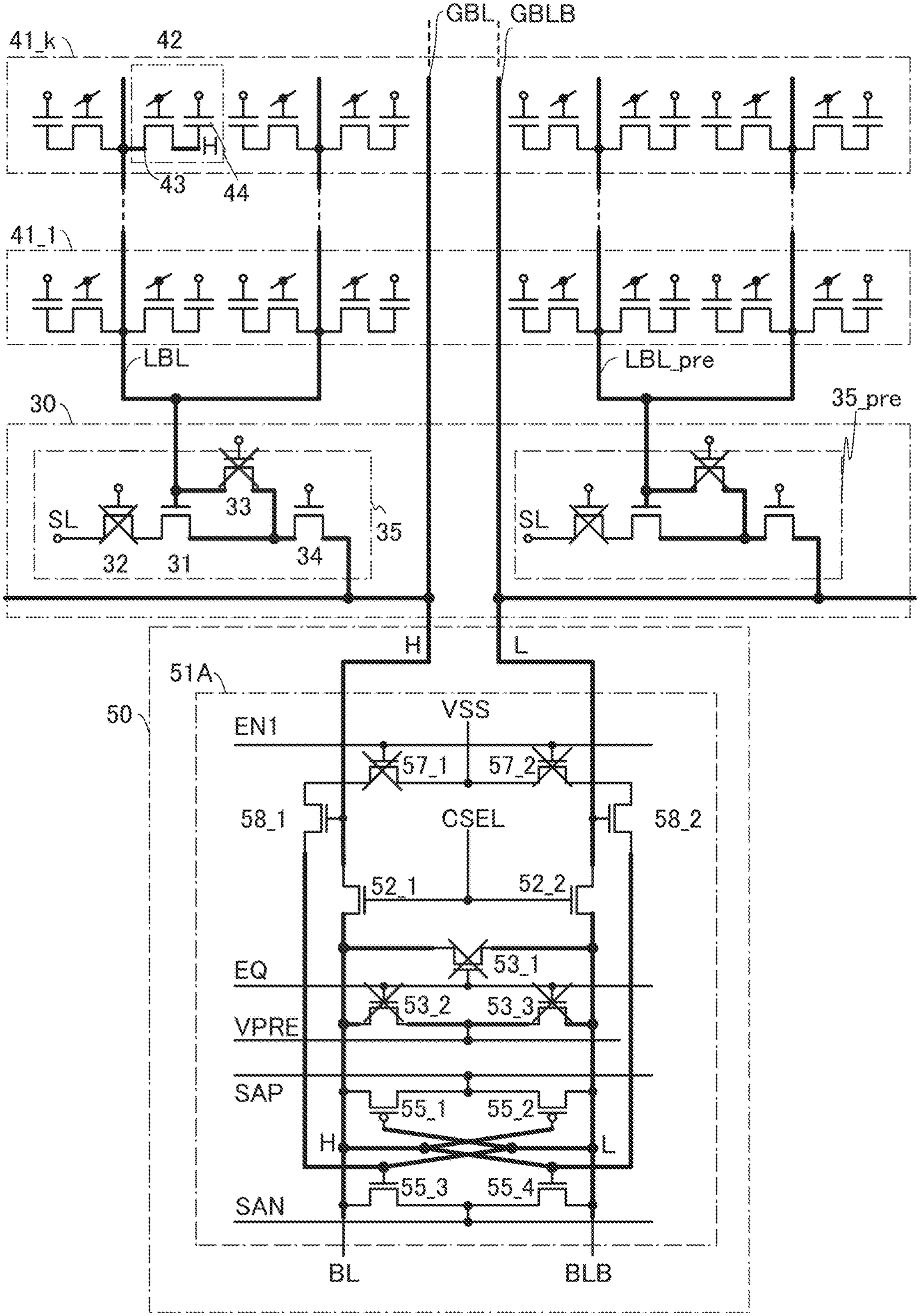
FIG. 33 is a circuit diagram illustrating a structure example of a semiconductor device.

In FIG. 33, the transistors 521 and 522, the transistors 33 and 34, and the transistor 43 included in the memory cell 42 are turned on, and the voltages of the bit line BL and the inverted bit line BLB that are determined in the above period are written back to the memory cell 42.

With the above structure, the voltage corresponding to a logic of the data read out by the charge sharing can be written back to the memory cell 42 again without inversion of the logic.

In the transistor layer including the memory cell and the control circuit of one embodiment of the present invention, data can be read out as a signal in which the threshold voltage of the read transistor is corrected. With this structure, the reliability of data read from the memory cell to the first control circuit can be improved. Furthermore, a plurality of switches are provided between the pair of global bit lines in the semiconductor device of one embodiment of the present invention, whereby data can be written back to the memory cell with the logic of data read from the memory cell.

Modification Example of Semiconductor Device

Figure 34B:
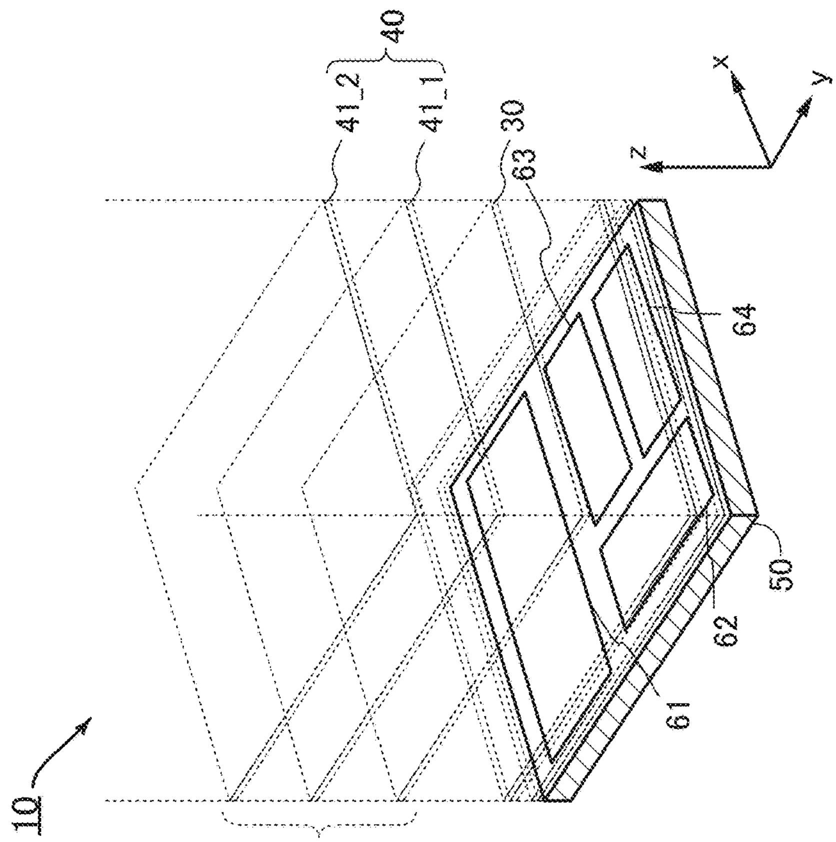
FIG. 34A and FIG. 34B are schematic views illustrating a structure example of a semiconductor device.
Figure 34A:
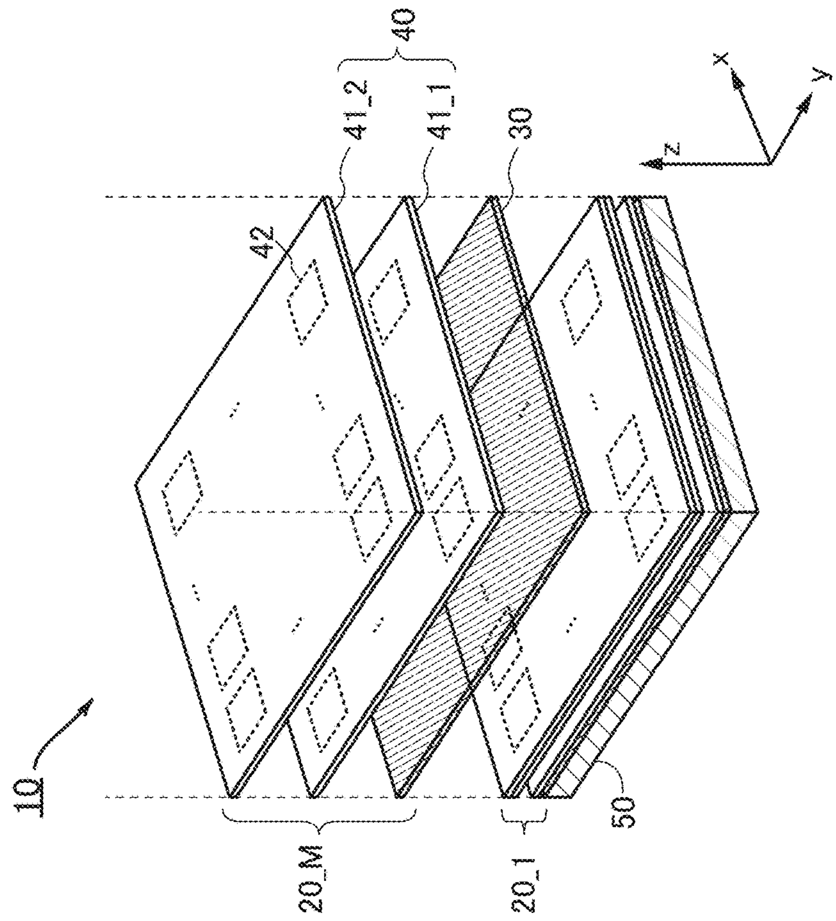

FIG. 34A illustrates a perspective view of the semiconductor device 10 illustrated in FIG. 1 in which the element layers 20_1 to 20_M are provided over the silicon substrate 50. FIG. 34A illustrates the depth direction (x-axis direction) and the horizontal direction (y-axis direction) in addition to the perpendicular direction (z-axis direction).

In FIG. 34A, the memory cells 42 included in the transistor layers 41_1 and 41_2 are indicated by dotted lines.

As illustrated in FIG. 34A, in the semiconductor device 10 of one embodiment of the present invention, the transistor layers 30 and 40 including OS transistors are provided to be stacked. Thus, the transistor layers can be manufactured by repeating the same manufacturing process in the perpendicular direction, which can reduce the manufacturing cost. Moreover, in the semiconductor device 10 of one embodiment of the present invention, the memory density can be improved by stacking the transistor layers 40 including the memory cells 42 in the perpendicular direction, not in the plane direction, so that the device can be downsized.

FIG. 34B is a diagram illustrating circuits provided for the silicon substrate 50 while the components included in the element layers 20_1 to 20_M illustrated in FIG. 34A are omitted. FIG. 34B illustrates a control logic circuit 61, a row driver circuit 62, a column driver circuit 63, and an output circuit 64 formed using Si transistors over the silicon substrate 50. The control logic circuit 61, the row driver circuit 62, the column driver circuit 63, and the output circuit 64 will be described in detail in Embodiment 4.

Figure 35:
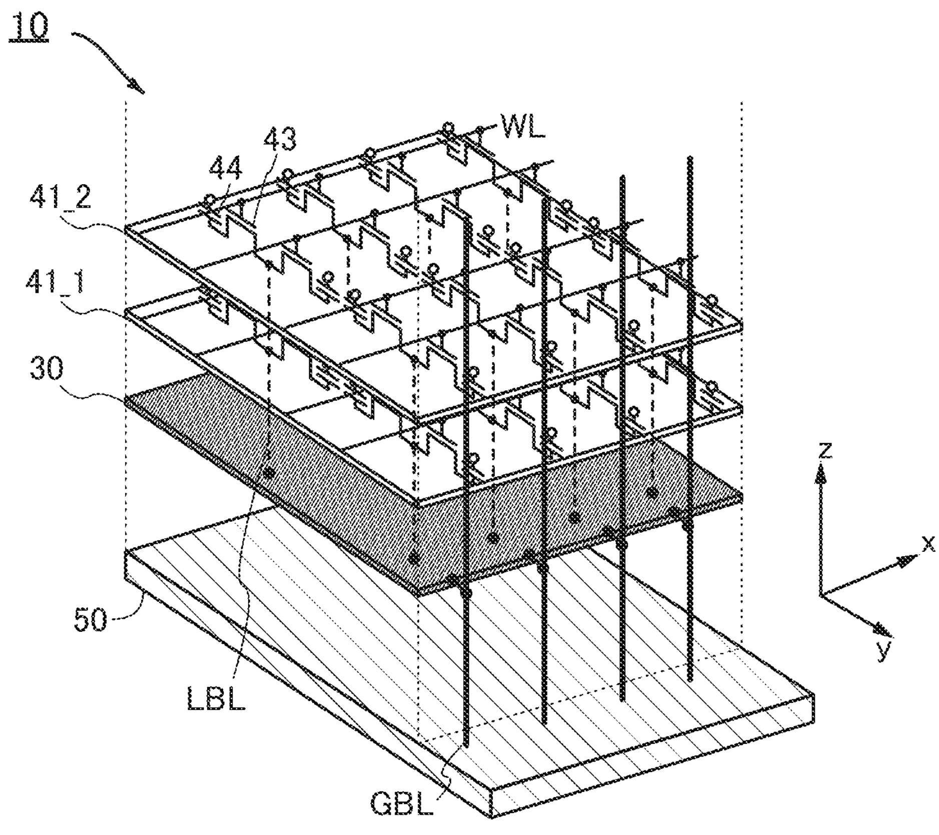
FIG. 35 is a schematic view illustrating a structure example of a semiconductor device.

FIG. 35 corresponds to a diagram illustrating the transistor layers 30, 41_1, and 41_2 extracted from the semiconductor device 10 illustrated in FIG. 34A. FIG. 35 illustrates the transistor 43, the capacitor 44, the local bit line LBL, and the word line WL included in the memory cells of the transistor layers 41_1 and 41_2. To increase visibility, the local bit line LBL is indicated by a dashed line in FIG. 35. FIG. 35 illustrates the global bit line GBL provided to penetrate the transistor layers in the z-axis direction. To increase visibility as described above, the global bit line GBL is indicated by a line bolder than other lines.

As illustrated in FIG. 35, in the semiconductor device 10, the local bit line LBL connected to the transistor 43 included in the memory cell and the global bit line GBL connected to the control circuit 35 in the transistor layer 30 and the silicon substrate 50 are provided in the z-axis direction, i.e., the direction perpendicular to the silicon substrate 50. With such a structure, the local bit line LBL connected to each memory cell can be shortened. Thus, the parasitic capacitance of the local bit line LBL can be reduced significantly, so that a potential can be read even when the memory cell retains a multilevel data signal. Furthermore, one embodiment of the present invention can read data retained in the memory cell as current; thus, multilevel data can be easily read.

Figure 36A:
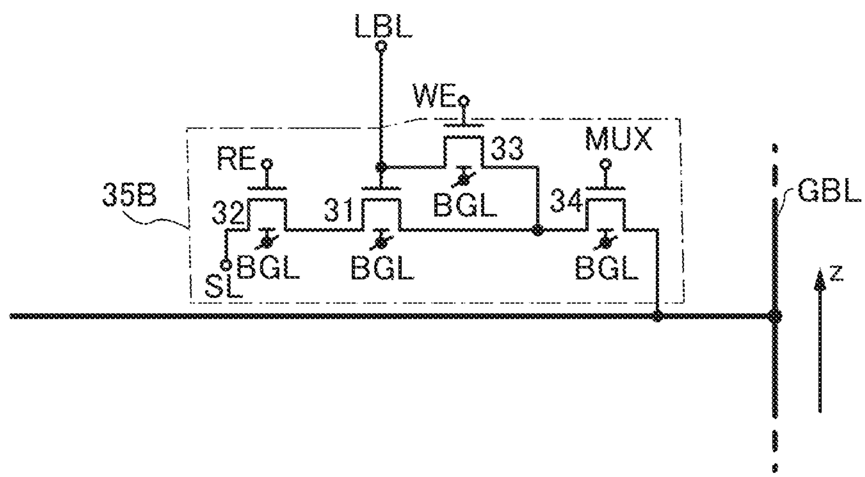
FIG. 36A and FIG. 36B are circuit diagrams illustrating structure examples of a semiconductor device.
Figure 36B:
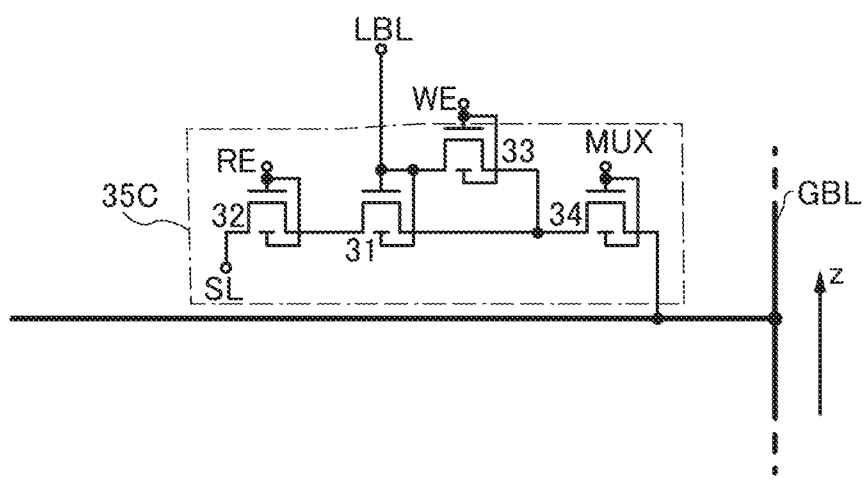

FIG. 36A and FIG. 36B illustrate circuit diagrams for describing modification examples of the control circuit 35 illustrated in FIG. 2B. In FIG. 2B, each transistor is illustrated as a transistor having a top-gate structure or a bottom-gate structure without a back gate electrode; however, the structures of the transistors are not limited thereto. For example, as illustrated in FIG. 36A, a control circuit 35B may include back gate electrodes each connected to a back gate electrode line BGL. With the structure in FIG. 36A, electrical characteristics such as the threshold voltages of the transistors can be easily controlled from the outside.

Alternatively, as illustrated in FIG. 36B, a control circuit 35C may include back gate electrodes connected to gate electrodes. With the structure of FIG. 36B, the amount of current flowing through the transistors can be increased.

Figure 37A:
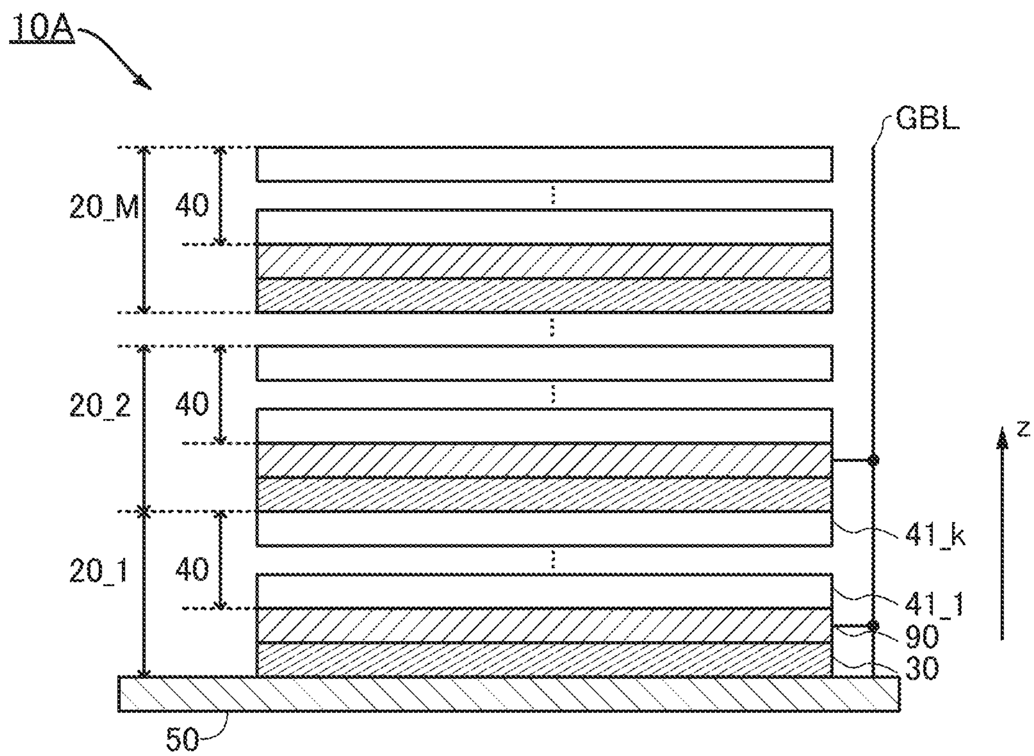
FIG. 37A and FIG. 37B are a block diagram and a circuit diagram illustrating a structure example of a semiconductor device.

Although the semiconductor device 10 in FIG. 1 is described as a semiconductor device including one kind of memory cell, two or more kinds of memory cells may be included. FIG. 37A illustrates a block diagram of a semiconductor device 10A corresponding to a modification example of the semiconductor device 10.

The semiconductor device 10A is different from the semiconductor device 10 in that a transistor layer 90 including a memory cell that has a different circuit structure is provided between the element layer 20 and the transistor layer 30.

Figure 37B:
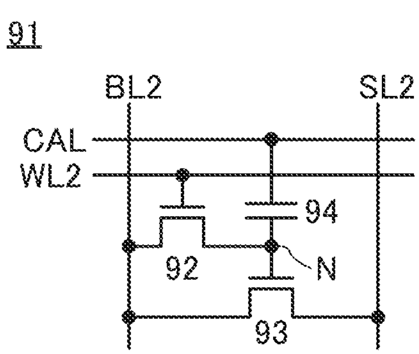

FIG. 37B is a circuit diagram illustrating a structure example of a memory cell 91 included in the transistor layer 90. The memory cell 91 includes a transistor 92, a transistor 93, and a capacitor 94.

One of a source and a drain of the transistor 92 is connected to a gate of the transistor 93. The gate of the transistor 93 is connected to one electrode of the capacitor 94. The other of the source and the drain of the transistor 92 and the one of the source and the drain of the transistor 92 are connected to a wiring BL2. The other of the source and the drain of the transistor 93 is connected to a wiring SL2. The other electrode of the capacitor 94 is electrically connected to a wiring CAL. Here, a node at which the one of the source and the drain of the transistor 92, the gate of the transistor 93, and the one electrode of the capacitor 94 are connected is referred to as a node N.

The wiring CAL has a function of a wiring for applying a predetermined potential to the other electrode of the capacitor 94. The potential of the wiring CAL at the time of reading data from the memory cell 91 is made to differ from the potentials of the wiring CAL at the time of writing data to the memory cell 91 and during data retention in the memory cell 91. Accordingly, the apparent threshold voltage of the transistor 93 at the time of reading data from the memory cell 91 can differ from the apparent threshold voltages of the transistor 93 at the time of writing data to the memory cell 91 and during data retention in the memory cell 91.

In the case where the memory cell 91 has the structure illustrated in FIG. 37B, current does not flow between the wiring SL2 and the wiring BL2 at the time of writing data to the memory cell 91 and during data retention in the memory cell 91, regardless of data written to the memory cell 91. On the other hand, at the time of reading data from the memory cell 91, current corresponding to the data retained in the memory cell 91 flows between the wiring SL2 and the wiring BL2.

The transistors 92 and 93 are preferably OS transistors. As described above, an OS transistor has an extremely low off-state current. Accordingly, electric charge corresponding to the data written to the memory cell 91 can be retained in the node N for a long time. In other words, data written once can be retained for a long time in the memory cell 91. Therefore, the frequency of data refresh can be reduced and power consumption of the semiconductor device of one embodiment of the present invention can be reduced.

The memory cell 91 having the structure illustrated in FIG. 37B can be referred to as a NOSRAM (Nonvolatile Oxide Semiconductor RAM) using an OS transistor for a memory. The NOSRAM is characterized by being capable of non-destructive read. Meanwhile, the above-described DOSRAM performs destructive read for reading retained data.

The semiconductor device 10A including the memory cell 91 can transfer frequently-read data from a DOSRAM to a NOSRAM. Since the NOSRAM is capable of non-destructive read as described above, the frequency of data refresh can be reduced. Thus, power consumption of the semiconductor device of one embodiment of the present invention can be reduced. Note that although the transistor 92 and the transistor 93 illustrated in FIG. 37B each include one gate, the transistor is not limited thereto. For example, one or both of the transistor 92 and the transistor 93 may be a transistor including two gates (a transistor including a front gate and a back gate facing the front gate).

Figure 38A:
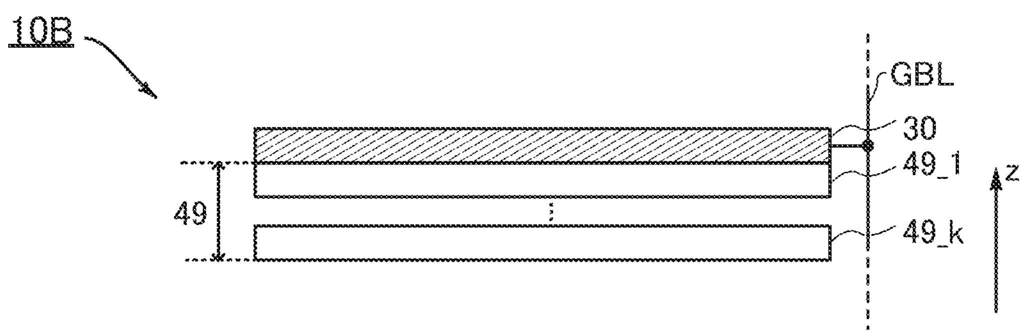
FIG. 38A and FIG. 38B are block diagrams illustrating structure examples of semiconductor devices.
Figure 38B:
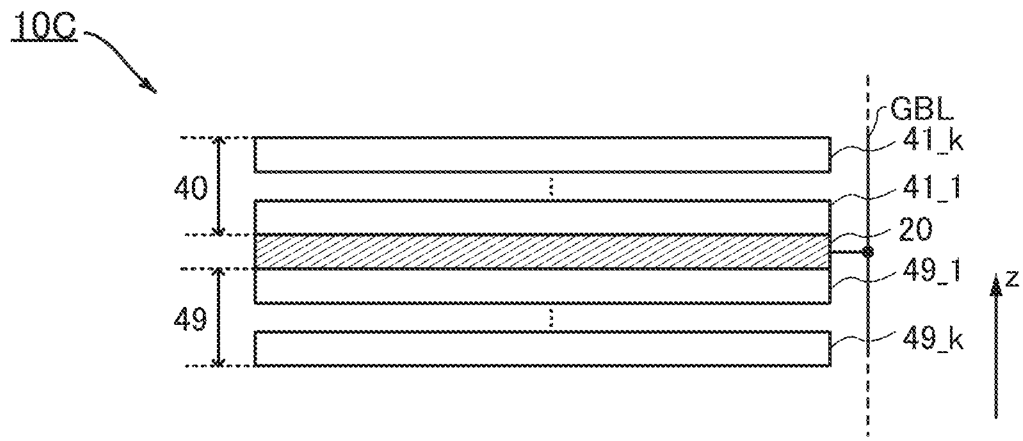

FIG. 38A and FIG. 38B illustrate schematic views for describing modification examples of the semiconductor device 10 illustrated in FIG. 1.

FIG. 38A is a semiconductor device 10B in which the transistor layer 40 is provided below the transistor layer 30 in each of the element layers 20_1 to 20_M in the semiconductor device 10 illustrated in FIG. 1. The semiconductor device 10B illustrated in FIG. 38A includes a transistor layer 49 including transistor layers 49_1 to 49_*k* below the transistor layer 30. This structure also enables the threshold voltage of the read transistor to be corrected.

FIG. 38B is a semiconductor device 10C in which the transistor layer 49 illustrated in FIG. 38A is provided in each of the element layers 20_1 to 20_M in the semiconductor device 10 illustrated in FIG. 1, in addition to the transistor layer 40. This structure also enables the threshold voltage of the read transistor to be corrected.

Embodiment 2

Examples of a semiconductor device functioning as a memory device of one embodiment of the present invention are described below.

Figure 39:
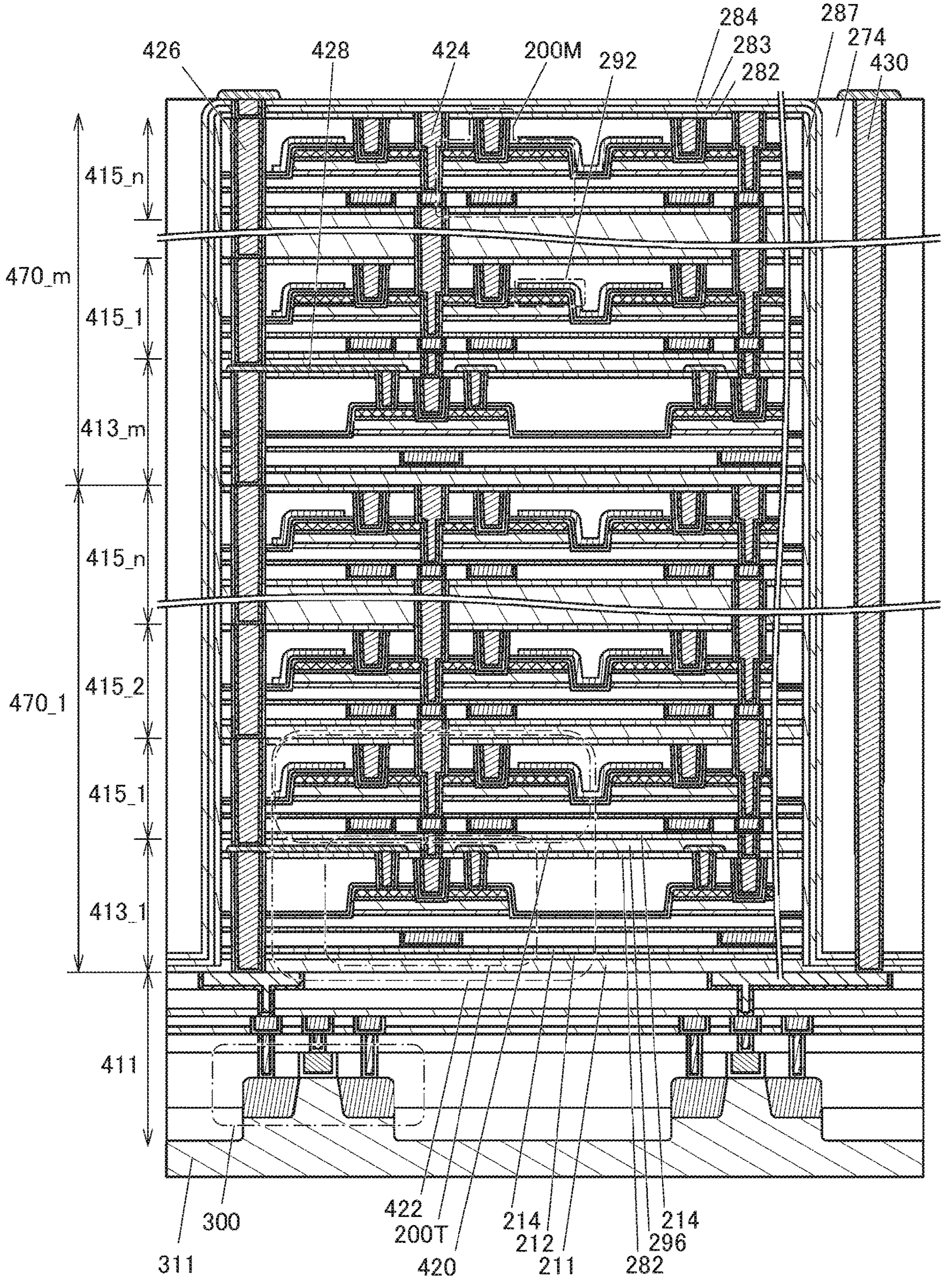
FIG. 39 is a schematic cross-sectional view illustrating a structure example of a semiconductor device.

FIG. 39 is a diagram illustrating an example of a semiconductor device where memory units 470 (a memory unit 470_1 to a memory unit 470_*m*: m is a natural number greater than or equal to 2) are provided to be stacked over an element layer 411 including a circuit provided on a semiconductor substrate 311. FIG. 39 illustrates an example where the element layer 411 and a plurality of memory units 470 over the element layer 411 are stacked; the plurality of memory units 470 are each provided with a transistor layer 413 (a transistor layer 413_1 to a transistor layer 413_*m*) and a plurality of memory device layers 415 (a memory device layer 415_1 to a memory device layer 415_*n*: n is a natural number greater than or equal to 2) over each transistor layer 413. Note that although the memory device layers 415 are provided over the transistor layer 413 in each memory unit 470 in the illustrated example, this embodiment is not limited thereto. The transistor layer 413 may be provided over the plurality of memory device layers 415, or the memory device layers 415 may be provided over and under the transistor layer 413.

The element layer 411 includes a transistor 300 provided on the semiconductor substrate 311 and can function as a circuit (referred to as a peripheral circuit in some cases) of the semiconductor device. Examples of the circuit are a column driver, a row driver, a column decoder, a row decoder, a sense amplifier, a precharge circuit, an amplifier circuit, a word line driver circuit, an output circuit, and a control logic circuit.

The transistor layer 413 includes a transistor 200T and can function as a circuit which controls each memory unit 470. The memory device layers 415 include a memory device 420. The memory device 420 described in this embodiment includes a transistor 200M and a capacitor 292.

Although not particularly limited, m is greater than or equal to 2 and less than or equal to 100, preferably greater than or equal to 2 and less than or equal to 50, further preferably greater than or equal to 2 and less than or equal to 10. Although not particularly limited, n is greater than or equal to 2 and less than or equal to 100, preferably greater than or equal to 2 and less than or equal to 50, further preferably greater than or equal to 2 and less than or equal to 10. In addition, the product of m and n is greater than or equal to 4 and less than or equal to 256, preferably greater than or equal to 4 and less than or equal to 128, further preferably greater than or equal to 4 and less than or equal to 64.

FIG. 39 illustrates a cross-sectional view of the transistors 200T and the transistors 200M in the channel length direction, which are included in the memory units.

As illustrated in FIG. 39, the transistor 300 is provided on the semiconductor substrate 311, and the transistor layers 413 and the memory device layers 415 included in the memory units 470 are provided over the transistor 300. In one memory unit 470, the transistor 200T included in the transistor layer 413 and the memory devices 420 included in the memory device layers 415 are electrically connected to each other by a plurality of conductors 424, and the transistor 300 and the transistor 200T included in the transistor layer 413 in each memory unit 470 are electrically connected to each other by a conductor 426. In addition, the conductor 426 is preferably electrically connected to the transistor 200T through a conductor 428 which is electrically connected to any one of a source, a drain, and a gate of the transistor 200T. The conductors 424 are preferably provided in each layer in the memory device layers 415. Furthermore, the conductor 426 is preferably provided in each layer in the transistor layer 413 and the memory device layers 415.

Although the details are described later, an insulator that inhibits passage of impurities such as water or hydrogen or oxygen is preferably provided on side surfaces of the conductors 424 and a side surface of the conductor 426. For the insulators, for example, silicon nitride, aluminum oxide, or silicon nitride oxide may be used.

The memory device 420 includes the transistor 200M and the capacitor 292. The transistor 200M can have a structure similar to that of the transistor 200T included in the transistor layer 413. The transistor 200T and the transistor 200M are collectively referred to as transistors 200 in some cases.

The transistor 200 preferably uses a metal oxide functioning as an oxide semiconductor (hereinafter also referred to as an oxide semiconductor) in a semiconductor including a region where a channel is formed (hereinafter also referred to as a channel formation region).

As an oxide semiconductor, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, indium oxide, an In—Ga oxide, or an In—Zn oxide may be used. Note that when an oxide semiconductor having a high proportion of indium is used, the on-state current, the field-effect mobility, or the like of the transistor can be increased.

The transistor 200 using an oxide semiconductor in its channel formation region has an extremely low leakage current in a non-conducting state; hence, a semiconductor device with low power consumption can be provided. An oxide semiconductor can be deposited by a sputtering method or the like, and thus can be used in the transistor 200 included in a highly integrated semiconductor device. Note that a method for depositing the oxide semiconductor is not limited to the above sputtering method, and an ALD (Atomic Layer Deposition) method may be used, for example.

In contrast, a transistor using an oxide semiconductor is likely to have normally-on characteristics (characteristics such that a channel exists without voltage application to a gate electrode and a current flows through the transistor) owing to an impurity and an oxygen vacancy in the oxide semiconductor that change the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Therefore, the concentration of impurities in the oxide semiconductor is preferably reduced as much as possible. Examples of the impurities in the oxide semiconductor include hydrogen, nitrogen, an alkali metal, an alkaline earth metal, iron, nickel, and silicon.

In particular, hydrogen as an impurity contained in the oxide semiconductor might form an oxygen vacancy (also referred to as $V_O$) in the oxide semiconductor. In some cases, a defect that is an oxygen vacancy into which hydrogen enters (hereinafter referred to as $V_OH$ in some cases) generates an electron serving as a carrier. In other cases, reaction of part of hydrogen with oxygen bonded to a metal atom generates an electron serving as a carrier.

Thus, a transistor using an oxide semiconductor which contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor.

Therefore, it is preferable to use a highly purified intrinsic oxide semiconductor in which oxygen vacancies and impurities such as hydrogen are reduced as the oxide semiconductor used in the transistor 200.

<Sealing Structure>

In view of the above, the transistor 200 is preferably sealed using a material that inhibits diffusion of impurities (hereinafter also referred to as a barrier material against impurities) in order to inhibit entry of impurities from the outside.

A barrier property in this specification means a function of inhibiting diffusion of a particular substance (also referred to as low transmission capability). Alternatively, a barrier property in this specification means a function of capturing and fixing (also referred to as gettering) a particular substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of capturing and fixing hydrogen include metal oxides such as aluminum oxide, hafnium oxide, gallium oxide, and indium gallium zinc oxide.

As layers having a barrier property, an insulator 211, an insulator 212, and an insulator 214 are preferably provided between the transistor 300 and the transistor 200. When a material that inhibits diffusion or passage of impurities such as hydrogen is used in at least one of the insulator 211, the insulator 212, and the insulator 214, diffusion of impurities such as hydrogen or water contained in the semiconductor substrate 311, the transistor 300, or the like into the transistor 200 can be inhibited. When a material that inhibits passage of oxygen is used in at least one of the insulator 211, the insulator 212, and the insulator 214, diffusion of oxygen contained in the channel of the transistor 200 or the transistor layer 413 into the element layer 411 can be inhibited. For example, it is preferable to use a material that inhibits passage of impurities such as hydrogen or water as the insulator 211 and the insulator 212 and use a material that inhibits passage of oxygen as the insulator 214. Furthermore, a material having a property of absorbing or occluding hydrogen is further preferably used as the insulator 214. As the insulator 211 and the insulator 212, a nitride such as silicon nitride or silicon nitride oxide can be used, for example. For example, as the insulator 214, a metal oxide such as aluminum oxide, hafnium oxide, gallium oxide, or indium gallium zinc oxide can be used. In particular, aluminum oxide is preferably used as the insulator 214.

Furthermore, an insulator 287 is preferably provided on side surfaces of the transistor layers 413 and side surfaces of the memory device layers 415, that is, side surfaces of the memory units 470, and an insulator 282 is preferably provided on a top surface of the memory unit 470. In this case, the insulator 282 is preferably in contact with the insulator 287, and the insulator 287 is preferably in contact with at least one of the insulator 211, the insulator 212, and the insulator 214. As the insulator 287 and the insulator 282, a material that can be used as the insulator 214 is preferably used.

An insulator 283 and an insulator 284 are preferably provided to cover the insulator 282 and the insulator 287, and the insulator 283 is preferably in contact with at least one of the insulator 211, the insulator 212, and the insulator 214. Although an example where the insulator 287 is in contact with a side surface of the insulator 214, a side surface of the insulator 212, and a top surface and a side surface of the insulator 211 and the insulator 283 is in contact with a side surface of the insulator 287 and the top surface of the insulator 211 is illustrated in FIG. 39, this embodiment is not limited thereto. The insulator 287 may be in contact with the side surface of the insulator 214 and a top surface and the side surface of the insulator 212, and the insulator 283 may be in contact with the side surface of the insulator 287 and the top surface of the insulator 212. As the insulator 282 and the insulator 287, a material that can be used as the insulator 211 and the insulator 212 is preferably used.

In the above-described structure, a material that inhibits passage of oxygen is preferably used as the insulator 287 and the insulator 282. A material having a property of capturing and fixing hydrogen is further preferably used as the insulator 287 and the insulator 282. When the material having a property of capturing and fixing hydrogen is used on the side close to the transistor 200, hydrogen in the transistor 200 or the memory units 470 is captured and fixed by the insulator 214, the insulator 287, and the insulator 282, so that the hydrogen concentration in the transistor 200 can be reduced. Furthermore, a material that inhibits passage of impurities such as hydrogen or water is preferably used as the insulator 283 and the insulator 284.

With the above-described structure, the memory units 470 are surrounded by the insulator 211, the insulator 212, the insulator 214, the insulator 287, the insulator 282, the insulator 283, and the insulator 284. Specifically, the memory units 470 are surrounded by the insulator 214, the insulator 287, and the insulator 282 (referred to as a first structure body in some cases); and the memory units 470 and the first structure body are surrounded by the insulator 211, the insulator 212, the insulator 283, and the insulator 284 (referred to as a second structure body in some cases). The structure such that the memory units 470 are surrounded by two or more layers of structure bodies in that manner is referred to as a nesting structure in some cases. Here, the memory units 470 being surrounded by the plurality of structure bodies is also described as the memory units 470 being sealed by the plurality of insulators.

The second structure body seals the transistor 200 with the first structure body therebetween. Thus, the second structure body inhibits hydrogen present outside the second structure body, from diffusing to a portion inside the second structure body (to the transistor 200 side). That is, the first structure body can efficiently capture and fix hydrogen present in an inside structure of the second structure body.

In the above structure, specifically, a metal oxide such as aluminum oxide can be used for the first structure body and a nitride such as silicon nitride can be used for the second structure body. More specifically, an aluminum oxide film is preferably provided between the transistor 200 and a silicon nitride film.

Furthermore, by appropriately setting deposition conditions for the materials used for the structure bodies, the hydrogen concentrations in the film can be reduced.

In general, a film deposited by a CVD method has more favorable coverage than a film deposited by a sputtering method. On the other hand, many compound gases used for a CVD method contain hydrogen and a film deposited by a CVD method has higher hydrogen content than a film deposited by a sputtering method.

Accordingly, it is preferable to use a film with a reduced hydrogen concentration (specifically, a film deposited by a sputtering method) as a film which is close to the transistor 200, for example. Meanwhile, in the case where a film that has favorable coverage but has a relatively high hydrogen concentration (specifically, a film deposited by a CVD method) is used as a film that inhibits impurity diffusion, it is preferable that a film having a function of capturing and fixing hydrogen and a reduced hydrogen concentration be provided between the transistor 200 and the film that has a relatively high hydrogen concentration but has favorable coverage.

In other words, a film with a relatively low hydrogen concentration is preferably used as the film which is provided close to the transistor 200. In contrast, a film with a relatively high hydrogen concentration is preferably provided apart from the transistor 200.

Specifically when the transistor 200 is sealed with silicon nitride deposited by a CVD method in the above-described structure, an aluminum oxide film deposited by a sputtering method is preferably provided between the transistor 200 and the silicon nitride film deposited by a CVD method. It is further preferable that a silicon nitride film deposited by a sputtering method be provided between the silicon nitride film deposited by a CVD method and the aluminum oxide film deposited by a sputtering method.

Note that in the case where a CVD method is employed for deposition, a compound gas containing no hydrogen atom or having a low hydrogen atom content may be used for the deposition to reduce the hydrogen concentration of the deposited film.

It is also preferable to provide the insulator 282 and the insulator 214 between the transistor layer 413 and the memory device layers 415 or between the memory device layers 415. Furthermore, it is preferable to provide an insulator 296 between the insulator 282 and the insulator 214. The insulator 296 can be formed using a material similar to those of the insulator 283 and the insulator 284. Alternatively, silicon oxide or silicon oxynitride can be used. Alternatively, a known insulating material may be used. Here, the insulator 282, the insulator 296, and the insulator 214 may be elements that form the transistor 200. It is preferable that the insulator 282, the insulator 296, and the insulator 214 also serve as components of the transistor 200 in order to reduce the number of steps for manufacturing the semiconductor device.

Each side surface of the insulator 282, the insulator 296, and the insulator 214 provided between the transistor layer 413 and the memory device layers 415 or between the memory device layers 415 is preferably in contact with the insulator 287. With this structure, the transistor layer 413 and the memory device layers 415 are each surrounded by and sealed with the insulator 282, the insulator 296, the insulator 214, the insulator 287, the insulator 283, and the insulator 284.

An insulator 274 may be provided around the insulator 284. A conductor 430 may be provided so as to be embedded in the insulator 274, the insulator 284, the insulator 283, and the insulator 211. The conductor 430 is electrically connected to the transistor 300, that is, the circuit included in the element layer 411.

Furthermore, since the capacitor 292 is formed in the same layer as the transistor 200M in the memory device layers 415, the height of the memory device 420 can be approximately equal to that of the transistor 200M; thus, the height of each memory device layer 415 can be prevented from being excessively increased. Accordingly, the number of memory device layers 415 can be increased relatively easily. For example, approximately 100 units each including the transistor layer 413 and the memory device layers 415 may be stacked.

<Transistor 200>

The transistor 200 that can be used as the transistor 200T included in the transistor layer 413 and the transistor 200M included in the memory device 420 is described with reference to FIG. 40A.

Figure 40A:
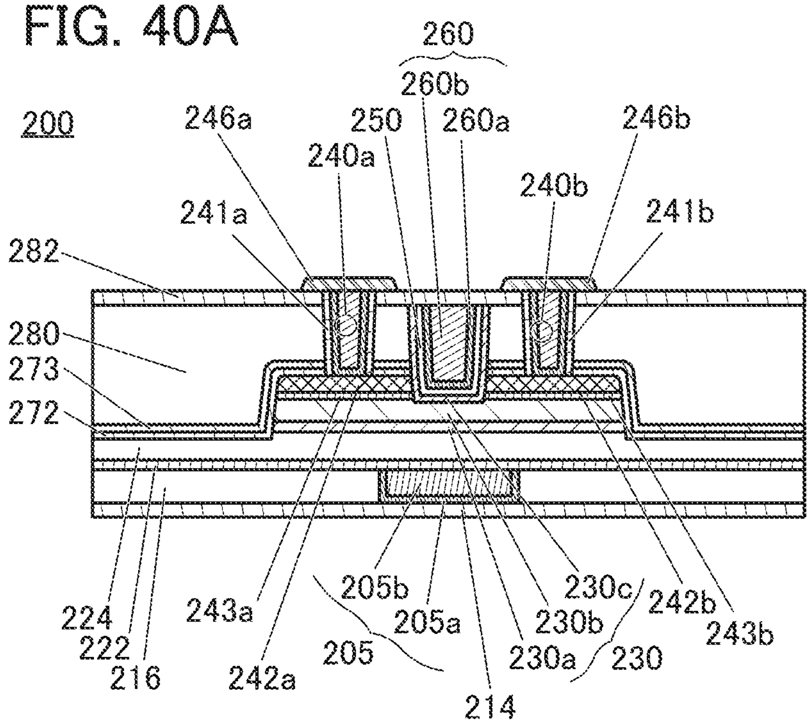
FIG. 40A and FIG. 40B are schematic cross-sectional views illustrating structure examples of a semiconductor device.

As illustrated in FIG. 40A, the transistor 200 includes an insulator 216, a conductor 205 (a conductor 205*a* and a conductor 205*b*), an insulator 222, an insulator 224, an oxide 230 (an oxide 230*a*, an oxide 230*b*, and an oxide 230*c*), a conductor 242 (a conductor 242*a* and a conductor 242*b*), an oxide 243 (an oxide 243*a* and an oxide 243*b*), an insulator 272, an insulator 273, an insulator 250, and a conductor 260 (a conductor 260*a* and a conductor 260*b*).

Furthermore, the insulator 216 and the conductor 205 are provided over the insulator 214, and an insulator 280 and the insulator 282 are provided over the insulator 273. The insulator 214, the insulator 280, and the insulator 282 can be regarded as part of the transistor 200.

The semiconductor device of one embodiment of the present invention also includes a conductor 240 (a conductor 240*a* and a conductor 240*b*) that is electrically connected to the transistor 200 and functions as a plug. Note that an insulator 241 (an insulator 241*a* and an insulator 241*b*) may be provided in contact with a side surface of the conductor 240 functioning as a plug. A conductor 246 (a conductor 246*a* and a conductor 246*b*) that is electrically connected to the conductor 240 and functions as a wiring is provided over the insulator 282 and the conductor 240.

For the conductor 240*a* and the conductor 240*b*, a conductive material containing tungsten, copper, or aluminum as its main component is preferably used. The conductor 240*a* and the conductor 240*b* may each have a stacked-layer structure.

In the case where the conductor 240 has a stacked-layer structure, a conductive material having a function of inhibiting passage of oxygen and impurities such as water or hydrogen is preferably used. For example, tantalum, tantalum nitride, titanium, titanium nitride, ruthenium, ruthenium oxide, or the like is preferably used. A single layer or a stacked layer of the conductive material having a function of inhibiting passage of oxygen and impurities such as water or hydrogen may be used. With the use of the conductive material, entry of impurities diffused from the insulator 280 and the like, such as water or hydrogen, into the oxide 230 through the conductor 240*a* and the conductor 240*b* can be further reduced. In addition, oxygen added to the insulator 280 can be prevented from being absorbed by the conductor 240*a* and the conductor 240*b*.

For the insulator 241 provided in contact with the side surface of the conductor 240, for example, silicon nitride, aluminum oxide, silicon nitride oxide, or the like can be used. Since the insulator 241 is provided in contact with the insulator 272, the insulator 273, the insulator 280, and the insulator 282, impurities such as water or hydrogen can be inhibited from being mixed into the oxide 230 through the conductor 240*a* and the conductor 240*b* from the insulator 280 or the like. In particular, silicon nitride is suitable because of having a high blocking property against hydrogen. In addition, oxygen contained in the insulator 280 can be prevented from being absorbed by the conductor 240*a* and the conductor 240*b*.

As the conductor 246, a conductive material containing tungsten, copper, or aluminum as its main component is preferably used. Furthermore, the conductor may have a stacked-layer structure and may be a stack of titanium or titanium nitride and the above-described conductive material, for example. Note that the conductor may be formed to be embedded in an opening provided in an insulator.

In the transistor 200, the conductor 260 functions as a first gate of the transistor, and the conductor 205 functions as a second gate of the transistor. The conductor 242*a* and the conductor 242*b* function as a source electrode and a drain electrode.

The oxide 230 functions as a semiconductor including a channel formation region.

The insulator 250 functions as a first gate insulator, and the insulator 222 and the insulator 224 function as a second gate insulator.

Here, in the transistor 200 illustrated in FIG. 40A, the conductor 260 is formed in a self-aligned manner in an opening portion provided in the insulator 280, the insulator 273, the insulator 272, the conductor 242, and the like, with the oxide 230*c* and the insulator 250 therebetween.

That is, since the conductor 260 is formed to fill the opening provided in the insulator 280 and the like with the oxide 230*c* and the insulator 250 therebetween, the position alignment of the conductor 260 in a region between the conductor 242*a* and the conductor 242*b* is not needed.

Here, the oxide 230*c* is preferably provided in the opening that is provided in the insulator 280 and the like. Thus, the insulator 250 and the conductor 260 include a region that overlaps with a stacked-layer structure of the oxide 230*b* and the oxide 230*a* with the oxide 230*c* therebetween. When this structure is employed, the oxide 230*c* and the insulator 250 can be sequentially formed and thus, the interface between the oxide 230 and the insulator 250 can be kept clean. Thus, the influence of interface scattering on carrier conduction is small, and the transistor 200 can have a high on-state current and excellent frequency characteristics.

In the transistor 200 illustrated in FIG. 40A, a bottom surface and a side surface of the conductor 260 are in contact with the insulator 250. In addition, a bottom surface and a side surface of the insulator 250 are in contact with the oxide 230*c*.

As illustrated in FIG. 40A, the transistor 200 has a structure in which the insulator 282 and the oxide 230*c* are in direct contact with each other. Owing to this structure, diffusion of oxygen contained in the insulator 280 into the conductor 260 can be inhibited.

Therefore, oxygen contained in the insulator 280 can be supplied to the oxide 230*a* and the oxide 230*b* efficiently through the oxide 230*c*; hence, oxygen vacancies in the oxide 230*a* and the oxide 230*b* can be reduced and the electrical characteristics and the reliability of the transistor 200 can be improved.

The detailed structure of the semiconductor device including the transistor 200 of one embodiment of the present invention is described below.

In the transistor 200, as the oxide 230 (the oxide 230*a*, the oxide 230*b*, and the oxide 230*c*) that includes the channel formation region, a metal oxide functioning as an oxide semiconductor (hereinafter also referred to as an oxide semiconductor) is preferably used.

For example, a metal oxide having an energy gap of 2 eV or more, preferably 2.5 eV or more is preferably used as the metal oxide functioning as an oxide semiconductor. With the use of a metal oxide having such a wide energy gap, the leakage current in a non-conducting state (off-state current) of the transistor 200 can be extremely low. With the use of such a transistor, a semiconductor device with low power consumption can be provided.

Specifically, for the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M Furthermore, an In-M oxide, an In—Zn oxide, or an M-Zn oxide may be used as the oxide 230.

As illustrated in FIG. 40A, the oxide 230 preferably includes the oxide 230*a* over the insulator 224, the oxide 230*b* over the oxide 230*a*, and the oxide 230*c* that is positioned over the oxide 230*b* and is at least partly in contact with a top surface of the oxide 230*b*. Here, a side surface of the oxide 230*c* is preferably provided in contact with the oxide 243*a*, the oxide 243*b*, the conductor 242*a*, the conductor 242*b*, the insulator 272, the insulator 273, and the insulator 280.

That is, the oxide 230 includes the oxide 230*a*, the oxide 230*b* over the oxide 230*a*, and the oxide 230*c* over the oxide 230*b*. Including the oxide 230*a* below the oxide 230*b* makes it possible to inhibit diffusion of impurities into the oxide 230*b* from the components formed below the oxide 230*a*. Moreover, including the oxide 230*c* over the oxide 230*b* makes it possible to inhibit diffusion of impurities into the oxide 230*b* from the components formed above the oxide 230*c*.

Note that the transistor 200 has a structure in which three layers of the oxide 230*a*, the oxide 230*b*, and the oxide 230*c* are stacked in the channel formation region and its vicinity; however, the present invention is not limited thereto. For example, a single layer of the oxide 230*b*, a two-layer structure of the oxide 230*b* and the oxide 230*a*, a two-layer structure of the oxide 230*b* and the oxide 230*c*, or a stacked-layer structure of four or more layers may be provided. For example, a four-layer structure including the oxide 230*c* with a two-layer structure may be provided.

In addition, the oxide 230 preferably has a stacked-layer structure with a plurality of oxides that differ in the atomic ratio of metal atoms. Specifically, the atomic ratio of the element M in the constituent elements in the metal oxide used as the oxide 230*a* is preferably greater than the atomic ratio of the element M in the constituent elements in the metal oxide used as the oxide 230*b*. Moreover, the atomic ratio of the element M to In in the metal oxide used as the oxide 230*a* is preferably greater than the atomic ratio of the element M to In in the metal oxide used as the oxide 230*b*. Furthermore, the atomic ratio of In to the element M in the metal oxide used as the oxide 230*b* is preferably greater than the atomic ratio of In to the element M in the metal oxide used as the oxide 230*a*. A metal oxide that can be used as the oxide 230*a* or the oxide 230*b* can be used as the oxide 230*c*.

Specifically, as the oxide 230*a*, a metal oxide having a composition of In:Ga:Zn=1:3:4 [atomic ratio] or the vicinity thereof or a composition of 1:1:0.5 [atomic ratio] or the vicinity thereof is used.

As the oxide 230*b*, a metal oxide having a composition of In:Ga:Zn=4:2:3 [atomic ratio] or the vicinity thereof or a composition of 1:1:1 [atomic ratio] or the vicinity thereof is used. As the oxide 230*b*, a metal oxide having a composition of In:Ga:Zn=5:1:3 [atomic ratio] or the vicinity thereof or a composition of In:Ga:Zn=10:1:3 [atomic ratio] or the vicinity thereof may be used as well. As the oxide 230*b*, an In—Zn oxide (e.g., a composition of In:Zn=2:1 [atomic ratio] or the vicinity thereof, a composition of In:Zn=5:1 [atomic ratio] or the vicinity thereof, or a composition of In:Zn=10:1 [atomic ratio] or the vicinity thereof) may be used as well. An In oxide may be used as the oxide 230*b*.

Furthermore, as the oxide 230*c*, a metal oxide having In:Ga:Zn=1:3:4 [atomic ratio or the composition in vicinity thereof], a composition of Ga:Zn=2:1 [atomic ratio] or the vicinity thereof, or a composition of Ga:Zn=2:5 [atomic ratio] or the vicinity thereof is preferably used. As the oxide 230*c*, a single layer or a stacked layer may be provided using a material that can be used as the oxide 230*b*. For example, in the case where the oxide 230*c* has a stacked-layer structure, the oxide 230*c* can specifically have a stacked-layer structure of a composition of In:Ga:Zn=4:2:3 [atomic ratio] or the vicinity thereof and a composition of In:Ga:Zn=1:3:4 [atomic ratio] or the vicinity thereof, a stacked-layer structure of a composition of Ga:Zn=2:1 [atomic ratio] or the vicinity thereof and a composition of In:Ga:Zn=4:2:3 [atomic ratio] or the vicinity thereof, a stacked-layer structure of a composition of Ga:Zn=2:5 [atomic ratio] or the vicinity thereof and a composition of In:Ga:Zn=4:2:3 [atomic ratio] or the vicinity thereof, a stacked-layer structure of gallium oxide and a composition of In:Ga:Zn=4:2:3 [atomic ratio] or the vicinity thereof, or the like.

Note that an OS transistor included in the memory cell 42 and an OS transistor included in the transistor layer 30 which are described in Embodiment 1 may be different in structure from each other. For example, as the oxide 230*c* included in the OS transistor provided in the memory cell 42, a metal oxide having a composition of In:Ga:Zn=4:2:3 [atomic ratio] or the vicinity thereof may be used, and as the oxide 230*c* included in the OS transistor provided in the transistor layer 30, a metal oxide having a composition of In:Ga:Zn=5:1:3 [atomic ratio] or the vicinity thereof, a composition of In:Ga:Zn=10:1:3 [atomic ratio] or the vicinity thereof, a composition of In:Zn=10:1 [atomic ratio] or the vicinity thereof, a composition of In:Zn=5:1 [atomic ratio] or the vicinity thereof, or a composition of In:Zn=2:1 [atomic ratio] or the vicinity thereof may be used.

The proportion of indium in the film for the oxide 230*b* and the oxide 230*c* is preferably increased, in which case the on-state current, the field-effect mobility, or the like of the transistor can be increased. Moreover, the above-described composition in the vicinity includes ±30% of the intended atomic ratio.

The oxide 230*b* may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230*b* by the source electrode or the drain electrode. In addition, the amount of oxygen extracted from the oxide 230*b* can be reduced even when heat treatment is performed; thus, the transistor 200 is stable at high temperatures (what is called thermal budget) in a manufacturing process.

The conductor 205 is provided to overlap with the oxide 230 and the conductor 260. Furthermore, the conductor 205 is preferably provided to be embedded in the insulator 216.

When the conductor 205 functions as a gate electrode, by changing a potential applied to the conductor 205 not in conjunction with but independently of a potential applied to the conductor 260, the threshold voltage (Vth) of the transistor 200 can be adjusted. In particular, by applying a negative potential to the conductor 205, Vth of the transistor 200 can be further increased, and the off-state current can be reduced. Thus, a drain current of the time when the potential applied to the conductor 260 is 0 V can be lower in the case where a negative potential is applied to the conductor 205 than in the case where the negative potential is not applied to the conductor 205.

As illustrated in FIG. 40A, the conductor 205 is preferably provided to be larger than a region of the oxide 230 that does not overlap with the conductor 242*a* or the conductor 242*b*. Although not illustrated, the conductor 205 preferably extends to a region outside the oxide 230*a* and the oxide 230*b* in the channel width direction of the oxide 230. That is, the conductor 205 and the conductor 260 preferably overlap with each other with the insulators therebetween on the outside of a side surface of the oxide 230 in the channel width direction. Providing the conductor 205 with a large area can reduce local charging (charge up) in a treatment using plasma of a manufacturing step after forming the conductor 205 in some cases. Note that one embodiment of the present invention is not limited thereto. The conductor 205 overlaps with at least the oxide 230 positioned between the conductor 242*a* and the conductor 242*b*.

When a bottom surface of the insulator 224 is used as a reference, the level of the bottom surface of the conductor 260 in a region where the oxide 230*a* and the oxide 230*b* do not overlap with the conductor 260 is preferably placed lower than the level of a bottom surface of the oxide 230*b*.

Although not illustrated, when the conductor 260 functioning as a gate covers, in the channel width direction, a side surface and the top surface of the oxide 230*b* serving as the channel formation region with the oxide 230*c* and the insulator 250 therebetween, electric fields generated from the conductor 260 are likely to affect the entire channel formation region in the oxide 230*b*. Thus, the on-state current of the transistor 200 can be increased and the frequency characteristics can be improved. In this specification, a transistor structure in which a channel formation region is electrically surrounded by electric fields of the conductor 260 and the conductor 205 is referred to as a surrounded channel (S-channel) structure.

The conductor 205*a* is preferably a conductor that inhibits passage of oxygen and impurities such as water or hydrogen. For example, titanium, titanium nitride, tantalum, or tantalum nitride can be used. Moreover, as the conductor 205*b*, a conductive material containing tungsten, copper, or aluminum as its main component is preferably used. Although the conductor 205 is illustrated as having two layers, a multilayer structure having three or more layers may be employed.

Here, it is preferable that an oxide semiconductor, an insulator or a conductor positioned in a layer below the oxide semiconductor, and an insulator or a conductor positioned in a layer above the oxide semiconductor be successively formed of different kinds of films without being exposed to the air, in which case a substantially highly purified intrinsic oxide semiconductor film where the concentration of impurities (in particular, hydrogen, water) is reduced can be deposited.

At least one of the insulator 222, the insulator 272, and the insulator 273 preferably functions as a barrier insulating film that inhibits impurities such as water or hydrogen from entering the transistor 200 from the substrate side or from above. Thus, at least one of the insulator 222, the insulator 272, and the insulator 273 is preferably formed using an insulating material which has a function of inhibiting diffusion of impurities (through which the impurities do not easily pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom. Alternatively, it is preferable to use an insulating material which has a function of inhibiting diffusion of oxygen (e.g., at least one of an oxygen atom, an oxygen molecule, and the like) (through which the above oxygen does not easily pass).

For example, it is preferable that the insulator 273 be formed using silicon nitride, silicon nitride oxide, or the like, and the insulator 222 and the insulator 272 be formed using aluminum oxide, hafnium oxide, or the like.

Accordingly, impurities such as water or hydrogen can be inhibited from being diffused to the transistor 200 side through the insulator 222. Alternatively, oxygen contained in the insulator 224 or the like can be inhibited from being diffused to the substrate side through the insulator 222.

Impurities such as water or hydrogen can be inhibited from being diffused to the transistor 200 side from the insulator 280 and the like, which are provided above the insulator 272 and the insulator 273. In this manner, the transistor 200 is preferably surrounded by the insulator 272 and the insulator 273 having a function of inhibiting diffusion of oxygen and impurities such as water or hydrogen.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like is used as appropriate as the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the number of released oxygen molecules is greater than or equal to $1.0\times10^{18}$ molecules/$cm^3$, preferably greater than or equal to $1.0\times10^{19}$ molecules/$cm^3$, further preferably greater than or equal to $2.0\times10^{19}$ molecules/$cm^3$ or greater than or equal to $3.0\times10^{20}$ molecules/$cm^3$ in thermal desorption spectroscopy analysis (TDS analysis). Note that the temperature of the film surface in the TDS analysis is preferably within the range of higher than or equal to 100° C. and lower than or equal to 700° C., or higher than or equal to 100° C. and lower than or equal to 400° C.

The insulator 222 preferably functions as a barrier insulating film that inhibits impurities such as water or hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 283 can inhibit entry of impurities such as water or hydrogen into the transistor 200 from the outside.

Furthermore, it is preferable that the insulator 222 have a function of inhibiting diffusion of oxygen (e.g., at least one of an oxygen atom, an oxygen molecule, and the like) (through which the above oxygen does not easily pass). For example, the insulator 222 preferably has lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Moreover, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 222. In the case where the insulator 222 has stacked layers, three layers of zirconium oxide, aluminum oxide, and zirconium oxide stacked in this order, or four layers of zirconium oxide, aluminum oxide, zirconium oxide, and aluminum oxide stacked in this order can be employed, for example. As the insulator 222, a compound containing hafnium and zirconium or the like may be employed. When the semiconductor device is miniaturized and highly integrated, a dielectric used for a gate insulator and a capacitive element become thin, which might cause a problem of a leakage current from a transistor and the capacitive element. When a high-k material is used as an insulator functioning as a dielectric used for a gate insulator and a capacitive element, a gate potential during operation of the transistor can be lowered and the capacitance of the capacitive element can be assured while the physical thickness is maintained.

Note that the insulator 222 and the insulator 224 may have a stacked-layer structure of two or more layers. In such cases, without limitation to a stacked-layer structure formed of the same material, a stacked-layer structure formed of different materials may be employed.

The oxide 243 (the oxide 243*a* and the oxide 243*b*) may be provided between the oxide 230*b* and the conductor 242 (the conductor 242*a* and the conductor 242*b*) which functions as the source electrode or the drain electrode. This structure in which the conductor 242 and the oxide 230*b* are not in contact with each other can inhibit the conductor 242 from absorbing oxygen in the oxide 230*b*. That is, preventing oxidation of the conductor 242 can inhibit the decrease in conductivity of the conductor 242. Thus, the oxide 243 preferably has a function of inhibiting oxidation of the conductor 242.

It is preferable to provide the oxide 243 having a function of inhibiting passage of oxygen between the oxide 230*b* and the conductor 242, which functions as the source electrode and the drain electrode, in which case the electrical resistance between the conductor 242 and the oxide 230*b* is reduced. Such a structure improves the electrical characteristics of the transistor 200 and the reliability of the transistor 200.

As the oxide 243, a metal oxide including the element M, which is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like, may be used. In particular, aluminum, gallium, yttrium, or tin is preferably used as the element M. The concentration of the element M in the oxide 243 is preferably higher than that in the oxide 230*b*. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230*b*. The thickness of the oxide 243 is preferably larger than or equal to 0.5 nm and smaller than or equal to 5 nm, further preferably larger than or equal to 1 nm and smaller than or equal to 3 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Note that the oxide 243 is not necessarily provided. In that case, contact between the conductor 242 (the conductor 242*a* and the conductor 242*b*) and the oxide 230 may make oxygen in the oxide 230 diffuse into the conductor 242, resulting in oxidation of the conductor 242. It is highly possible that oxidation of the conductor 242 lowers the conductivity of the conductor 242. Note that diffusion of oxygen in the oxide 230 into the conductor 242 can be rephrased as absorption of oxygen in the oxide 230 by the conductor 242.

When oxygen in the oxide 230 diffuses into the conductor 242 (the conductor 242*a* and the conductor 242*b*), another layer is sometimes formed between the conductor 242*a* and the oxide 230*b*, and between the conductor 242*b* and the oxide 230*b*. The layer contains more oxygen than the conductor 242 does and thus the layer presumably has an insulating property. In this case, a three-layer structure of the conductor 242, the layer, and the oxide 230*b* can be regarded as a three-layer structure of metal-insulator-semiconductor and is sometimes referred to as an MIS (Metal-Insulator-Semiconductor) structure or a diode junction structure having an MIS structure as its main part.

The above-described layer is not necessarily formed between the conductor 242 and the oxide 230*b*, and the layer may be formed between the conductor 242 and the oxide 230*c* or formed between the conductor 242 and the oxide 230*b* and between the conductor 242 and the oxide 230*c*.

The conductor 242 (the conductor 242*a* and the conductor 242*b*) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above-described metal element; an alloy containing a combination of the above-described metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 272 is provided in contact with a top surface of the conductor 242 and preferably functions as a barrier layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 preferably has a function of inhibiting diffusion of oxygen. For example, the insulator 272 preferably has a function of further inhibiting diffusion of oxygen as compared to the insulator 280. An insulator containing an oxide of one or both of aluminum and hafnium is preferably deposited as the insulator 272, for example. An insulator containing aluminum nitride may be used as the insulator 272, for example.

The insulator 272 is in contact with part of a top surface of the conductor 242*b* and a side surface of the conductor 242*b*. Although not illustrated, the insulator 272 is in contact with part of a top surface of the conductor 242*a* and a side surface of the conductor 242*a*. The insulator 273 is provided over the insulator 272. Thus, oxygen added to the insulator 280 can be inhibited from being absorbed by the conductor 242.

The insulator 250 functions as a gate insulator. The insulator 250 is preferably positioned in contact with a top surface of the oxide 230*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230*c*, oxygen can be effectively supplied to the channel formation region of the oxide 230*b*. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above-described metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

Although the conductor 260 has a two-layer structure in FIG. 40A, the conductor 260 may have a single-layer structure or a stacked-layer structure of three or more layers.

For the conductor 260*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$), and a copper atom. Alternatively, it is preferable to use a conductive material having a function of inhibiting diffusion of oxygen (e.g., at least one of an oxygen atom, an oxygen molecule, and the like).

In addition, when the conductor 260*a* has a function of inhibiting diffusion of oxygen, the conductivity of the conductor 260*b* can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used as the conductor 260*b*. The conductor 260 also functions as a wiring and thus is preferably formed using a conductor having high conductivity. For example, a conductive material containing tungsten, copper, or aluminum as its main component can be used. The conductor 260*b* may have a stacked-layer structure, for example, a stacked-layer structure of the above-described conductive material and titanium or titanium nitride.

<<Metal Oxide>>

As the oxide 230, a metal oxide functioning as an oxide semiconductor is preferably used. A metal oxide that can be used for the oxide 230 of the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is considered. In particular, aluminum, gallium, yttrium, or tin is preferably used as the element M.

Note that in this specification and the like, a metal oxide containing nitrogen is also referred to as a metal oxide in some cases. A metal oxide containing nitrogen may be referred to as a metal oxynitride.

<Transistor 300>

The transistor 300 is described with reference to FIG. 40B. The transistor 300 is provided on the semiconductor substrate 311 and includes a conductor 316 functioning as a gate, an insulator 315 functioning as a gate insulator, a semiconductor region 313 that is a part of the semiconductor substrate 311, and a low-resistance region 314*a* and a low-resistance region 314*b* functioning as a source region and a drain region. The transistor 300 may be a p-channel transistor or an n-channel transistor.

Figure 40B:
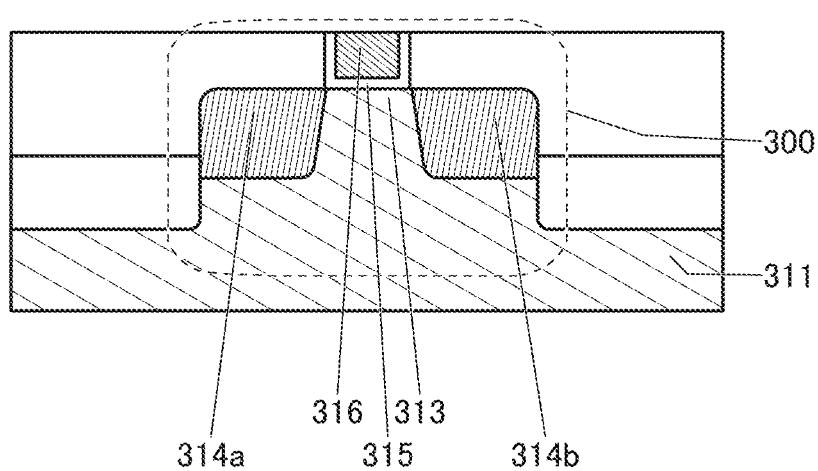

Here, in the transistor 300 illustrated in FIG. 40B, the semiconductor region 313 (part of the semiconductor substrate 311) where the channel is formed has a convex shape. Furthermore, although not illustrated, the conductor 316 is provided so as to cover a side surface and a top surface of the semiconductor region 313 with the insulator 315 therebetween. Note that a material adjusting the work function may be used as the conductor 316. Such a transistor 300 is also referred to as a FIN-type transistor because it utilizes a convex portion of the semiconductor substrate 311. Note that an insulator functioning as a mask for forming the convex portion may be included in contact with an upper portion of the convex portion. Furthermore, although the case where the convex portion is formed by processing part of the semiconductor substrate 311 is described here, a semiconductor film having a convex shape may be formed by processing an SOI substrate.

Note that the transistor 300 illustrated in FIG. 40B is an example and the structure is not limited thereto; an appropriate transistor is used in accordance with a circuit structure or a driving method.

<Memory Device 420>

Figure 41A:
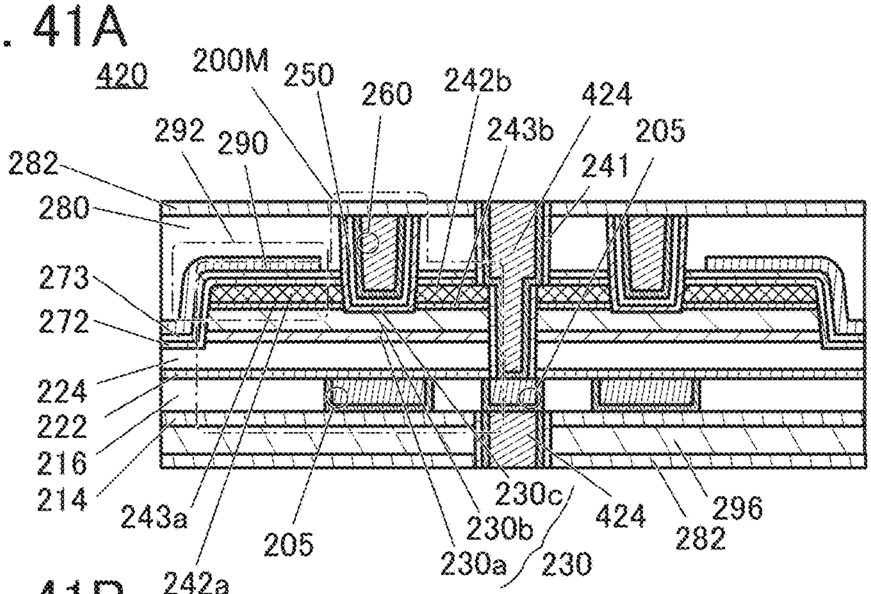
FIG. 41A, FIG. 41B, and FIG. 41C are schematic cross-sectional views illustrating structure examples of semiconductor devices.

Next, the memory device 420 illustrated in FIG. 39 is described with reference to FIG. 41A. As for the transistor 200M included in the memory device 420, the description overlapping with that of the transistor 200 is omitted.

In the memory device 420, the conductor 242*a* of the transistor 200M functions as one electrode of the capacitor 292, and the insulator 272 and the insulator 273 function as a dielectric. A conductor 290 is provided to overlap with the conductor 242*a* with the insulator 272 and the insulator 273 sandwiched therebetween and functions as the other electrode of the capacitor 292. The conductor 290 may be used as the other electrode of the capacitor 292 included in an adjacent memory device 420. Alternatively, the conductor 290 may be electrically connected to the conductor 290 included in an adjacent memory device 420.

The conductor 290 is also provided on the top surface of the conductor 242*a* and the side surface of the conductor 242*a* with the insulator 272 and the insulator 273 sandwiched therebetween. This is preferable because the capacitor 292 can have a larger capacitance than the capacitance obtained by the area where the conductor 242*a* and the conductor 290 overlap with each other.

The conductor 424 is electrically connected to the conductor 242*b* and is electrically connected to the conductor 424 positioned in a lower layer through the conductor 205.

As a dielectric of the capacitor 292, silicon nitride, silicon nitride oxide, aluminum oxide, hafnium oxide, or the like can be used. Furthermore, these materials can be stacked. In the case where the dielectric of the capacitor 292 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the dielectric of the capacitor 292, zirconium oxide having a higher permittivity than the above-described materials may be used. As the dielectric of the capacitor 292, a single layer of zirconium oxide may be used, or zirconium oxide may be used in part of stacked layers. For example, stacked layers of zirconium oxide and aluminum oxide can be used. Furthermore, the dielectric of the capacitor 292 may be three stacked layers; zirconium oxide may be used as the first layer and the third layer and aluminum oxide may be used as the second layer between the first layer and the third layer.

When zirconium oxide having a high permittivity is used as the dielectric of the capacitor 292, the area occupied by the capacitor 292 in the memory device 420 can be reduced. Thus, the area necessary for the memory device 420 can be reduced, and the bit cost can be improved, which is preferable.

As the conductor 290, any of the materials that can be used as the conductor 205, the conductor 242, the conductor 260, the conductors 424, and the like can be used.

This embodiment shows an example where the transistors 200M and the capacitors 292 are symmetrically provided with the conductors 424 sandwiched therebetween. When a pair of transistors 200M and a pair of capacitors 292 are provided in this manner, the number of conductors 424 electrically connected to the transistor 200M can be reduced. Thus, the area necessary for the memory device 420 can be reduced, and the bit cost can be improved, which is preferable.

In the case where the insulator 241 is provided on the side surface of the conductor 424, the conductor 424 is connected to at least part of the top surface of the conductor 242*b*.

With the use of the conductor 424 and the conductor 205, the transistor 200T and the memory device 420 in the memory unit 470 can be electrically connected to each other.

Modification Example 1 of Memory Device 420

Figure 41B:
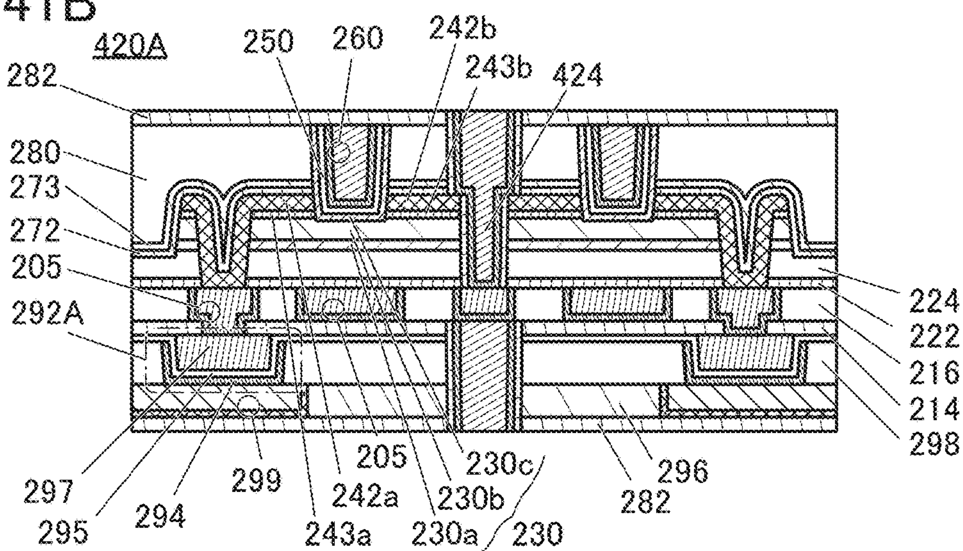

Next, with reference to FIG. 41B, a memory device 420A is described as a modification example of the memory device 420. The memory device 420A includes, in addition to the transistor 200M illustrated in FIG. 41A, a capacitor 292A electrically connected to the transistor 200M. The capacitor 292A is provided below the transistor 200M.

In the memory device 420A, the conductor 242*a* is provided in an opening that is provided in the oxide 243*a*, the oxide 230*b*, the oxide 230*a*, the insulator 224, and the insulator 222 and is electrically connected to the conductor 205 at a bottom portion of the opening. The conductor 205 is electrically connected to the capacitor 292A.

The capacitor 292A includes a conductor 294 functioning as one of electrodes, an insulator 295 functioning as a dielectric, and a conductor 297 functioning as the other of the electrodes. The conductor 297 overlaps with the conductor 294 with the insulator 295 sandwiched therebetween. Furthermore, the conductor 297 is electrically connected to the conductor 205.

The conductor 294 is provided in a bottom portion and on a side surface of an opening formed in an insulator 298 provided over the insulator 296, and the insulator 295 is provided so as to cover the insulator 298 and the conductor 294. Furthermore, the conductor 297 is provided so as to be embedded in a concave portion that the insulator 295 has.

Furthermore, a conductor 299 is provided so as to be embedded in the insulator 296, and the conductor 299 is electrically connected to the conductor 294. The conductor 299 may be electrically connected to the conductor 294 of an adjacent memory device 420A.

The conductor 297 is also provided on a top surface of the conductor 294 and a side surface of the conductor 294 with the insulator 295 sandwiched therebetween. This is preferable because the capacitor 292A can have a larger capacitance than the capacitance obtained by the area where the conductor 294 and the conductor 297 overlap with each other.

As the insulator 295 functioning as a dielectric of the capacitor 292A, silicon nitride, silicon nitride oxide, aluminum oxide, hafnium oxide, or the like can be used. Furthermore, these materials can be stacked. In the case where the insulator 295 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the insulator 295, zirconium oxide having a higher permittivity than the above-described materials may be used. As the insulator 295, a single layer of zirconium oxide may be used, or zirconium oxide may be used in part of stacked layers. For example, stacked layers of zirconium oxide and aluminum oxide can be used. Furthermore, the insulator 295 may be three stacked layers; zirconium oxide may be used as the first layer and the third layer and aluminum oxide may be used as the second layer between the first layer and the third layer.

When zirconium oxide having a high permittivity is used as the insulator 295, the area occupied by the capacitor 292A in the memory device 420A can be reduced. Thus, the area necessary for the memory device 420A can be reduced, and the bit cost can be improved, which is preferable.

As the conductor 297, the conductor 294, and the conductor 299, any of the materials that can be used as the conductor 205, the conductor 242, the conductor 260, the conductors 424, and the like can be used.

Furthermore, as the insulator 298, any of the materials that can be used as the insulator 214, the insulator 216, the insulator 224, the insulator 280, and the like can be used.

Modification Example 2 of Memory Device 420

Figure 41C:
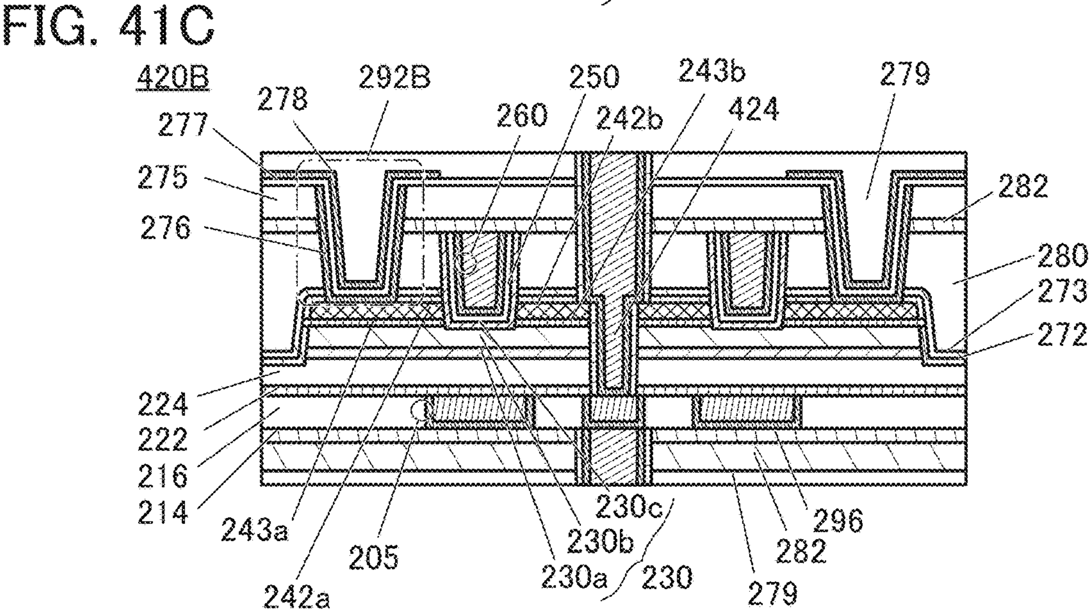

Next, with reference to FIG. 41C, a memory device 420B is described as a modification example of the memory device 420. The memory device 420B includes, in addition to the transistor 200M illustrated in FIG. 41A, a capacitor 292B electrically connected to the transistor 200M. The capacitor 292B is provided above the transistor 200M.

The capacitor 292B includes a conductor 276 functioning as one of electrodes, an insulator 277 functioning as a dielectric, and a conductor 278 functioning as the other of the electrodes. The conductor 278 overlaps with the conductor 276 with the insulator 277 sandwiched therebetween.

An insulator 275 is provided over the insulator 282, and the conductor 276 is provided in a bottom portion and on a side surface of an opening formed in the insulator 275, the insulator 282, the insulator 280, the insulator 273, and the insulator 272. The insulator 277 is provided so as to cover the insulator 282 and the conductor 276. Furthermore, the conductor 278 is provided so as to overlap with the conductor 276 in a concave portion that the insulator 277 has, and at least part of the conductor 278 is provided over the insulator 275 with the insulator 277 therebetween. The conductor 278 may be used as the other electrode of the capacitor 292B included in an adjacent memory device 420B. Alternatively, the conductor 278 may be electrically connected to the conductor 278 included in an adjacent memory device 420B.

The conductor 278 is also provided on a top surface of the conductor 276 and a side surface of the conductor 276 with the insulator 277 sandwiched therebetween. This is preferable because the capacitor 292B can have a larger capacitance than the capacitance obtained by the area where the conductor 276 and the conductor 278 overlap with each other.

An insulator 279 may be provided so as to fill the concave portion that the conductor 278 has.

As the insulator 277 functioning as a dielectric of the capacitor 292B, silicon nitride, silicon nitride oxide, aluminum oxide, hafnium oxide, or the like can be used. Furthermore, these materials can be stacked. In the case where the insulator 277 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the insulator 277, zirconium oxide having a higher permittivity than the above-described materials may be used. As the insulator 277, a single layer of zirconium oxide may be used, or zirconium oxide may be used in part of stacked layers. For example, stacked layers of zirconium oxide and aluminum oxide can be used. Furthermore, the insulator 277 may be three stacked layers; zirconium oxide may be used as the first layer and the third layer and aluminum oxide may be used as the second layer between the first layer and the third layer.

When zirconium oxide having a high permittivity is used as the insulator 277, the area occupied by the capacitor 292B in the memory device 420B can be reduced. Thus, the area necessary for the memory device 420B can be reduced, and the bit cost can be improved, which is preferable.

As the conductor 276 and the conductor 278, any of the materials that can be used as the conductor 205, the conductor 242, the conductor 260, the conductors 424, and the like can be used.

Furthermore, as the insulator 275 and the insulator 279, any of the materials that can be used as the insulator 214, the insulator 216, the insulator 224, the insulator 280, and the like can be used.

<Connection Between Memory Device 420 and Transistor 200T>

In a region 422 surrounded by a dashed-dotted line in FIG. 39, the memory device 420 is electrically connected to the gate of the transistor 200T through the conductor 424 and the conductor 205; however, this embodiment is not limited thereto.

Figure 42:
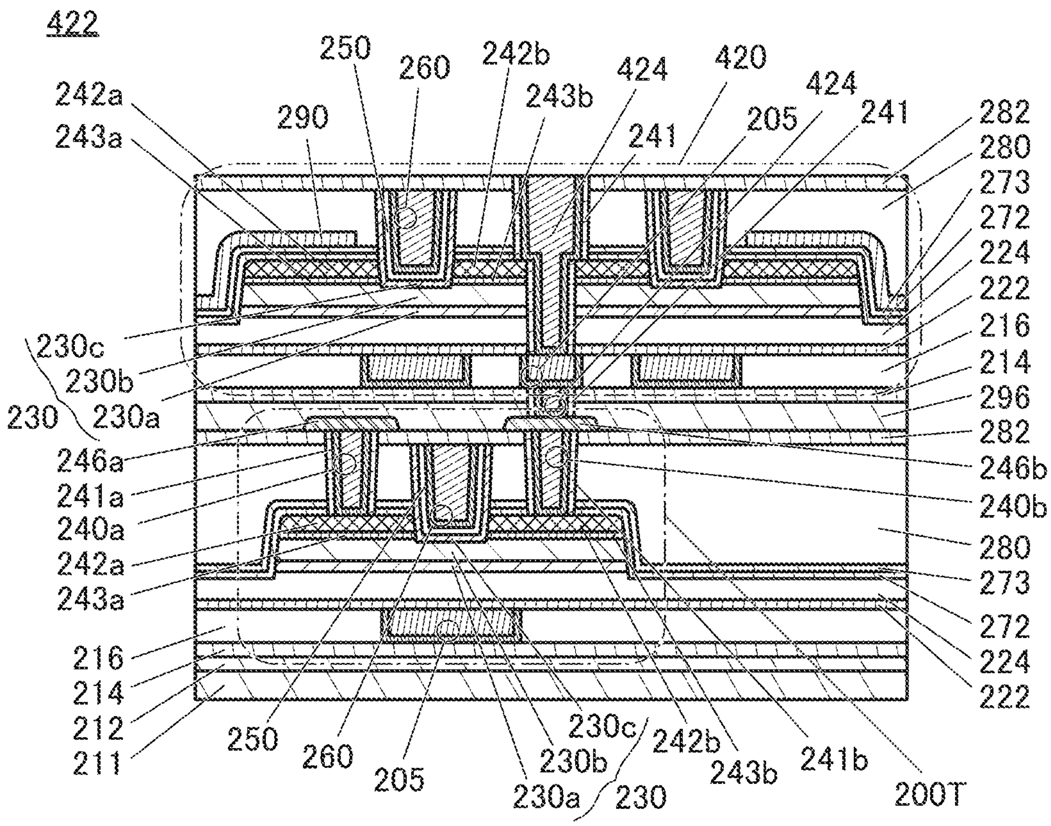
FIG. 42 is a schematic cross-sectional view illustrating a structure example of a semiconductor device.

FIG. 42 illustrates an example where the memory device 420 is electrically connected to the conductor 242*b* functioning as one of the source and the drain of the transistor 200T through the conductor 424, the conductor 205, the conductor 246*b*, and the conductor 240*b*.

Thus, the method for connection between the memory device 420 and the transistor 200T can be determined in accordance with the function of the circuit included in the transistor layer 413.

Figure 43:
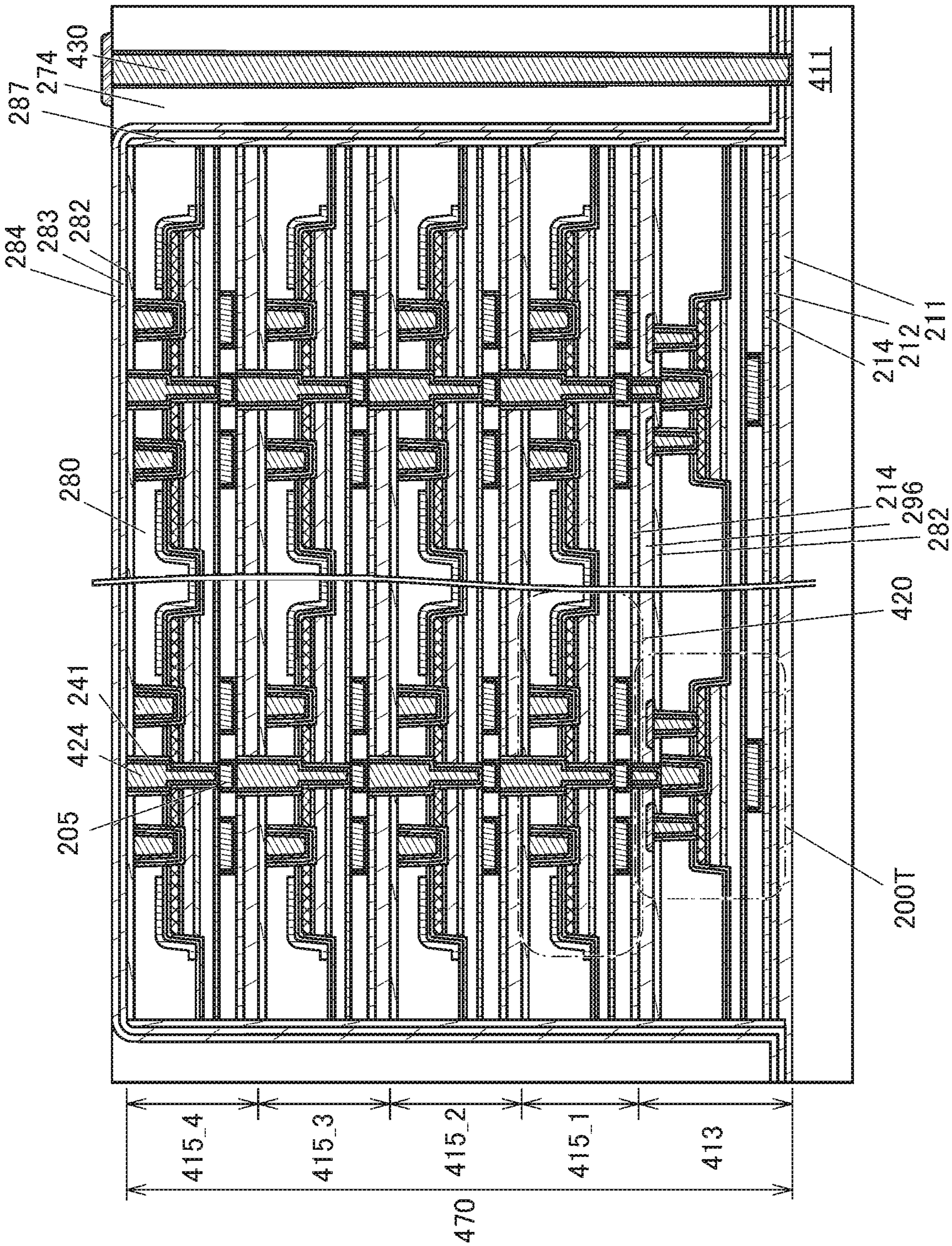
FIG. 43 is a schematic cross-sectional view illustrating a structure example of a semiconductor device.

FIG. 43 illustrates an example where the memory unit 470 includes the transistor layer 413 including the transistor 200T and four memory device layers 415 (the memory device layer 415_1 to the memory device layer 415_4).

The memory device layer 415_1 to the memory device layer 415_4 each include a plurality of memory devices 420.

The memory device 420 is electrically connected to the memory devices 420 included in different memory device layers 415 and the transistor 200T included in the transistor layer 413 through the conductors 424 and the conductors 205.

The memory unit 470 is sealed by the insulator 211, the insulator 212, the insulator 214, the insulator 287, the insulator 282, the insulator 283, and the insulator 284. The insulator 274 is provided in the periphery of the insulator 284. Furthermore, the conductor 430 is provided in the insulator 274, the insulator 284, the insulator 283, and the insulator 211 and is electrically connected to the element layer 411.

The insulator 280 is provided inside the sealing structure. The insulator 280 has a function of releasing oxygen by heating. Alternatively, the insulator 280 includes an excess oxygen region.

The insulator 211, the insulator 283, and the insulator 284 are suitably a material having a high blocking property against hydrogen. The insulator 214, the insulator 282, and the insulator 287 are suitably a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

A barrier property in this specification means a function of inhibiting diffusion of a particular substance (also referred to as low transmission capability). Alternatively, a barrier property in this specification means a function of capturing and fixing (also referred to as gettering) a particular substance.

Note that materials for the insulator 211, the insulator 212, the insulator 214, the insulator 287, the insulator 282, the insulator 283, and the insulator 284 may have an amorphous or crystalline structure, although the crystal structure of the materials is not particularly limited. For example, an amorphous aluminum oxide film is suitably used as the material having a function of capturing or fixing hydrogen. Amorphous aluminum oxide may capture or fix hydrogen more than aluminum oxide having high crystallinity.

Here, as the model of excess oxygen in the insulator 280 with respect to diffusion of hydrogen from an oxide semiconductor in contact with the insulator 280, the following model can be given.

Hydrogen existing in the oxide semiconductor diffuses, through the insulator 280 in contact with the oxide semiconductor, into another structure body. The hydrogen diffuses in such a manner that excess oxygen in the insulator 280 reacts with the hydrogen in the oxide semiconductor to form an OH bond, which diffuses through the insulator 280. The hydrogen atom having the OH bond reacts with the oxygen atom bonded to an atom (e.g., a metal atom or the like) in the insulator 282 when reaching a material having a function of capturing or fixing hydrogen (typically the insulator 282), and is captured or fixed in the insulator 282. The oxygen atom which had the OH bond of the excess oxygen is assumed to remain as excess oxygen in the insulator 280. In short, the excess oxygen in the insulator 280 probably serves a bridge linking role in diffusing the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment time is one hour or more, preferably four hours or more, further preferably eight hours or more.

The heat treatment enables diffusion of hydrogen from the oxide semiconductor to the outside through the insulator 280, the insulator 282, and the insulator 287. This can reduce the absolute amount of hydrogen in and in the vicinity of the oxide semiconductor.

The insulator 283 and the insulator 284 are formed after the heat treatment. The insulator 283 and the insulator 284 are materials having a high blocking property against hydrogen. Thus, the insulator 283 and the insulator 284 can inhibit hydrogen diffused to the outside or external hydrogen from entering the inside, specifically, the oxide semiconductor or the insulator 280 side.

Although the structure in which the heat treatment is performed after the insulator 282 is formed is described as an example, there is no limitation to the structure. For example, after the formation of the transistor layer 413 or after the formation of the memory device layer 415_1 to the memory device layer 415_3, the above-described heat treatment may be performed. When hydrogen is diffused to the outside by the above-described heat treatment, hydrogen is diffused to above the transistor layer 413 or in the lateral direction. Similarly, in the case where the heat treatment is performed after the formation of the memory device layer 415_1 to the memory device layer 415_3, hydrogen is diffused to above or in the lateral direction.

The above-described manufacturing process yields the above-described sealing structure by bonding the insulator 211 and the insulator 283.

The above-described structure and manufacturing process enable a semiconductor device using an oxide semiconductor with reduced hydrogen concentration. Accordingly, a highly reliable semiconductor device can be provided. With one embodiment of the present invention, a semiconductor device having favorable electrical characteristics can be provided.

Figures 44A, 44B, 44C:
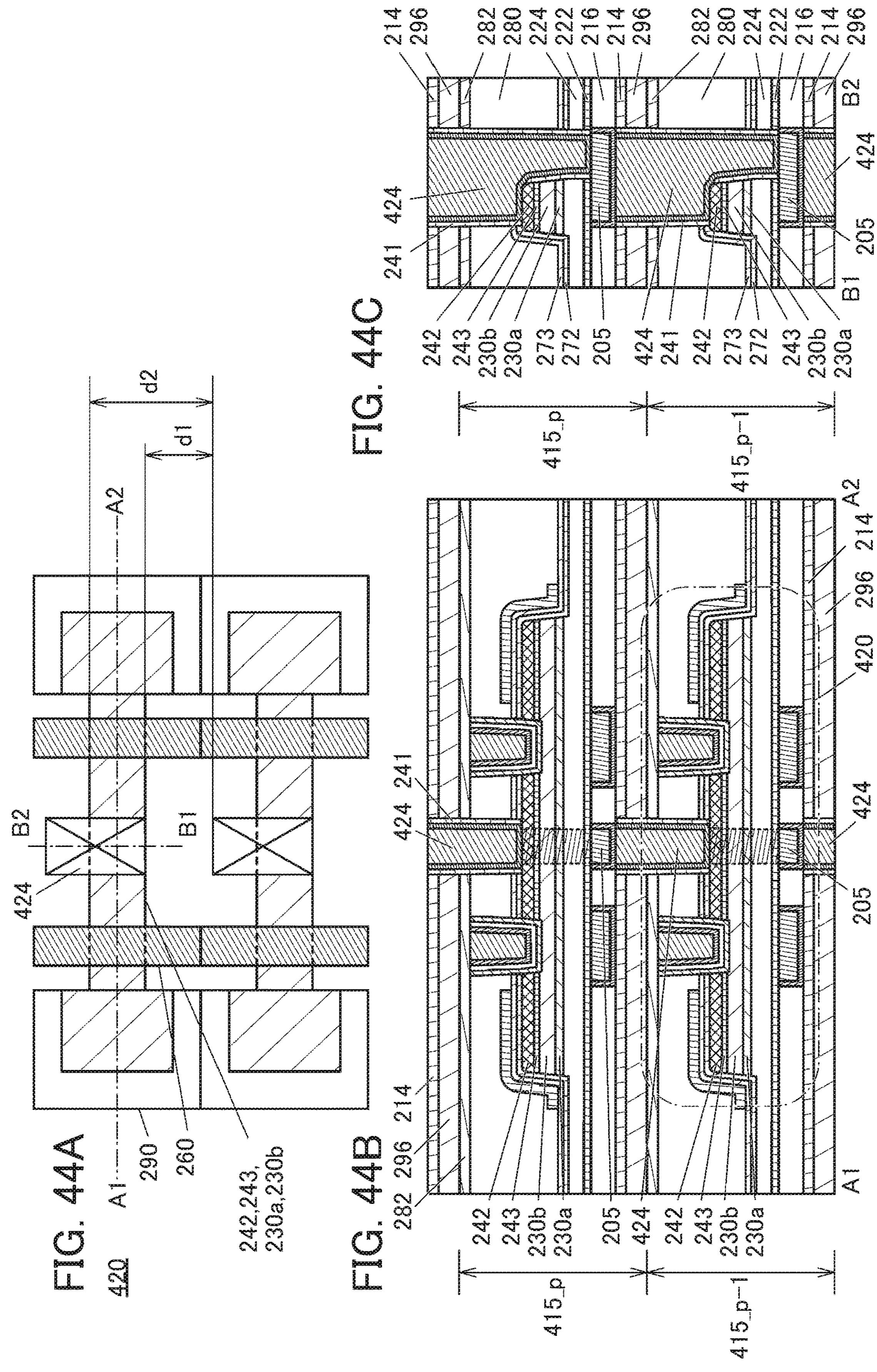
FIG. 44A, FIG. 44B, and FIG. 44C are a top view and schematic cross-sectional views illustrating a structure example of a semiconductor device.

FIG. 44A to FIG. 44C are diagrams illustrating an example of a different arrangement of the conductors 424. FIG. 44A illustrates a layout view of the memory device 420 when seen from above, FIG. 44B is a cross-sectional view of a portion indicated by a dashed-dotted line A1-A2 in FIG. 44A, and FIG. 44C is a cross-sectional view of a portion indicated by a dashed-dotted line B1-B2 in FIG. 44A. In FIG. 44A, the conductor 205 is not illustrated to facilitate understanding of the drawing. In the case where the conductor 205 is provided, the conductor 205 includes a region overlapping with the conductor 260 and the conductor 424.

As illustrated in FIG. 44A, an opening where the conductor 424 is provided, that is, the conductor 424 is provided in not only a region overlapping with the oxide 230*a* and the oxide 230*b* but also the outside of the oxide 230*a* and the oxide 230*b*. FIG. 44A illustrates an example where the conductor 424 is provided to extend beyond the oxide 230*a* and the oxide 230*b* to the B2 side; however, this embodiment is not limited thereto. The conductor 424 may be provided to extend beyond the oxide 230*a* and the oxide 230*b* to the B1 side, or to both the B1 side and the B2 side.

FIG. 44B and FIG. 44C illustrate an example where the memory device layer 415_*p* is stacked over the memory device layer 415_*p*−1 (p is a natural number greater than or equal to 2 and less than or equal to n). The memory device 420 included in the memory device layer 415_*p*−1 is electrically connected to the memory device 420 included in the memory device layer 415_*p* through the conductor 424 and the conductor 205.

FIG. 44B illustrates an example where in the memory device layer 415_*p*−1, the conductor 424 is connected to the conductor 242 of the memory device layer 415_*p*−1 and the conductor 205 of the memory device layer 415_*p*. Here, the conductor 424 is also connected to the conductor 205 of the memory device layer 415_*p*−1 at the outside on the B2 side of the conductor 242, the oxide 243, the oxide 230*b*, and the oxide 230*a*.

As illustrated in FIG. 44C, the conductor 424 is formed along the side surfaces on the B2 side of the conductor 242, the oxide 243, the oxide 230*b*, and the oxide 230*a*, and is electrically connected to the conductor 205 through an opening formed in the insulator 280, the insulator 273, the insulator 272, the insulator 224, and the insulator 222. Here, the state where the conductor 424 is provided along the side surfaces on the B2 side of the conductor 242, the oxide 243, the oxide 230*b*, and the oxide 230*a* is indicated by a dotted line in FIG. 44B. Furthermore, the insulator 241 is formed between the conductor 424 and the side surfaces on the B2 side of the conductor 242, the oxide 243, the oxide 230*b*, the oxide 230*a*, the insulator 224, and the insulator 222, in some cases.

Provision of the conductor 424 in a region not overlapping with the conductor 242 or the like allows the memory device 420 to be electrically connected to the memory device 420 provided in another memory device layer 415. In addition, the memory device 420 can also be electrically connected to the transistor 200T provided in the transistor layer 413.

Furthermore, when the conductor 424 serves as a bit line, provision of the conductor 424 in a region not overlapping with the conductor 242 or the like can increase the distance between bit lines of the memory devices 420 that are adjacent to each other in the B1-B2 direction. As illustrated in FIG. 44, the distance between the conductors 424 over the conductors 242 is d1; the distance between the conductors 424 positioned below the oxide 230*a*, that is, in an opening formed in the insulator 224 and the insulator 222 is d2; and d2 is larger than d1. The parasitic capacitance of the conductors 424 can be reduced when the distance is partly d2 compared with the case where the distance between the conductors 424 that are adjacent to each other in the B1-B2 direction is d1. The reduction of the parasitic capacitance of the conductors 424 is preferable to reduce the capacitance necessary for the capacitor 292.

In the memory device 420, the conductor 424 functioning as a common bit line for two memory cells is provided. The cell size of each memory cell can be reduced by appropriately adjusting the permittivity of the dielectric used in the capacitor or the parasitic capacitance between bit lines. Here, the estimation of the cell size, the bit density, and the bit cost of the memory cell when the channel length is 30 nm (also referred to as 30 nm node) is described. In FIG. 45A to FIG. 45D described below, the conductor 205 is not illustrated to facilitate understanding of the drawings. In the case where the conductor 205 is provided, the conductor 205 includes a region overlapping with the conductor 260 and the conductor 424.

Figures 45A, 45B, 45C, 45D:
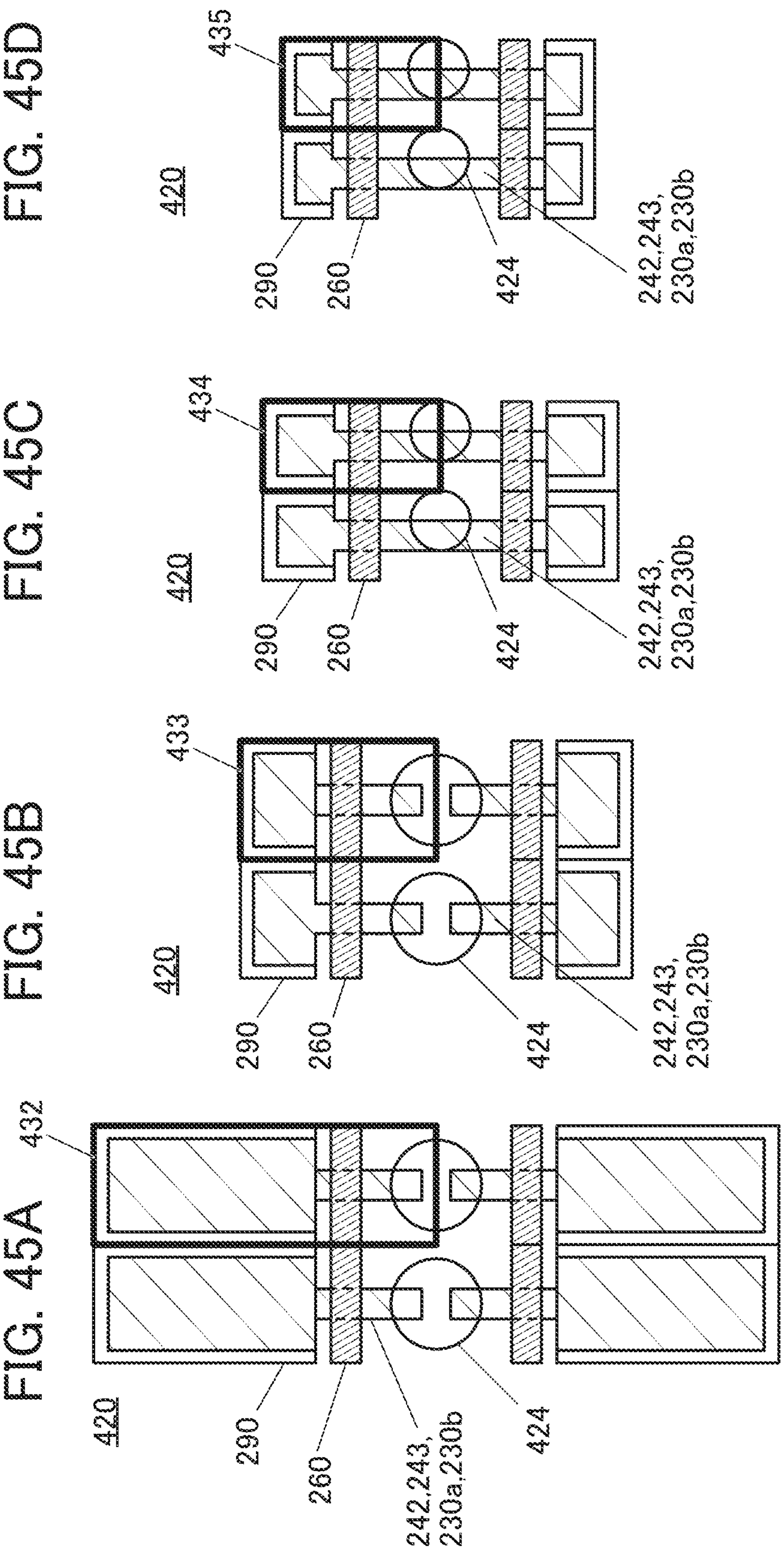
FIG. 45A, FIG. 45B, FIG. 45C, and FIG. 45D are top views for describing structure examples of a semiconductor device.

FIG. 45A illustrates an example where hafnium oxide with a thickness of 10 nm and 1-nm silicon oxide thereover are stacked as the dielectric of the capacitor; a slit is provided in the conductor 242, the oxide 243, the oxide 230*a*, and the oxide 230*b* between the memory cells included in the memory device 420; and the conductor 424 functioning as the bit line is provided so as to overlap with the conductor 242 and the slit. A memory cell 432 obtained in this manner is referred to as a cell A.

The cell size of the cell A is 45.25 $F^2$.

FIG. 45B illustrates an example where a first zirconium oxide, an aluminum oxide thereover, and a second zirconium oxide thereover are stacked as the dielectric of the capacitor; a slit is provided in the conductor 242, the oxide 243, the oxide 230*a*, and the oxide 230*b* between the memory cells included in the memory device 420; and the conductor 424 functioning as the bit line is provided so as to overlap with the conductor 242 and the slit. A memory cell 433 obtained in this manner is referred to as a cell B.

The dielectric used for the capacitor of the cell B has a higher permittivity than that for the cell A; thus, the area of the capacitor can be reduced in the cell B. Therefore, the cell size of the cell B can be reduced compared with that of the cell A. The cell size of the cell B is 25.53 $F^2$.

The cell A and the cell B correspond to the memory cells included in the memory device 420, the memory device 420A, or the memory device 420B illustrated in FIG. 39, FIG. 41A to FIG. 41C, and FIG. 42.

FIG. 45C illustrates an example where a first zirconium oxide, an aluminum oxide thereover, and a second zirconium oxide thereover are stacked as the dielectric of the capacitor;

the conductor 242, the oxide 243, the oxide 230*a*, and the oxide 230*b* included in the memory device 420 are shared by the memory cells; and the conductor 424 functioning as the bit line is provided so as to overlap with a portion overlapping with the conductor 242 and a portion outside the conductor 242. A memory cell 434 obtained in this manner is referred to as a cell C.

The distance between the conductors 424 in the cell C is longer below the oxide 230*a* than above the conductor 242. Therefore, the parasitic capacitance of the conductors 424 can be reduced and the area of the capacitors can be reduced. Furthermore, the conductor 242, the oxide 243, the oxide 230*a*, and the oxide 230*b* are not provided with a slit. Thus, the cell size can be reduced in the cell C compared with the cell A and the cell B. The cell size of the cell C is 17.20 $F^2$.

FIG. 45D illustrates an example where the conductor 205 and the insulator 216 are not provided in the cell C. Such a memory cell 435 is referred to as a cell D.

Since the conductor 205 and the insulator 216 are not provided in the cell D, the memory device 420 can be thinned. Therefore, the memory device layer 415 including the memory device 420 can be thinned, so that the height of the memory unit 470 in which a plurality of memory device layers 415 are stacked can be reduced. When the conductors 424 and the conductors 205 are regarded as a bit line, the bit line can be shortened in the memory unit 470. The shortened bit line can reduce the parasitic load in the bit line and further reduce the parasitic capacitance of the conductors 424; accordingly, the area of the capacitor can be reduced. In addition, the conductor 242, the oxide 243, the oxide 230*a*, and the oxide 230*b* are not provided with a slit. As described above, the cell size of the cell D can be reduced compared with the cell A, the cell B, and the cell C. The cell size of the cell D is 15.12 $F^2$.

The cell C and the cell D correspond to the memory cell included in the memory device 420 illustrated in FIG. 44A to FIG. 44C.

Here, the bit density and the bit cost $C_b$ of the cell A to the cell D and a cell E, which is the cell D capable of multi-level storage, were estimated. Moreover, the estimated bit density and bit cost were compared with expected values of bit density and bit cost of currently commercially available DRAMs.

The bit cost $C_b$ in the semiconductor device of one embodiment of the present invention was estimated using Formula 1.

[Formula 1]

Here, n is the number of stacked memory device layers, $P_c$ is the number of patterning times mainly for the element layer 411 as a common portion, $P_s$ is the number of patterning times per memory device layer 415 and transistor layer 413, $D_d$ is the bit density of a DRAM, $D_{3d}$ is the bit density of one memory device layer 415, and $P_d$ is the number of patterning times for a DRAM. Note that $P_d$ includes the number of times increased by scaling.

Table 1 shows expected values of bit density of commercially available DRAMs and estimated bit density of semiconductor devices of one embodiment of the present invention. Note that two types of commercially available DRAMs with process nodes of 18 nm and 1×nm were used. As for the semiconductor devices of one embodiment of the present invention, the process node was 30 nm and the number of stacked memory device layers in the cell A to the cell E was five layers, ten layers, and twenty layers; thus, estimation was performed.

TABLE 1

| | DRAM | | Memory device of one embodiment of the present invention | | | |
|---|---|---|---|---|---|---|
| Manufacturer | Company A | Company B | — | | | |
| Process node | 18 nm | 1X nm | 30 nm | | | |
| Number of layers stacked | — | — | | 5 | 10 | 20 |
| Bit density [Gb/mm2] | 0.19 (*) | 0.14 (*) | Cell A | 0.05 | 0.10 | 0.20 |
| | | | Cell B | 0.09 | 0.17 | 0.35 |
| | | | Cell C | 0.13 | 0.26 | 0.52 |
| | | | Cell D | 0.15 | 0.29 | 0.59 |
| | | | Cell E | 0.30 | 0.59 | 1.18 |

(*) represents an expected value

Table 2 shows the results of estimation of the relative bit cost of the semiconductor devices of one embodiment of the present invention from the bit cost of the commercially available DRAM. For reference of the bit cost, the DRAM with a process node of 1X nm was used. As for the semiconductor devices of one embodiment of the present invention, the process node was 30 nm and the number of stacked memory device layers in the cell A to the cell D was five layers, ten layers, and twenty layers; thus, estimation was performed.

TABLE 2

| | DRAM | | Memory device of one embodiment of the present invention | | | |
|---|---|---|---|---|---|---|
| Manufacturer | Company A | Company B | — | | | |
| Process node | 18 nm | 1X nm | 30 nm | | | |
| Number of layers stacked | — | — | | 5 | 10 | 20 |
| Relative bit cost when the bit cost of Company B is assumed to be 1 | — | 1 | Cell A | 1.7 | 1.3 | 1.2 |
| | | | Cell B | 0.9 | 0.7 | 0.7 |
| | | | Cell C | 0.6 | 0.5 | 0.4 |
| | | | Cell D | 0.5 | 0.4 | 0.3 |

The structures described in this embodiment can be used in an appropriate combination with the structures described in the other embodiments and the like.

Embodiment 3

Described in this embodiment is a metal oxide (hereinafter also referred to as an oxide semiconductor) that can be used in an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor is described with reference to FIG. 46A. FIG. 46A is a diagram showing the classification of crystal structures of an oxide semiconductor, typically IGZO (a metal oxide containing In, Ga, and Zn).

As shown in FIG. 46A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 46A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 46B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 46B and obtained by GIXD measurement is hereinafter simply referred to as an XRD spectrum. The CAAC-IGZO film in FIG. 46B has a composition in the vicinity of In:Ga:Zn=4:2:3 [atomic ratio]. The CAAC-IGZO film in FIG. 46B has a thickness of 500 nm.

As shown in FIG. 46B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 46B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 46C shows a diffraction pattern of the CAAC-IGZO film. FIG. 46C shows a diffraction pattern obtained by the NBED method in which an electron beam is incident in the direction parallel to the substrate. The CAAC-IGZO film in FIG. 46C has a composition in the vicinity of In:Ga:Zn=4:2:3 [atomic ratio]. In the nanobeam electron diffraction method, electron diffraction is performed with a probe diameter of 1 nm.

As shown in FIG. 46C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 46A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (A and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above-described oxide semiconductor is used for a transistor is described.

When the above-described oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^3$, still further preferably lower than or equal to $1\times10^{11}$ $cm^3$, yet further preferably lower than $1\times10^{10}$ $cm^3$, and higher than or equal to $1\times10^{-9}$ $cm^3$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge captured by the trap states in the oxide semiconductor takes a long time to disappear and might behave like fixed electric charge. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration obtained by secondary ion mass spectrometry (SIMS)) is lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

An oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for a channel formation region in a transistor, the transistor can have stable electrical characteristics.

Note that this embodiment can be combined with the other embodiments in this specification as appropriate.

Embodiment 4

In this embodiment, the control logic circuit 61, the row driver circuit 62, the column driver circuit 63, and the output circuit 64 that are provided on the silicon substrate 50 of the semiconductor device 10 described in Embodiment 1 is described.

Figure 47:
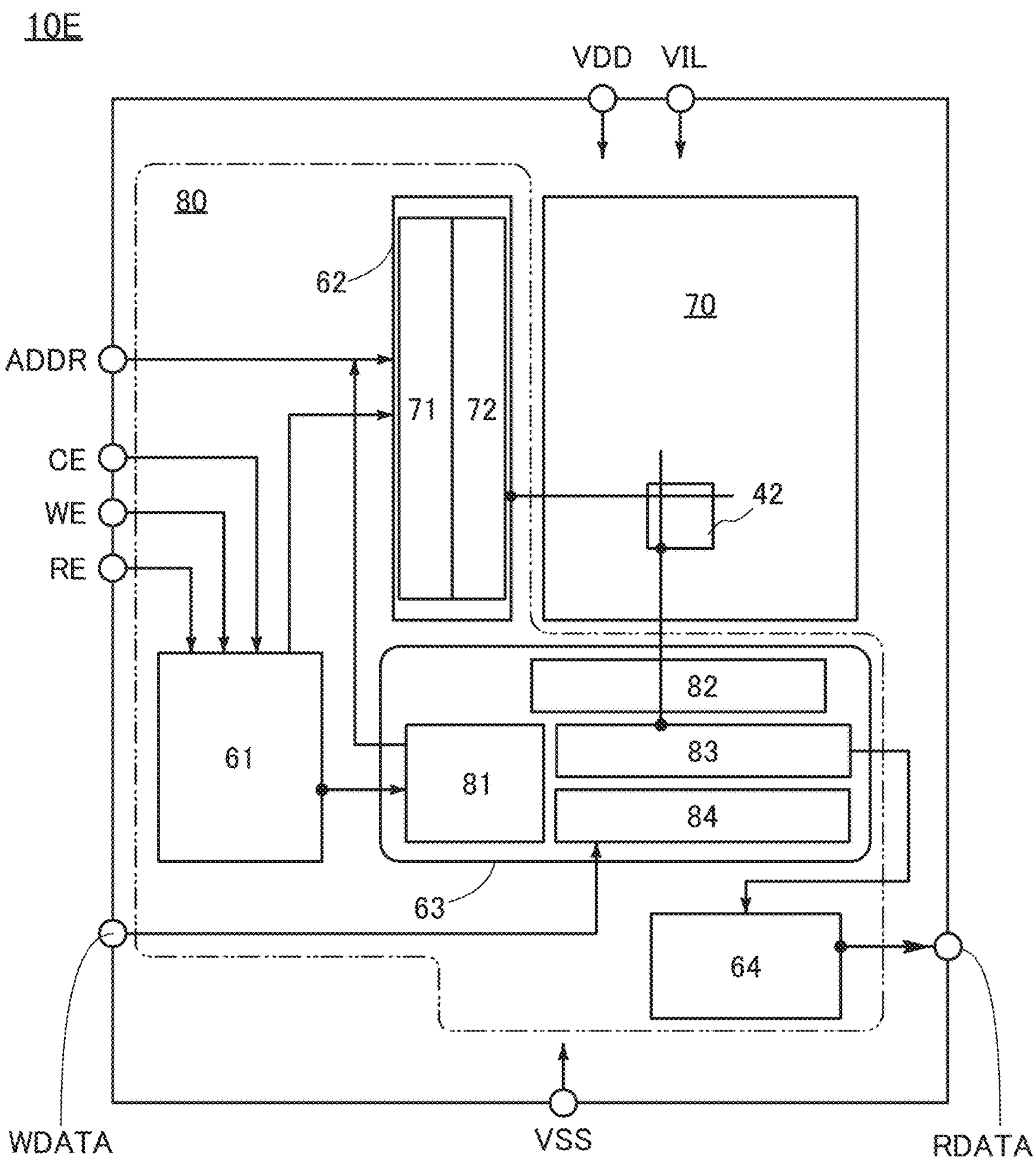
FIG. 47 is a block diagram illustrating a structure example of a semiconductor device.

FIG. 47 is a block diagram illustrating a structure example of a semiconductor device functioning as a memory device. A semiconductor device 10E includes a peripheral circuit 80 and a memory cell array 70. The peripheral circuit 80 includes the control logic circuit 61, the row driver circuit 62, the column driver circuit 63, and the output circuit 64.

The memory cell array 70 includes a plurality of memory cells 42. The row driver circuit 62 includes a row decoder 71 and a word line driver circuit 72. The column driver circuit 63 includes a column decoder 81, a precharge circuit 82, an amplifier circuit 83, and a write circuit 84. The precharge circuit 82 has a function of precharging the global bit line GBL, the local bit line LBL, or the like. The amplifier circuit 83 has a function of amplifying a data signal read from the global bit line GBL or the local bit line LBL. The amplified data signal is output to the outside of the semiconductor device 10E as a digital data signal RDATA through the output circuit 64.

As power supply voltages from the outside, a low power supply voltage (VSS), a high power supply voltage (VDD) for the peripheral circuit 80, and a high power supply voltage (VIL) for the memory cell array 70 are supplied to the semiconductor device 10E.

Control signals (CE, WE, and RE), an address signal ADDR, and a data signal WDATA are also input to the semiconductor device 10E from the outside. The address signal ADDR is input to the row decoder 71 and the column decoder 81, and WDATA is input to the write circuit 84.

The control logic circuit 61 processes the signals (CE, WE, and RE) input from the outside, and generates control signals for the row decoder 71 and the column decoder 81.

CE is a chip enable signal, WE is a write enable signal, and RE is a read enable signal. The signals processed by the control logic circuit 61 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as needed.

Figure 48:
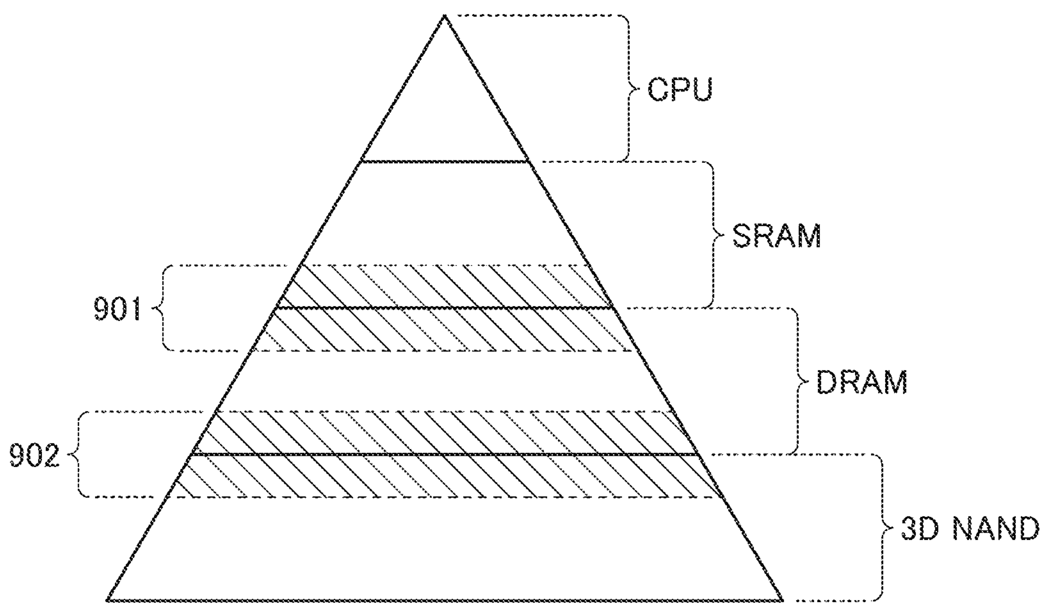
FIG. 48 is a conceptual diagram illustrating a structure example of a semiconductor device.

In general, a variety of memory devices (memories) are used in semiconductor devices such as computers in accordance with the intended use. FIG. 48 shows a hierarchy of memory devices. The memory devices at upper levels require higher access speed and those at lower levels require larger memory capacity and higher recording density. In FIG. 48, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, high operation speed is required rather than memory capacity. In addition, the register also has a function of retaining information on settings of the arithmetic processing device, for example.

An SRAM is used for a cache, for example. A cache has a function of duplicating and retaining part of information retained in a main memory. When the frequently used data is duplicated and retained in the cache, the access speed to the data can be increased.

A DRAM is used for a main memory, for example. A main memory has a function of retaining a program or data read from a storage. A DRAM has a recording density of approximately 0.1 to 0.3 $Gbit/mm^2$.

A 3D NAND memory is used for a storage, for example. A storage has a function of retaining data that needs to be retained for a long time or a variety of programs used in an arithmetic processing device, for example. Therefore, a storage needs to have high memory capacity and a high recording density rather than operation speed. A memory device used for a storage has a recording density of approximately 0.6 to 6.0 $Gbit/mm^2$.

The semiconductor device functioning as the memory device of one embodiment of the present invention has a high operation speed and can retain data for a long time. The semiconductor device of one embodiment of the present invention can be suitably used as a semiconductor device in a boundary region 901 that includes both the level to which a cache belongs and the level to which a main memory belongs. The semiconductor device of one embodiment of the present invention can be suitably used as a semiconductor device in a boundary region 902 that includes both the level to which the main memory belongs and the level to which a storage belongs.

Embodiment 5

In this embodiment, examples of electronic components and electronic devices in which the semiconductor device or the like described in the above embodiment is incorporated are described.

<Electronic Component>

First, examples of electronic components in which the semiconductor device 10 or the like is incorporated are described with reference to FIG. 49A and FIG. 49B.

Figure 49A:
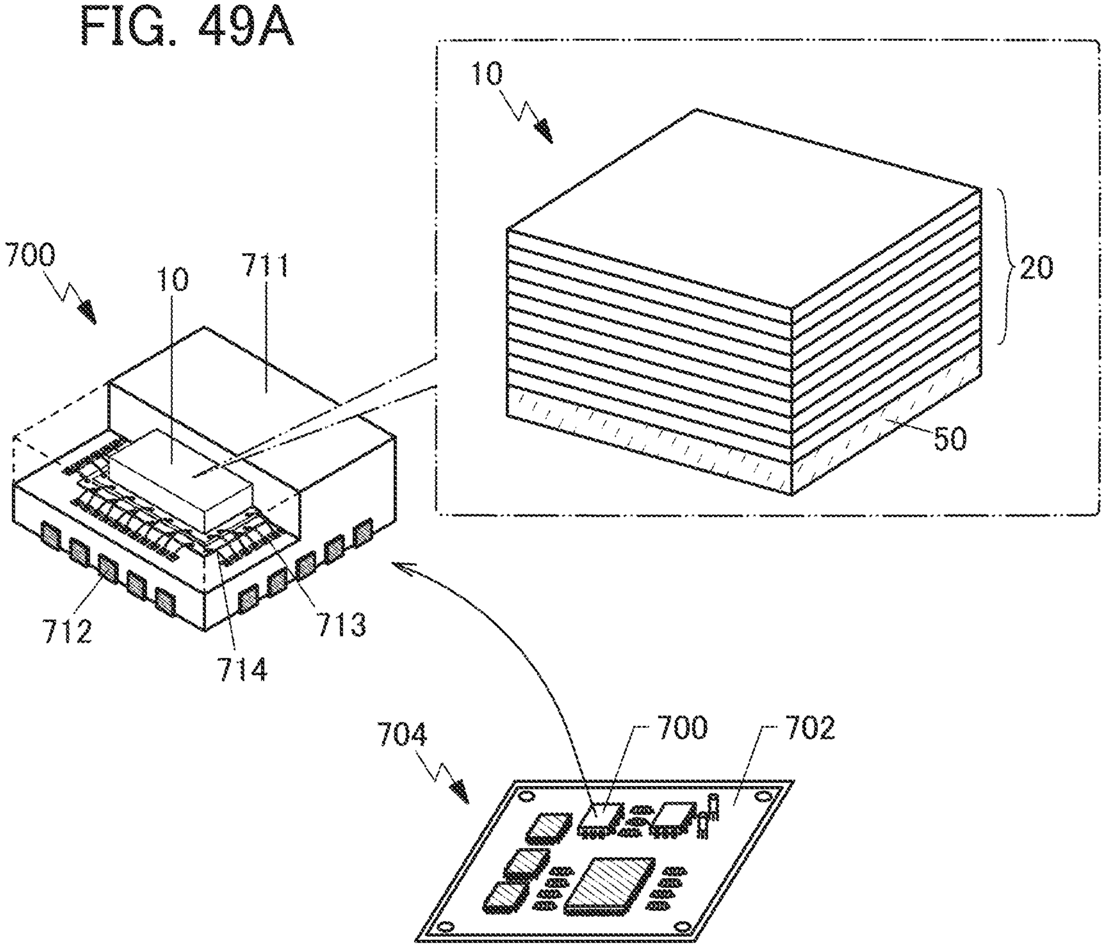
FIG. 49A and FIG. 49B are a schematic views illustrating examples of electronic components.

FIG. 49A illustrates a perspective view of an electronic component 700 and a substrate (a mounting board 704) on which the electronic component 700 is mounted. The electronic component 700 illustrated in FIG. 49A includes the semiconductor device 10 in which the element layer 20 is stacked over the silicon substrate 50 in a mold 711. FIG. 49A omits part of the electronic component to show the inside of the electronic component 700. The electronic component 700 includes a land 712 outside the mold 711. The land 712 is electrically connected to an electrode pad 713, and the electrode pad 713 is electrically connected to the semiconductor device 10 via a wire 714. The electronic component 700 is mounted on a printed circuit board 702, for example. A plurality of such electronic components are combined and electrically connected to each other on the printed circuit board 702, whereby the mounting board 704 is completed.

Figure 49B:
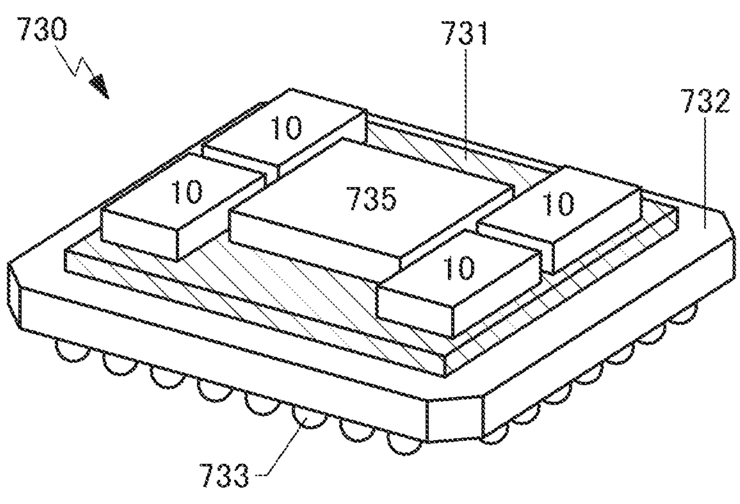

FIG. 49B illustrates a perspective view of an electronic component 730. The electronic component 730 is an example of a SiP (System in Package) or an MCM (Multi Chip Module). In the electronic component 730, an interposer 731 is provided on a package substrate 732 (a printed circuit board), and a semiconductor device 735 and a plurality of semiconductor devices 10 are provided on the interposer 731.

The electronic component 730 using the semiconductor device 10 as High Bandwidth Memory (HBM) is illustrated as an example. An integrated circuit (semiconductor device) such as a CPU, a GPU, or an FPGA can be used for the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is unlikely to occur. Furthermore, the surface of a silicon interposer has high planarity, so that a poor connection between the silicon interposer and an integrated circuit provided on the silicon interposer is unlikely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor device 10 and the semiconductor device 735 are preferably equal to each other.

To mount the electronic component 730 on another substrate, an electrode 733 may be provided on the bottom portion of the package substrate 732. FIG. 49B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Figure 50:
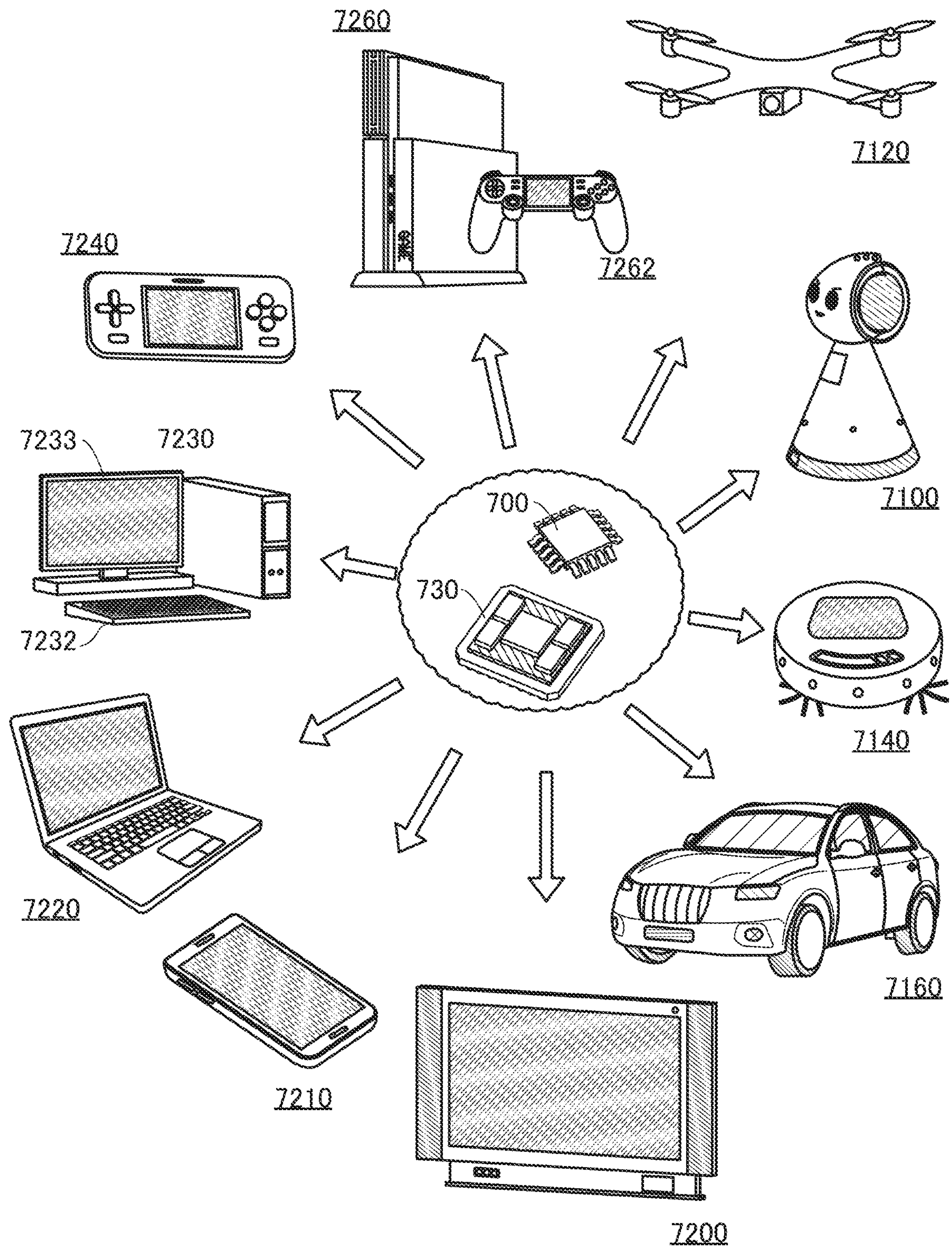
FIG. 50 is a diagram illustrating examples of electronic devices.

Next, examples of electronic devices including the above-described electronic component are described with reference to FIG. 50.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. The robot 7100 has a function of moving with the use of the moving mechanism. The robot 7100 can take images of the surroundings with the use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

The automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

This embodiment can be implemented in combination with any of the structures described in the other embodiments and the like, as appropriate.

(Supplementary Notes on Description of this Specification and the Like)

The following are supplementary notes on the description of the above embodiments and structures in the embodiments.

One embodiment of the present invention can be constituted by combining, as appropriate, the structure described in an embodiment with any of the structures described in the other embodiments and Examples. In addition, in the case where a plurality of structure examples are described in one embodiment, the structure examples can be combined as appropriate.

Note that content (or may be part of the content) described in one embodiment can be applied to, combined with, or replaced with another content (or may be part of the content)

described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and there is no limitation to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) for the other of the source and the drain are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when represented by an equivalent circuit.

In this specification and the like, a switch has a function of controlling whether a current flows or not by being in a conducting state (an on state) or a non-conducting state (an off state). Alternatively, a switch has a function of selecting and changing a current path.

In this specification and the like, channel length refers to, for example, the distance between a source and a drain in a region where a semiconductor (or a portion where a current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where a current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

BL2: wiring, EN1: signal, RE1: signal, RE2: signal, SL2: wiring, T11: time, T12: time, T13: time, T14: time, T15: time, T16: time, T17: time, T18: time, T19: time, T20: time, 10: semiconductor device, 10A: semiconductor device, 10B: semiconductor device, 10C: semiconductor device, 10E: semiconductor device, 20: element layer, 20_M: element layer, 20_1: element layer, 30: transistor layer, 31: transistor, 32: transistor, 33: transistor, 34: transistor, 35: control circuit, 35_pre: control circuit, 35B: control circuit, 35C: control circuit, 36: control circuit, 36_pre: control circuit, 37: transistor, 40: transistor layer, 40_*k*: transistor layer, 40_1: transistor layer, 41_*k*: transistor layer, 41_1: transistor layer, 41_2: transistor layer, 42: memory cell, 43: transistor, 44: capacitor, 49: transistor layer, 49_*k*: transistor layer, 49_1: transistor layer, 50: silicon substrate, 51: control circuit, 51A: control circuit, 52: switch circuit, 52_1: transistor, 52_2: transistor, 53: precharge circuit, 53_1: transistor, 53_3: transistor, 54: precharge circuit, 54_1: transistor,

54_3: transistor, 55: sense amplifier, 55_1: transistor, 55_2: transistor, 55_3: transistor, 55_4: transistor, 57_1: transistor, 57_2: transistor, 58_1: transistor, 58_2: transistor, 59: potential setting circuit, 61: control logic circuit, 62: row driver circuit, 63: column driver circuit, 64: output circuit, 70: memory cell array, 71: row decoder, 72: word line driver circuit, 80: peripheral circuit, 81: column decoder, 82: precharge circuit, 83: amplifier circuit, 84: write circuit, 90: transistor layer, 91: memory cell, 92: transistor, 93: transistor, 94: capacitor, 100: memory device, 200: transistor, 200M: transistor, 200T: transistor, 205: conductor, 205*a*: conductor, 205*b*: conductor, 211: insulator, 212: insulator, 214: insulator, 216: insulator, 222: insulator, 224: insulator, 230: oxide, 230*a*: oxide, 230*b*: oxide, 230*c*: oxide, 240: conductor, 240*a*: conductor, 240*b*: conductor, 241: insulator, 241*a*: insulator, 241*b*: insulator, 242: conductor, 242*a*: conductor, 242*b*: conductor, 243: oxide, 243*a*: oxide, 243*b*: oxide, 246: conductor, 246*a*: conductor, 246*b*: conductor, 250: insulator, 260: conductor, 260*a*: conductor, 260*b*: conductor, 272: insulator, 273: insulator, 274: insulator, 275: insulator, 276: conductor, 277: insulator, 278: conductor, 279: insulator, 280: insulator, 282: insulator, 283: insulator, 284: insulator, 287: insulator, 290: conductor, 292: capacitor, 292A: capacitor, 292B: capacitor, 294: conductor, 295: insulator, 296: insulator, 297: conductor, 298: insulator, 299: conductor, 300: transistor, 311: semiconductor substrate, 313: semiconductor region, 314*a*: low-resistance region, 314*b*: low-resistance region, 315: insulator, 316: conductor, 411: element layer, 413: transistor layer, 413_*m*: transistor layer, 413_1: transistor layer, 415: memory device layer, 415_*n*: memory device layer, 415_*p*: memory device layer, 415_*p*−1: memory device layer, 415_1: memory device layer, 415_3: memory device layer, 415_4: memory device layer, 420: memory device, 420A: memory device, 420B: memory device, 422: region, 424: conductor, 426: conductor, 428: conductor, 430: conductor, 432: memory cell, 433: memory cell, 434: memory cell, 435: memory cell, 470: memory unit, 470_*m*: memory unit, 470_1: memory unit, 700: electronic component, 702: printed circuit board, 704: mounting board, 711: mold, 712: land, 713: electrode pad, 714: wire, 730: electronic component, 731: interposer, 732: package substrate, 733: electrode, 735: semiconductor device, 820: peripheral circuit, 901: boundary region, 902: boundary region, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller

The invention claimed is:

1. A semiconductor device comprising:

a first control circuit comprising a first transistor;

a second control circuit over the first control circuit, the second control circuit comprising a second transistor;

a memory circuit over the second control circuit, the memory circuit comprising a third transistor; and a global bit line and an inverted global bit line, each of which being configured to transmit a signal between the first control circuit and the second control circuit, wherein a channel of the first transistor is provided in a silicon substrate, wherein a channel of the second transistor comprises a first metal oxide, wherein a channel of the third transistor comprises a second metal oxide, wherein the first control circuit comprises a sense amplifier, wherein the sense amplifier comprises an input terminal and an inverted input terminal, and wherein in a first period for reading data from the memory circuit to the first control circuit, the second control circuit is configured to control whether the global bit line and the inverted global bit line from which electric charge is discharged are charged or not in accordance with the data read from the memory circuit.

2. The semiconductor device according to claim 1, wherein the global bit line and the inverted global bit line are provided in the direction perpendicular or substantially perpendicular to a surface of the silicon substrate.

3. The semiconductor device according to claim 1, wherein at least one of the first metal oxide and the second metal oxide contains In, Ga, and Zn.

4. The semiconductor device according to claim 1, wherein the second control circuit comprises a fourth transistor, a fifth transistor, a sixth transistor, and a seventh transistor, wherein a gate of the fourth transistor is electrically connected to a local bit line which is configured to transmit a signal between the second control circuit and the memory circuit, wherein the fifth transistor is configured to control a conducting state between the gate of the fourth transistor and one of a source and a drain of the fourth transistor, wherein the sixth transistor is configured to control a conducting state between the other of the source and the drain of the fourth transistor and a wiring supplied with a potential for allowing current to flow through the fourth transistor, and wherein the seventh transistor is configured to control a conducting state between the one of the source and the drain of the fourth transistor and the global bit line.

5. The semiconductor device according to claim 1, wherein the first transistor and the second transistor overlap, in a cross-sectional view.

6. The semiconductor device according to claim 1, wherein the second transistor and the third transistor overlap, in a cross-sectional view.

7. The semiconductor device according to claim 1, wherein the second transistor comprises a first gate and a second gate overlapping the first gate.

8. A semiconductor device comprising:

a first control circuit comprising a first transistor;

a second control circuit over the first control circuit, the second control circuit comprising a second transistor;

a memory circuit over the second control circuit, the memory circuit comprising a third transistor;

a global bit line and an inverted global bit line, each of which being configured to transmit a signal between the first control circuit and the second control circuit; and a plurality of change-over switches provided between the global bit line and the second control circuit and between the inverted global bit line and the second control circuit, wherein a channel of the first transistor is provided in a silicon substrate, wherein a channel of the second transistor comprises a first metal oxide, wherein a channel of the third transistor comprises a second metal oxide, wherein the first control circuit comprises a sense amplifier, wherein the sense amplifier comprises an input terminal and an inverted input terminal, wherein in a first period for reading data from the memory circuit to the first control circuit, the second control circuit is configured to control whether electric charge precharged to a 1-bit line and the inverted global bit line is discharged or not in accordance with the data read from the memory circuit, wherein in the first period, the plurality of change-over switches is switched to make a conducting state between the global bit line and the input terminal and between the inverted global bit line and the inverted input terminal, and wherein in a second period for refreshing the data read from the memory circuit, the plurality of change-over switches is switched to make a conducting state between the global bit line and the inverted input terminal and between the inverted global bit line and the input terminal.

9. The semiconductor device according to claim 8, wherein the global bit line and the inverted global bit line are provided in the direction perpendicular or substantially perpendicular to a surface of the silicon substrate.

10. The semiconductor device according to claim 8, wherein at least one of the first metal oxide and the second metal oxide contains In, Ga, and Zn.

11. The semiconductor device according to claim 8, wherein the second control circuit comprises a fourth transistor, a fifth transistor, a sixth transistor, and a seventh transistor, wherein a gate of the fourth transistor is electrically connected to a local bit line which is configured to transmit a signal between the second control circuit and the memory circuit, wherein the fifth transistor is configured to control a conducting state between the gate of the fourth transistor and one of a source and a drain of the fourth transistor, wherein the sixth transistor is configured to control a conducting state between the other of the source and the drain of the fourth transistor and a wiring supplied with a potential for allowing current to flow through the fourth transistor, and wherein the seventh transistor is configured to control a conducting state between the one of the source and the drain of the fourth transistor and the global bit line.

12. The semiconductor device according to claim 8, wherein the first transistor and the second transistor overlap, in a cross-sectional view.

13. The semiconductor device according to claim 8, wherein the second transistor and the third transistor overlap, in a cross-sectional view.

14. The semiconductor device according to claim 8, wherein the second transistor comprises a first gate and a second gate overlapping the first gate.

15. A semiconductor device comprising:

a first control circuit comprising a first transistor;

a second control circuit over the first control circuit, the second control circuit comprising a second transistor;

a memory circuit over the first control circuit, the memory circuit comprising a third transistor; and a global bit line and an inverted global bit line, each of which being configured to transmit a signal between the first control circuit and the second control circuit, wherein a channel of the first transistor is provided in a silicon substrate, wherein a channel of the second transistor comprises a first metal oxide, wherein a channel of the third transistor comprises a second metal oxide, wherein the first control circuit comprises a sense amplifier, wherein the sense amplifier comprises an amplifier circuit, an output terminal, an inverted output terminal, a first switch, a second switch, and a signal inverter circuit, wherein the first switch is provided between the global bit line and the output terminal, wherein the second switch is provided between the inverted global bit line and the inverted output terminal, wherein the signal inverter circuit is configured to supply an inverted potential of logic data corresponding to the potentials of the global bit line and the inverted global bit line to the output terminal and the inverted output terminal that are electrically connected to the amplifier circuit, wherein in a first period for reading data from the memory circuit to the first control circuit, the second control circuit is configured to control whether electric charge precharged to the global bit line and the inverted global bit line is discharged or not in accordance with the data read from the memory circuit, wherein in the first period, the first switch and the second switch are turned off, and the inverted potential of logic data corresponding to the potentials of the global bit line and the inverted global bit line is supplied to the output terminal and the inverted output terminal that are electrically connected to the amplifier circuit, and wherein in a second period for refreshing the data read from the memory circuit, the first switch and the second switch are turned on, and potentials of the output terminal and the inverted output terminal, which are amplified by the amplifier circuit, are supplied to the global bit line and the inverted global bit line.

16. The semiconductor device according to claim 15, wherein the global bit line and the inverted global bit line are provided in the direction perpendicular or substantially perpendicular to a surface of the silicon substrate.

17. The semiconductor device according to claim 15, wherein at least one of the first metal oxide and the second metal oxide contains In, Ga, and Zn.

18. The semiconductor device according to claim 15, wherein the second control circuit comprises a fourth transistor, a fifth transistor, a sixth transistor, and a seventh transistor, wherein a gate of the fourth transistor is electrically connected to a local bit line which is configured to transmit a signal between the second control circuit and the memory circuit, wherein the fifth transistor is configured to control a conducting state between the gate of the fourth transistor and one of a source and a drain of the fourth transistor, wherein the sixth transistor is configured to control a conducting state between the other of the source and the drain of the fourth transistor and a wiring supplied with a potential for allowing current to flow through the fourth transistor, and wherein the seventh transistor is configured to control a conducting state between the one of the source and the drain of the fourth transistor and the global bit line.

19. The semiconductor device according to claim 15, wherein the first transistor and the second transistor overlap, in a cross-sectional view.

20. The semiconductor device according to claim 15, wherein the second transistor and the third transistor overlap, in a cross-sectional view.

21. The semiconductor device according to claim 15, wherein the second transistor comprises a first gate and a second gate overlapping the first gate.

* * * * *